(12) United States Patent
Imamoto

(10) Patent No.: US 11,923,013 B2
(45) Date of Patent: *Mar. 5, 2024

(54) OPERATION METHOD OF SEMICONDUCTOR STORAGE DEVICE

(71) Applicant: KIOXIA CORPORATION, Tokyo (JP)

(72) Inventor: Akihiro Imamoto, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/993,211

(22) Filed: Nov. 23, 2022

(65) Prior Publication Data

US 2023/0082191 A1 Mar. 16, 2023

Related U.S. Application Data

(63) Continuation of application No. 17/376,638, filed on Jul. 15, 2021, now Pat. No. 11,538,528.

(30) Foreign Application Priority Data

Nov. 10, 2020 (JP) .................................. 2020-186895

(51) Int. Cl.
| | |
|---|---|
| *G11C 16/10* | (2006.01) |
| *G11C 11/56* | (2006.01) |
| *G11C 16/04* | (2006.01) |
| *G11C 16/08* | (2006.01) |
| *G11C 16/34* | (2006.01) |

(Continued)

(52) U.S. Cl.
CPC .......... *G11C 16/10* (2013.01); *G11C 11/5628* (2013.01); *G11C 11/5671* (2013.01); *G11C 16/0483* (2013.01); *G11C 16/08* (2013.01); *G11C 16/3459* (2013.01); *H01L 25/0657* (2013.01); *H01L 25/18* (2013.01); *H01L 2225/06506* (2013.01); *H01L 2225/06562* (2013.01)

(58) Field of Classification Search
None
See application file for complete search history.

(56) References Cited

U.S. PATENT DOCUMENTS

| | | | |
|---|---|---|---|
| 11,538,528 B2 * | 12/2022 | Imamoto .................. | G11C 8/14 |
| 2009/0157964 A1 | 6/2009 | Kasorla et al. | |

(Continued)

FOREIGN PATENT DOCUMENTS

| | | |
|---|---|---|
| JP | 2017-157260 A | 9/2017 |
| TW | 202002252 A | 1/2020 |

*Primary Examiner* — Tan T. Nguyen
(74) *Attorney, Agent, or Firm* — Kim & Stewart LLP

(57) ABSTRACT

An operation method of a semiconductor storage device including a first memory die is provided. The first memory die includes a first memory plane including a plurality of first memory blocks, a second memory plane including a plurality of second memory blocks. The method includes starting a first write sequence with respect to one of the first memory blocks in response to a first command set designating the one of the first memory blocks and starting a second write sequence with respect to one of the second memory blocks in response to a second command set designating the one of the second memory blocks. At least part of the second write sequence is performed while the first write sequence is being performed.

19 Claims, 33 Drawing Sheets

(51) Int. Cl.
*H01L 25/065* (2023.01)
*H01L 25/18* (2023.01)

(56) References Cited

U.S. PATENT DOCUMENTS

| | | |
|---|---|---|
| 2011/0013458 A1 | 1/2011 | Seol |
| 2015/0220269 A1 | 8/2015 | Lee et al. |
| 2016/0314833 A1 | 10/2016 | Lee |
| 2017/0256316 A1 | 9/2017 | Maejima |
| 2019/0006021 A1* | 1/2019 | Ghai .................. G11C 11/5628 |
| 2019/0362761 A1 | 11/2019 | Sato et al. |
| 2019/0392905 A1 | 12/2019 | Hioka et al. |
| 2020/0227124 A1 | 7/2020 | Yang et al. |

* cited by examiner

OPERATION METHOD OF SEMICONDUCTOR STORAGE DEVICE

CROSS-REFERENCE TO RELATED APPLICATIONS

This application is a continuation of U.S. patent application Ser. No. 17/376,638, filed Jul. 15, 2021, which is based upon and claims the benefit of priority from Japanese Patent Application No. 2020-186895, filed Nov. 10, 2020, the entire contents of each of which are incorporated herein by reference.

FIELD

Embodiments described herein relate generally to an operation method of a semiconductor storage device.

BACKGROUND

A semiconductor storage device including a plurality of memory planes is known.

DETAILED DESCRIPTION

Figure 1:
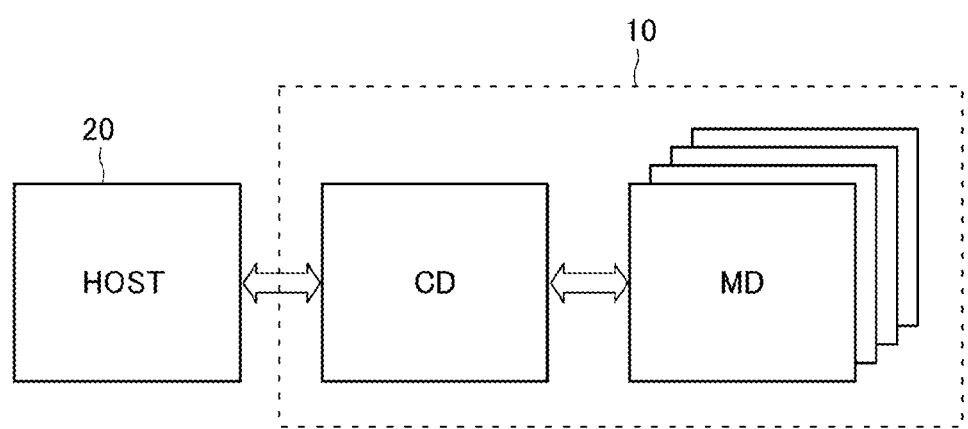
FIG. 1 is a block diagram schematically showing a configuration of a memory system according to a first embodiment.

Embodiments provide a semiconductor storage device that operates at a high speed.

In general, according to an embodiment, a semiconductor storage device includes a first memory die. The first memory die includes a first memory plane including a plurality of first memory blocks, a second memory plane including a plurality of second memory blocks, a first sequencer, and a second sequencer. The first sequencer is configured to start a first write sequence with respect to one of the first memory blocks in response to a first command set designating the one of the first memory blocks if no write sequence is being performed by the first sequencer. The second sequencer is configured to start a second write sequence with respect to one of the second memory blocks in response to a second command set designating the one of the second memory blocks if the first sequencer is performing the first write sequence and no write sequence is being performed by the second sequencer.

According to one embodiment, a semiconductor storage device includes a first memory die. The first memory die includes a first memory plane including a plurality of first memory blocks and a second memory plane including a plurality of second memory blocks. After a first command set instructing a write sequence is input to one of the plurality of first memory blocks and before the write sequence corresponding to the first command set is completed, when a second command set instructing a write sequence is input to one of the first memory blocks, the write sequence corresponding to the second command set is not executed, and when a third command set instructing a write sequence is input to one of the plurality of second memory blocks, the write sequence corresponding to the third command set is executed.

According to another embodiment, a semiconductor storage device includes a first memory die. The first memory die includes a first memory plane including a plurality of first memory blocks and a second memory plane including a plurality of second memory blocks. After a first command set instructing a write sequence is input to one of the plurality of first memory blocks and before the write sequence corresponding to the first command set is completed, when a second command set instructing a write sequence is input to one of the plurality of first memory blocks, the write sequence corresponding to the second command set is completed after a first time has elapsed since the input of the first command set was completed, when a third command set instructing a write sequence is input to one of the plurality of second memory blocks, the write sequence corresponding to the third command set is completed after a second time has elapsed since the input of the first command set was completed. The second time is shorter than the first time.

Next, the semiconductor storage device according to certain example embodiments will be described with reference to the drawings. These embodiments are merely examples and are not intended to limit the present disclosure. In addition, the following drawings are schematic and some configurations and the like may be omitted for convenience of explanation. In addition, the same reference numerals may be given to portions common to multiple embodiments and the descriptions of such portions may be omitted from description of subsequent embodiments.

When the term "semiconductor storage device" is used in the present disclosure, the semiconductor storage device may mean a memory die, or a memory system, such as a memory chip, a memory card, or a solid state drive (SSD) including a controller die. Furthermore, in some instances, the term "semiconductor storage device" may refer to a configuration inclusive of a host computer, such as a smartphone, a tablet terminal, and a personal computer.

When the term "control circuit" is used in the present disclosure, this may refer to a peripheral circuit, such as a sequencer provided on a memory die, or may refer to a controller die or a controller chip connected to a memory die. In some cases, "control circuit" may refer to a configuration that includes both of the above.

In the present disclosure, when a first component or aspect is said to be "electrically connected" to a second component or aspect, the first component or aspect may be directly connected to the second component or aspect, or the first component or aspect may be connected to the second component or aspect via wiring, a semiconductor device element, a transistor, or the like. For example, when three transistors are connected in series, the first transistor is said to be "electrically connected" to the third transistor, even if the second transistor is presently in an OFF state.

In the present disclosure, when a first component is said to be "connected between" a second component and a third component, this generally means that the first component, the second component, and the third component are connected in series with the second component being connected to the third component via the first component.

In the present disclosure, when a circuit or the like is said to "conduct" or "connect" two wirings or the like, this generally means, that the circuit or the like includes a transistor or other element, the transistor or other element is provided on a current path between the two wirings, and the transistor or element is in an ON state (or otherwise conductive).

In the present disclosure, one direction parallel to an upper surface of a substrate is referred to as an X direction, another direction parallel to the upper surface of the substrate and perpendicular to the X direction is referred to as a Y direction, and a direction orthogonal to the upper surface of the substrate is referred to as a Z direction.

In the present disclosure, one direction along a predetermined surface may be referred to as a first direction, another direction intersecting the first direction along the predetermined surface is referred to as a second direction, and a direction intersecting the predetermined surface is referred to as a third direction. The first direction, the second direction, and the third direction may or may not correspond to any of the X direction, the Y direction, and the Z direction in all instances.

In the present disclosure, relative expressions such as "upward" and "downward" and "upper" and "lower" are generally based on directional reference to the position of the substrate. For example, the direction going away from the substrate along the Z direction is referred to as upward and the direction approaching the substrate along the Z direction is referred to as downward. Further, when reference is made to a lower surface or a lower end of a certain component or aspect, this refers to a surface or an end portion on the substrate side (side closer to or facing towards the substrate) of this component or aspect. When referring to an upper surface or an upper end of a component or aspect, a surface or an end portion on the opposite side from or facing away from the substrate is being referred to. A surface that intersects the X direction or the Y direction may be referred to as a side surface, a lateral surface, or the like.

First Embodiment

[Memory System 10]

FIG. 1 is a block diagram schematically showing a configuration of a memory system 10 according to a first embodiment.

The memory system 10 reads, writes, and erases user data according to the signal transmitted from a host computer 20. The memory system 10 is, for example, a memory chip, a memory card, an SSD, or other systems capable of storing user data. The memory system 10 includes a plurality of memory dies MD for storing user data, and a controller die CD connected to the plurality of memory dies MD and the host computer 20. The controller die CD includes, for example, a processor, RAM, and the like, and performs processing such as the conversion of a logical address and a physical address, bit error detection and correction, garbage collection (also referred to as "compaction"), and wear leveling.

Figure 2:
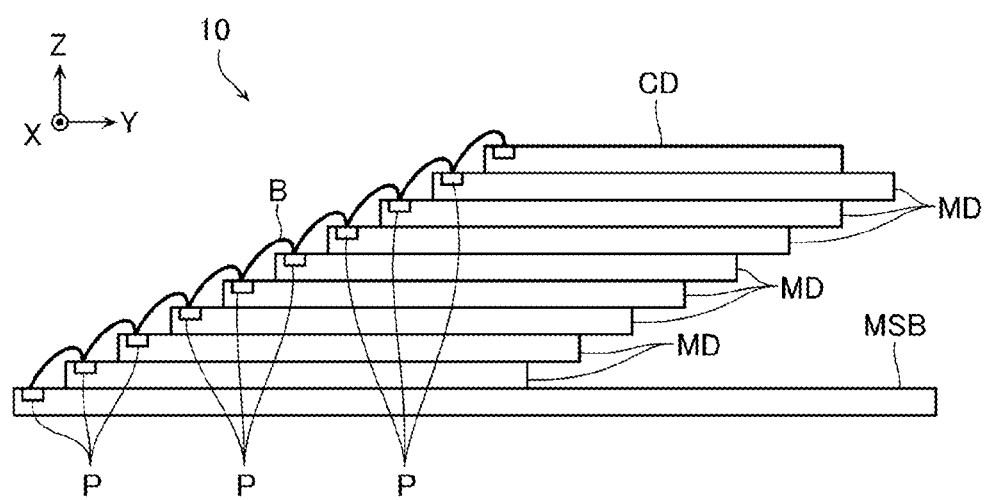
FIG. 2 schematically illustrates a side view of a configuration example of a memory system.
Figure 3:
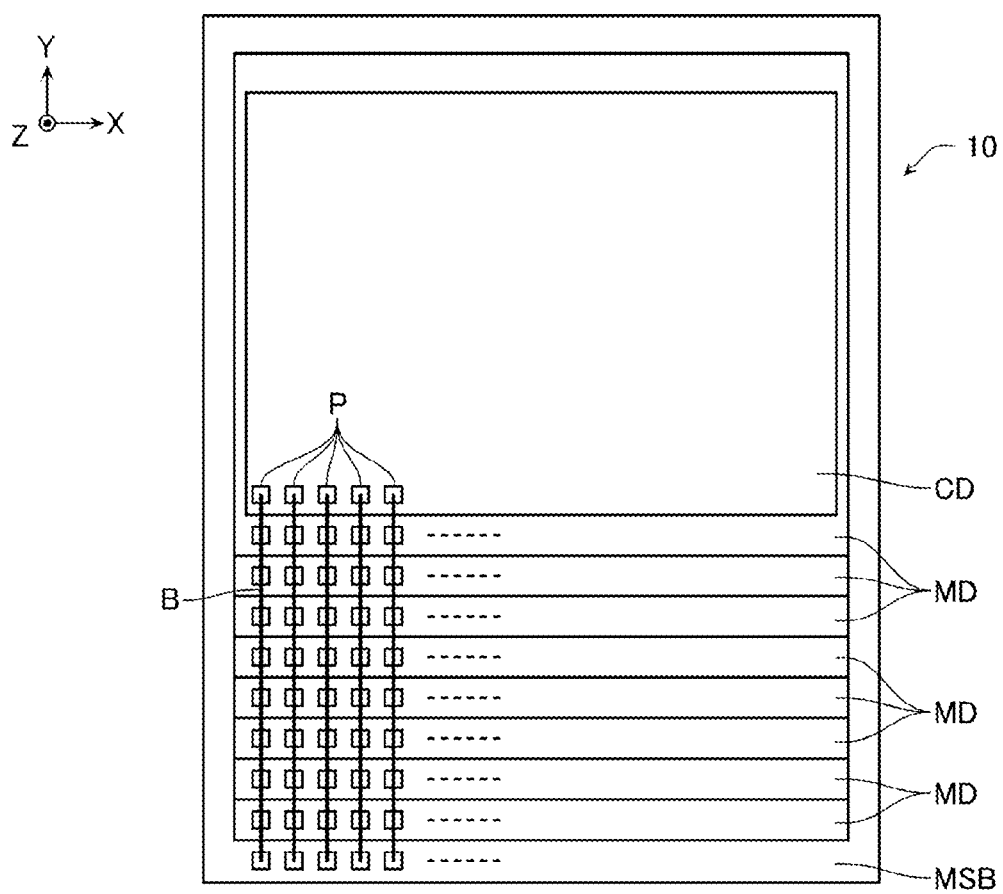
FIG. 3 schematically illustrates a plan view of a configuration example of a memory system.

FIG. 2 schematically illustrates a side view of a configuration example of the memory system 10 according to the present embodiment. FIG. 3 schematically illustrates a plan view of the same configuration example. For the convenience of explanation, some configurations are omitted in FIGS. 2 and 3.

As shown in FIG. 2, the memory system 10 according to the present embodiment includes a mounting board MSB, a plurality of memory dies MD stacked on the mounting board MSB, and a controller die CD stacked on the memory dies MD. A pad electrode P is provided in the region of the end portion in the Y direction on the upper surface of the mounting board MSB, and a part of the other region is adhered to the lower surface of the memory die MD via an adhesive or the like. A pad electrode P is provided in the region of the end portion in the Y direction on the upper surface of the memory die MD, and the other region is adhered to the lower surface of another memory die MD or the controller die CD via an adhesive or the like. A pad electrode P is provided in the region of the end portion in the Y direction on the upper surface of the controller die CD.

As shown in FIG. 3, the mounting board MSB, the plurality of memory dies MD, and the controller die CD each include a plurality of pad electrodes P arranged in the X direction. The plurality of pad electrodes P provided on the mounting board MSB, the plurality of memory dies MD, and the controller die CD are each connected to each other via a bonding wire B.

The configurations shown in FIGS. 2 and 3 are merely examples and the specific configurations may be modified as appropriate. For example, in the examples shown in FIGS. 2 and 3, the controller die CD is stacked on a plurality of memory dies MD and these configurations are connected by bonding wires B. In such a configuration, the plurality of memory dies MD and the controller die CD are provided in one package. However, the controller die CD may be provided in a package different from the memory die MD. Further, the plurality of memory dies MD and the controller die CD may be connected to each other via electrodes or the like instead of the bonding wire B.

[Circuit Configuration of Memory Die MD]

Figure 4:
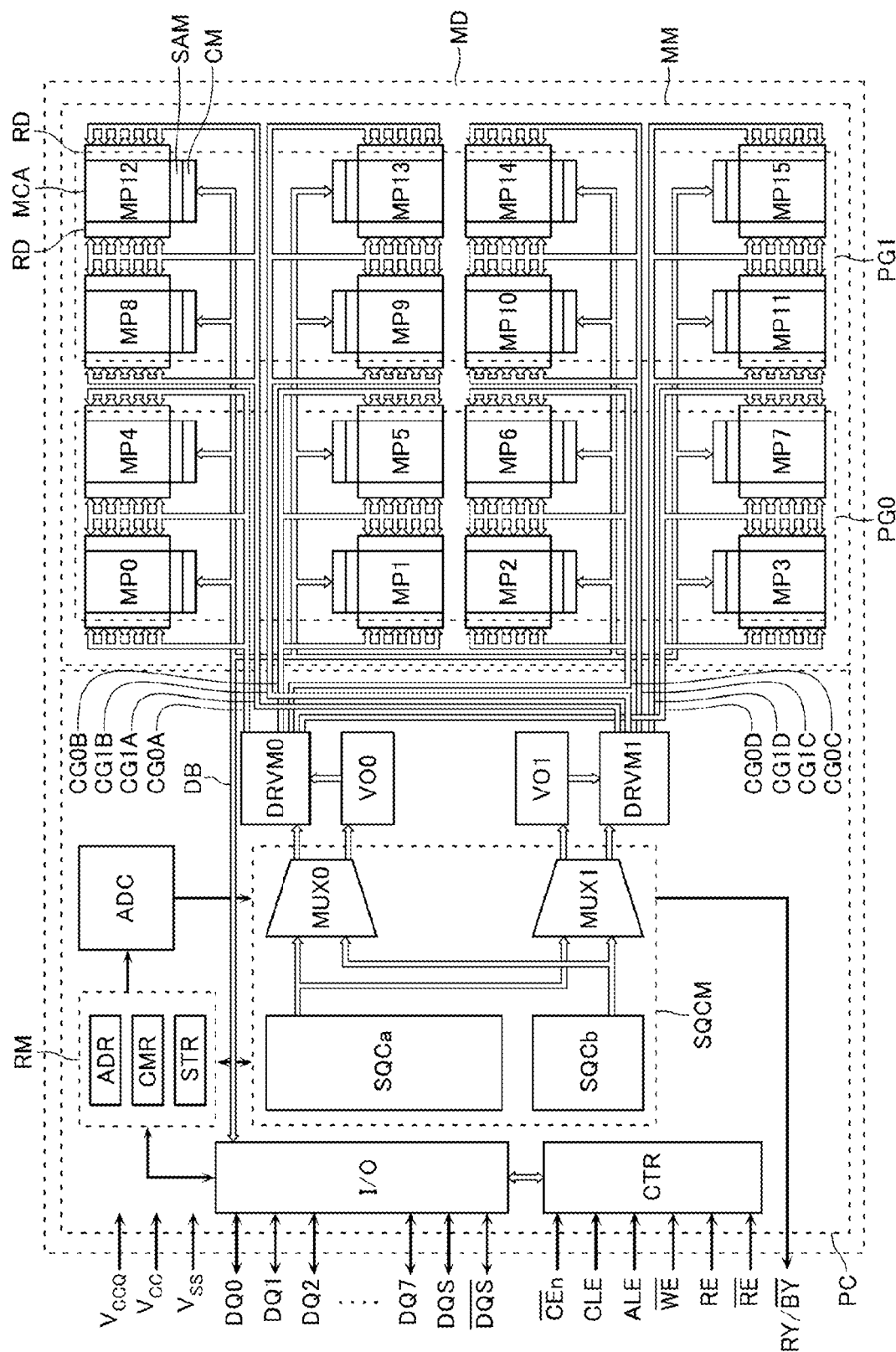
FIG. 4 is a block diagram schematically showing a configuration of a memory die.
Figure 5:
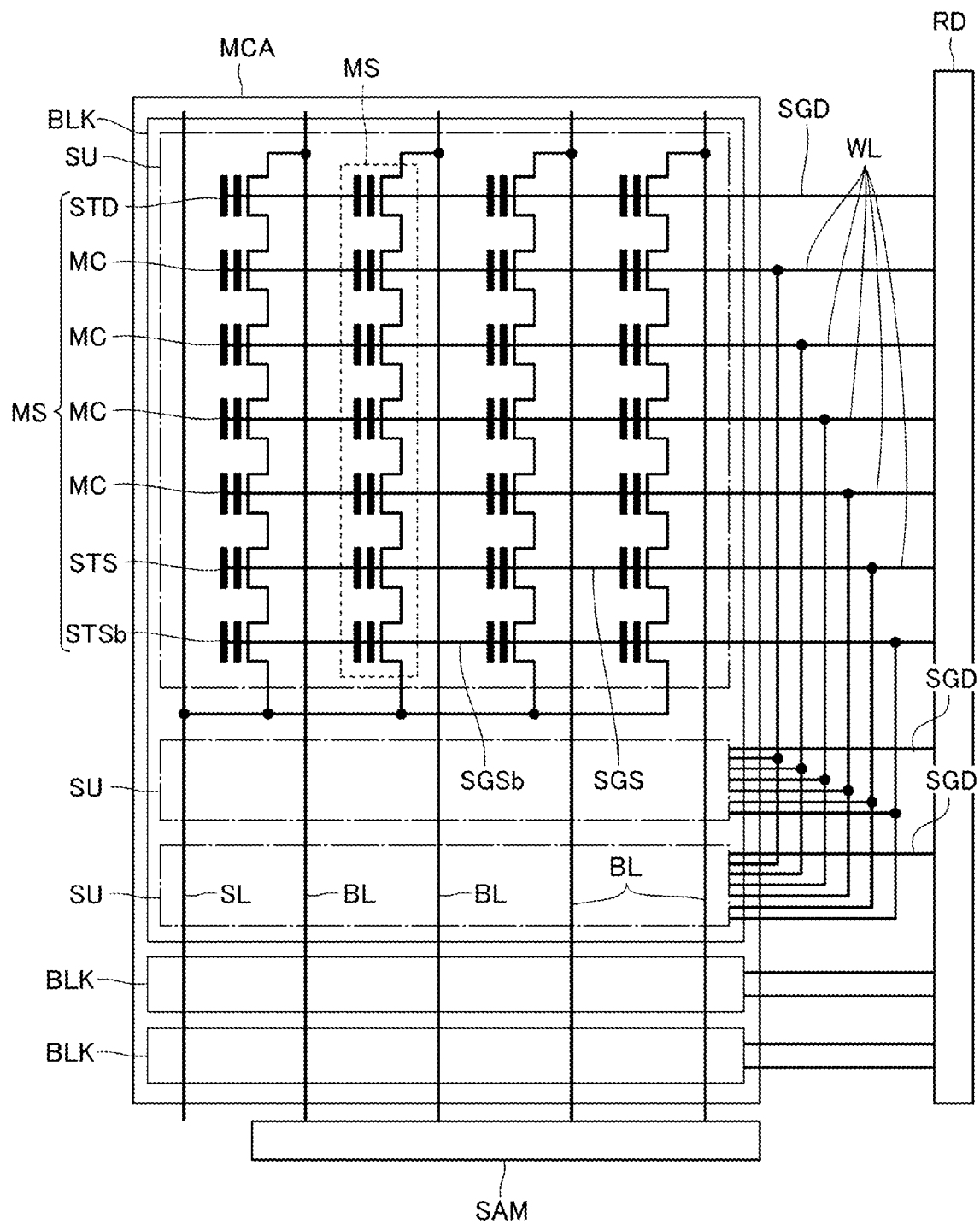
FIG. 5 is a circuit diagram schematically showing a part of a memory die.
Figure 6:
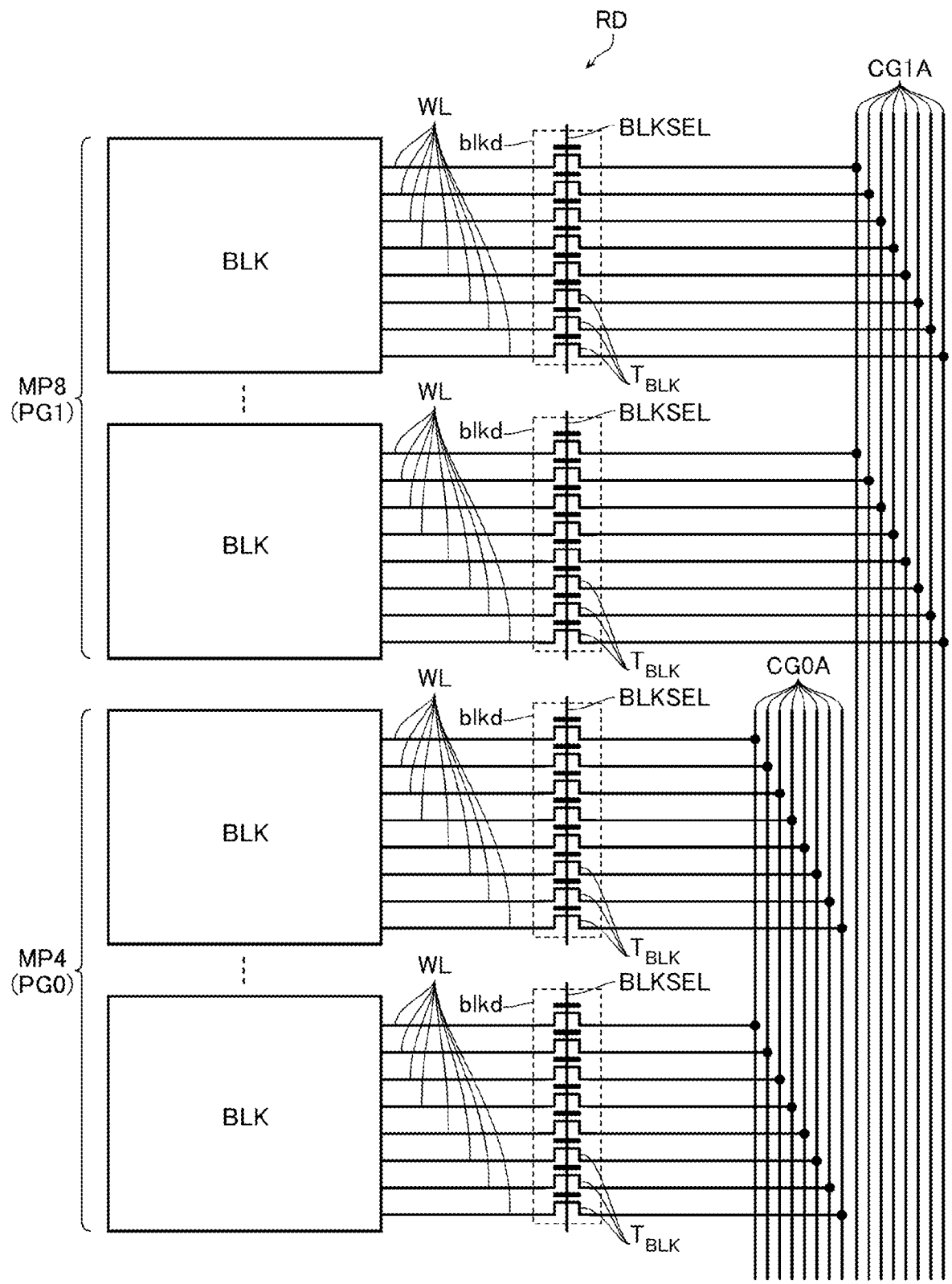
FIG. 6 is a circuit diagram schematically showing another part of a memory die.
Figure 7:
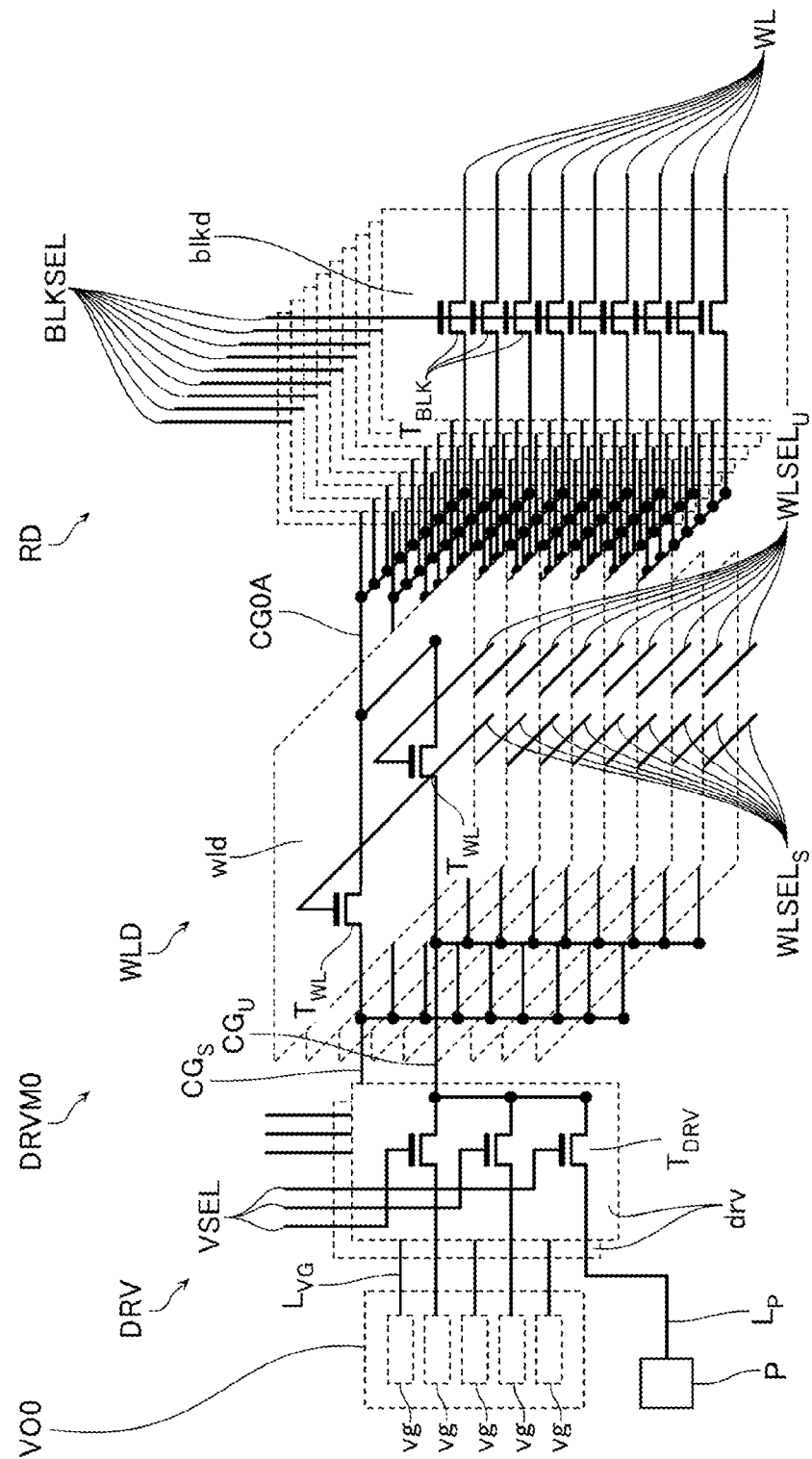
FIG. 7 is a circuit diagram schematically showing still another part of a memory die.

FIG. 4 is a block diagram schematically illustrates showing a configuration of the memory die MD according to the first embodiment. FIGS. 5 to 7 are circuit diagrams schematically illustrates showing a part of the configuration of the memory die MD.

FIG. 4 illustrates a plurality of control terminals and the like. The plurality of control terminals are represented as a control terminal corresponding to a high active signal (positive logic signal), as a control terminal corresponding to a low active signal (negative logic signal), and as a control terminal corresponding to both a high active signal and a low active signal. In FIG. 4, the code of the control terminal corresponding to the low active signal includes an overline. In the present disclosure, the code of the control terminal corresponding to the low active signal includes the slash ("/"). The description in FIG. 4 is an example and the specific embodiment may be modified as appropriate. For example, a part or all of the high active signal may be a low active signal, or a part or all of the low active signal may be a high active signal.

[Circuit Configuration]

As shown in FIG. 4, the memory die MD includes a memory module MM and a peripheral circuit PC.

[Circuit Configuration of Memory Module MM]

The memory module MM includes plane groups PG0 and PG1. The plane group PG0 includes memory planes MP0 to MP7. The plane group PG1 includes memory planes MP8 to MP15. The memory planes MP0 to MP15 each include a memory cell array MCA, a row decoder RD, a sense amplifier module SAM, and a cache memory CM.

As shown in FIG. 5, the memory cell array MCA includes a plurality of memory blocks BLK. Each of the plurality of memory blocks BLK includes a plurality of string units SU. Each of the plurality of string units SU includes a plurality of memory strings MS. One end of each of the plurality of memory strings MS is connected to the sense amplifier module SAM via a bit line BL. Further, the other end of each of the plurality of memory strings MS is connected to a source line driver via a common source line SL.

The memory string MS includes a drain-side select transistor STD, a plurality of memory cells MC (memory transistors), a source-side select transistor STS, and a source-side select transistor STSb, which are connected in series between the bit line BL and the source line SL. Hereinafter, the drain-side select transistor STD, the source-side select transistor STS, and the source-side select transistor STSb may be simply referred to as select transistors (STD, STS, and STSb).

The memory cell MC is a field-effect transistor including a semiconductor layer that functions as a channel region, a gate insulating film including a charge storage film, and a gate electrode. The threshold voltage of the memory cell MC changes according to the amount of charge in the charge storage film. The memory cell MC stores one-bit or multiple-bit data. A word line WL is connected to each of the plurality of memory cells MC corresponding to one memory string MS. These word lines WL function as gate electrodes of memory cells MC provided in all memory strings MS in one memory block BLK, respectively.

The select transistor (STD, STS, or STSb) is a field-effect transistor including a semiconductor layer that functions as a channel region, a gate insulating film, and a gate electrode. Select gate lines (SGD, SGS, and SGSb) are connected to the gate electrodes of the select transistors (STD, STS, and STSb), respectively. The drain-side select gate line SGD is provided corresponding to the string unit SU and functions as gate electrodes of the drain-side select transistors STD provided in all the memory strings MS in one string unit SU. The source-side select gate line SGS functions as gate electrodes of the source-side select transistors STS provided in all the memory strings MS in the memory block BLK. The source-side select gate line SGSb functions as gate electrodes of the source-side select transistors STSb provided in all the memory strings MS in the memory block BLK.

As shown in FIG. 6, for example, the row decoder RD includes a plurality of block decoding units blkd. The plurality of block decoding units blkd are provided corresponding to the plurality of memory blocks BLK in the memory cell array MCA. The block decoding unit blkd includes a plurality of transistors $T_{BLK}$. The plurality of transistors $T_{BLK}$ are provided corresponding to the plurality of word lines WL and select gate lines (SGD, SGS, and SGSb) in the memory block BLK. The transistor $T_{BLK}$ is, for example, a field-effect type NMOS transistor.

The drain electrode of the transistor $T_{BLK}$ is connected to the word line WL or the select gate line (SGD, SGS, or SGSb). The source electrode of the transistor $T_{BLK}$ is connected to the wiring CG (wirings CG0A and CG1A in the example of FIG. 6). The gate electrode of the transistor $T_{BLK}$ is connected to the signal supply line BLKSEL. A plurality of signal supply lines BLKSEL are provided corresponding to all block decoding units blkd. Further, the signal supply line BLKSEL is connected to all the transistors $T_{BLK}$ in the block decoding unit blkd.

The wiring CG0A is electrically connected to all the memory blocks BLK in the memory planes MP0 and MP4 (FIG. 4). The wiring CG1A is electrically connected to all the memory blocks BLK in the memory planes MP8 and MP12. The wiring CG1B (FIG. 4) is electrically connected to all the memory blocks BLK in the memory planes MP9 and MP13. The wiring CG0B is electrically connected to all the memory blocks BLK in the memory planes MP1 and MP5. The wiring CG0C is electrically connected to all the memory blocks BLK in the memory planes MP2 and MP6. The wiring CG1C is electrically connected to all the memory blocks BLK in the memory planes MP10 and MP14. The wiring CG1D is electrically connected to all the memory blocks BLK in the memory planes MP11 and MP15. The wiring CG0D is electrically connected to all the memory blocks BLK in the memory planes MP3 and MP7.

The sense amplifier module SAM (FIG. 4) includes, for example, a plurality of sense amplifier units corresponding to a plurality of bit lines BL (FIG. 5). Each sense amplifier unit includes a sense amplifier connected to the bit line BL. The sense amplifier includes a sense circuit connected to the bit line BL, a voltage transfer circuit connected to the bit line BL, and a latch circuit connected to the sense circuit and the voltage transfer circuit. The sense circuit includes a sense transistor that is turned on according to the voltage or current of the bit line BL and a wiring that is charged or discharged according to the ON or OFF state of the sense transistor. The latch circuit latches "1" or "0" data according to the voltage of this wiring. The voltage transfer circuit conducts the bit line BL with one of the two voltage supply lines according to the data latched by the latch circuit. Each of the sense amplifier modules SAM is connected to a sequencer module SQCM.

The cache memory CM (FIG. 4) includes a plurality of latch circuits connected to the latch circuit in the sense amplifier module SAM. The data contained in the plurality of latch circuits is sequentially transferred to the sense amplifier module SAM or an input and output control circuit I/O.

A decoding circuit and a switch circuit are connected to the cache memory CM. The decoding circuit decodes the column address stored in an address register ADR (FIG. 4). The switch circuit conducts the latch circuit corresponding to the column address with a bus DB (FIG. 4) according to the output signal of the decoding circuit.

[Circuit Configuration of Peripheral Circuit PC]

The peripheral circuit PC includes driver modules DRVM0 and DRVM1, voltage output circuits VO0 and VO1, and the sequencer module SQCM. Further, the peripheral circuit PC includes a register module RM and an address comparison circuit ADC. Further, the peripheral circuit PC includes the input and output control circuit I/O and a logic circuit $C_{TR}$.

[Circuit Configuration of Driver Modules DRVM0 and DRVM1]

The driver module DRVM0 includes, for example, a word line decoder WLD, a driver circuit DRV, and an address decoder.

The word line decoder WLD includes a plurality of word line decoding units wld provided corresponding to a plurality of memory cells MC in the memory string MS. In the illustrated example, the word line decoding unit wld includes two transistors $T_{WL}$. The transistor $T_{WL}$ is, for example, a field-effect type NMOS transistor. The drain electrode of the transistor $T_{WL}$ is connected to the wiring CG (wiring CG0A in the example of FIG. 7). The source electrode of the transistor $T_{WL}$ is connected to a wiring CGs or a wiring $CG_U$. The gate electrode of the transistor $T_{WL}$ is connected to a signal supply line $WLSEL_S$ or a signal supply line $WLSEL_U$. A plurality of signal supply lines $WLSEL_S$ are provided corresponding to one-side transistors $T_{WL}$ in all word line decoding units wld. A plurality of signal supply lines $WLSEL_U$ are provided corresponding to the other-side transistors $T_{WL}$ in all word line decoding units wld.

The transistor $T_{WL}$ in the driver module DRVM0 is connected to the wiring CG0A, the wiring CG0B, the wiring CG0C, or the wiring CG0D (FIG. 4).

The driver circuit DRV includes, for example, as shown in FIG. 7, two driver units drv provided corresponding to the wiring CGs and the wiring $CG_U$. The driver unit drv includes a plurality of transistors $T_{DRV}$. The transistor $T_{DRV}$ is, for example, a field-effect type NMOS transistor. The drain electrode of the transistor $T_{DRV}$ is connected to the wiring CGs or the wiring $CG_U$. The source electrode of the transistor $T_{DRV}$ is connected to a voltage supply line $L_{VG}$ or a voltage supply line $L_P$. The voltage supply line $L_{VG}$ is connected to one of a plurality of output terminals of the voltage output circuit VO0. The voltage supply line $L_P$ is connected to the pad electrode P to which a ground voltage $V_{SS}$ is supplied. The gate electrode of the transistor $T_{DRV}$ is connected to a signal supply line VSEL.

An address decoder in this context refers to, for example, a row address in the address register ADR (FIG. 4) and controls the voltages of the signal supply lines BLKSEL, $WLSEL_S$, and $WLSEL_U$ to the "H" state or the "L" state.

Although not specifically depicted, the driver module DRVM1 has, in general, almost the same configuration as the driver module DRVM0. However, the transistor $T_{WL}$ in the driver module DRVM1 is connected to the wiring CG1A, the wiring CG1B, the wiring CG1C, or the wiring CG1D (FIG. 4). Further, the voltage supply line $L_{VG}$ in the driver module DRVM1 is connected to one of a plurality of output terminals of the voltage output circuit VO1.

In the example of FIG. 7, each word line decoding unit wld includes two transistors $T_{WL}$. However, such a configuration is merely an example and the specific configuration may be modified as appropriate. For example, when controlling the voltage of the word line WL in three or more ways, each word line decoding unit wld may include three transistors $T_{WL}$. Examples of a case of controlling the voltage of the word line WL in three or more ways include a case of supplying a voltage larger than the other selected word line WL to the non-selected word line WL next to the selected word line WL.

[Circuit Configuration of Voltage Output Circuits VO0 and VO1]

The voltage output circuit VO0 is connected to the driver module DRVM0. Each of the voltage output circuits VO0 includes a plurality of voltage generation units vg, as shown in FIG. 7, for example. The voltage generation unit vg generates a voltage of a predetermined magnitude in the read operation, the write sequence, and the erase sequence and outputs the voltage via the voltage supply line $L_{VG}$. The voltage generation unit vg may be, for example, a step-up circuit such as a charge pump circuit or a step-down circuit such as a regulator. The step-down circuit and the step-up circuit are connected to the voltage supply lines $L_P$ to which a power supply voltage $V_{CC}$ and the ground voltage $V_{SS}$ (FIG. 4) are supplied, respectively. These voltage supply lines $L_P$ are connected to, for example, the pad electrodes P described with reference to FIGS. 2 and 3.

The voltage output circuit VO1 is connected to the driver module DRVM1 as shown in FIG. 4, for example. Although not specifically depicted, the voltage output circuit VO1 has, in general, almost the same configuration as the voltage output circuit VO0.

The voltage output circuits VO0 and VO1 generate a plurality of operating voltages applied to the bit line BL, the source line SL, the word line WL, and the select gate line (SGD, SGS, or SGSb) in the read operation, the write operation, and the erasing operation according to the control signal from the sequencer module SQCM (FIG. 4), for example, and output the operating voltages to a plurality of voltage supply lines $L_{VG}$ at the same time. The operating voltage output from the voltage supply line $L_{VG}$ is appropriately modified according to the control signal from the sequencer module SQCM.

[Circuit Configuration of Sequencer Module SQCM]

The sequencer module SQCM (FIG. 4) includes, for example, a sequencer SQCa, a sequencer SQCb, a multiplexer MUX0, and a multiplexer MUX1.

The sequencer SQCa can be used for the read operation, write sequence, and erase sequence. The sequencer SQCa executes a read operation, a write sequence, and an erase sequence for one or both of the plane groups PG0 and PG1 according to the command data stored in a command register CMR. That is, an internal control signal for executing one or more of these operations is output. In the sequencer SQCa, the circuit area of the portion used for the write sequence is larger than the circuit area of the portion used for the read operation.

The sequencer SQCb can be used for the write sequence. When the write sequence by the sequencer SQCa is executed for one of the plane groups PG0 and PG1, the sequencer SQCb executes a write sequence for the other of the plane groups PG0 and PG1 according to the command data stored in the command register CMR. That is, an internal control signal for executing the write sequence is output. The circuit area of the sequencer SQCb is about the same as the circuit area of the portion used for the write sequence in the sequencer SQCa and is larger than the circuit area of the portion used for the read operation in the sequencer SQCa.

In the multiplexer MUX0, the input terminal is connected to the output terminal of the sequencers SQCa and SQCb, and the output terminal is connected to the driver module DRVM0, the voltage output circuit VO0, and the sense amplifier module SAM in the plane group PG0. The multiplexer MUX0 outputs an output signal of the sequencer SQCa or the sequencer SQCb according to the control signal from the sequencer SQCa, the address data in the address register, and the like.

In the multiplexer MUX1, the input terminal is connected to the output terminal of the sequencers SQCa and SQCb, and the output terminal is connected to the driver module DRVM1, the voltage output circuit VO1, and the sense amplifier module SAM in the plane group PG1. The multiplexer MUX1 outputs an output signal of the sequencer SQCa or the sequencer SQCb according to the control signal from the sequencer SQCa, the address data in the address register, and the like.

In addition, the sequencer module SQCM outputs status data indicating the own status to a status register STR.

Further, the sequencer module SQCM generates a ready/busy signal and outputs the ready/busy signal to a terminal RY//BY. The terminal RY//BY is implemented by, for example, the pad electrode P described with reference to FIGS. 2 and 3. The memory die MD according to the present embodiment may output, via the terminal RY//BY, a ready/busy signal indicating the state of the memory die MD, a ready/busy signal indicating the state of the plane group PG0, or a ready/busy signal indicating the state of the plane group PG1.

[Circuit Configuration of Register Module RM]

The register module RM (FIG. 4) includes, for example, the address register ADR that latches address data, the command register CMR that latches command data, and the status register STR that latches status data. In addition, the register module RM latches other parameters, variables, and the like used for control. The register module RM includes, for example, a plurality of latch circuits. The plurality of latch circuits may include, for example, a pair of CMOS inverters.

[Circuit Configuration of Address Comparison Circuit ADC]

The address comparison circuit ADC (FIG. 4) includes, for example, a logic circuit connected to a part of latch circuits in the register module RM. For example, when a command set for executing a write sequence is input twice within a certain period of time, this logic circuit outputs a signal that indicates whether the memory planes corresponding to the two command sets belong to the same plane group.

[Circuit Configuration of Input and Output Control Circuit I/O]

The input and output control circuit I/O (FIG. 4) includes data input and output terminals DQ0 to DQ7, toggle signal input and output terminals DQS and/DQS, and an input circuit such as a comparator connected to data input and output terminals DQ0 to DQ7 and an output circuit such as an Off Chip Driver (OCD) circuit. Further, the input and output circuit I/O includes a shift register connected to the input circuit and the output circuit, and a buffer circuit. The input circuit, the output circuit, the shift register, and the buffer circuit are connected to terminals to which the power supply voltage $V_{CCQ}$ and the ground voltage $V_{SS}$ are supplied, respectively. The data input and output terminals DQ0 to DQ7, the toggle signal input and output terminals DQS and/DQS, and the terminals to which the power supply voltage $V_{CCQ}$ is supplied are implemented by, for example, the pad electrodes P described with reference to FIGS. 2 and 3. The data input via the data input and output terminals DQ0 to DQ7 is output from the buffer circuit to the cache memory CM, the address register ADR, or the command register CMR according to the internal control signal from the logic circuit CTR. Further, the data output via the data input and output terminals DQ0 to DQ7 is input to the buffer circuit from the cache memory CM or the status register STR according to the internal control signal from the logic circuit CTR.

[Circuit Configuration of Logic Circuit CTR]

The logic circuit CTR receives an external control signal from the controller die CD via the external control terminals/CEn, CLE, ALE, /WE, RE, /RE, and outputs accordingly the internal control signal to the input and output control circuit I/O. The external control terminals /CEn, CLE, ALE, /WE, RE, /RE are implemented by, for example, the pad electrodes P described with reference to FIGS. 2 and 3.

[Structure of Memory Die MD]

Figure 8:
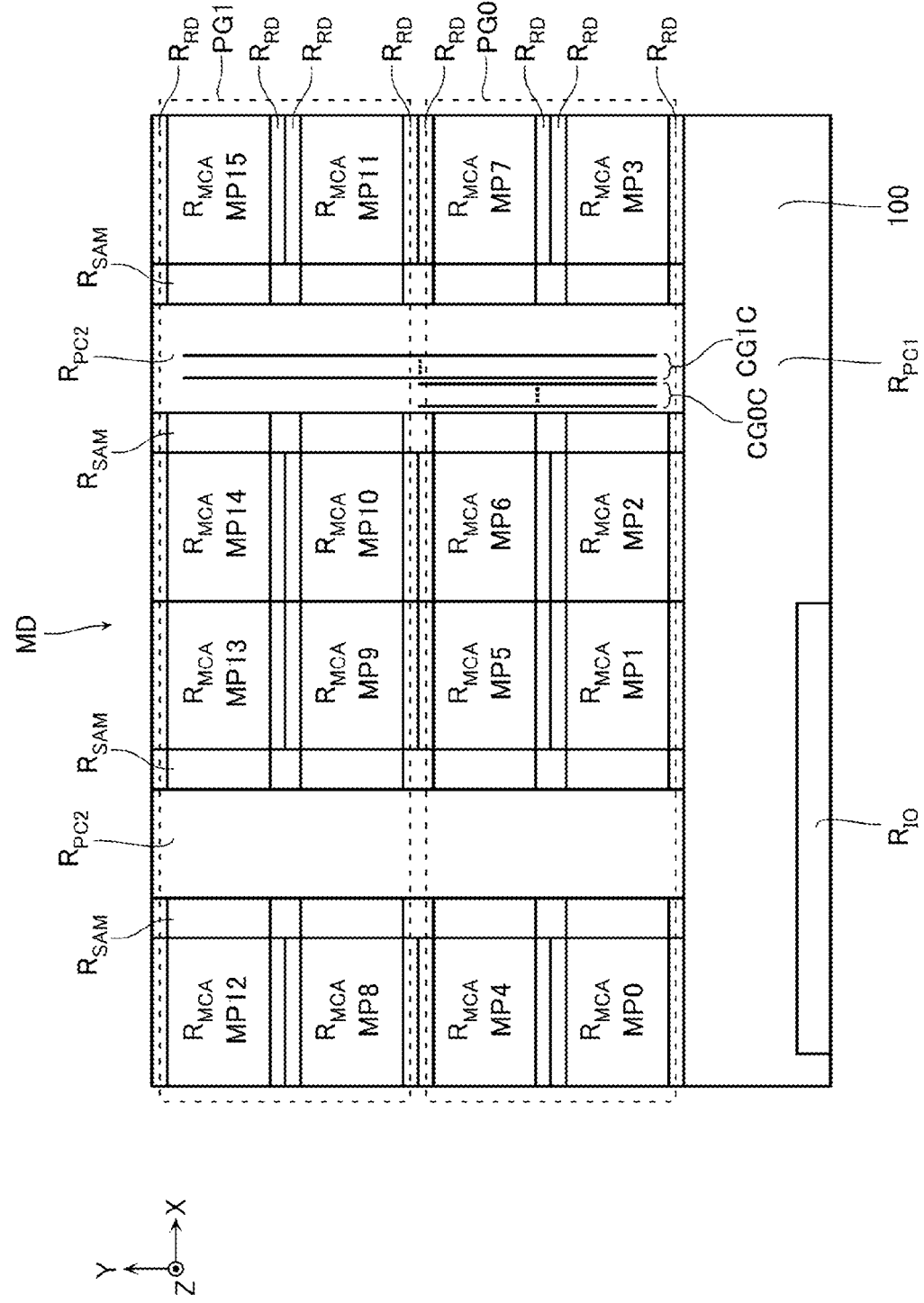
FIG. 8 schematically illustrates a plan view of a memory die.
Figure 9:
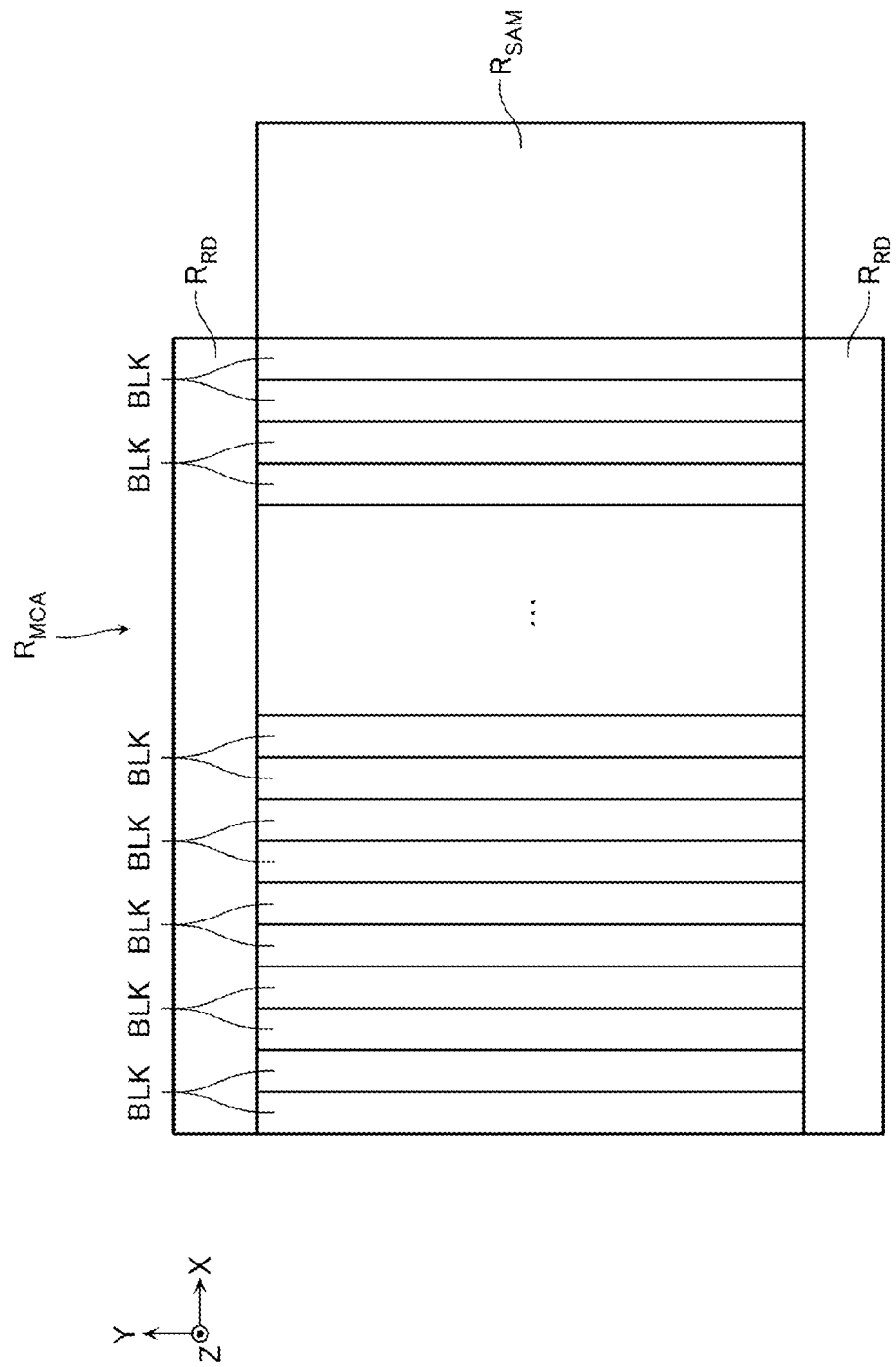
FIG. 9 schematically illustrates an enlarged plan view of a part of a memory die illustrated in FIG. 8.
Figure 10:
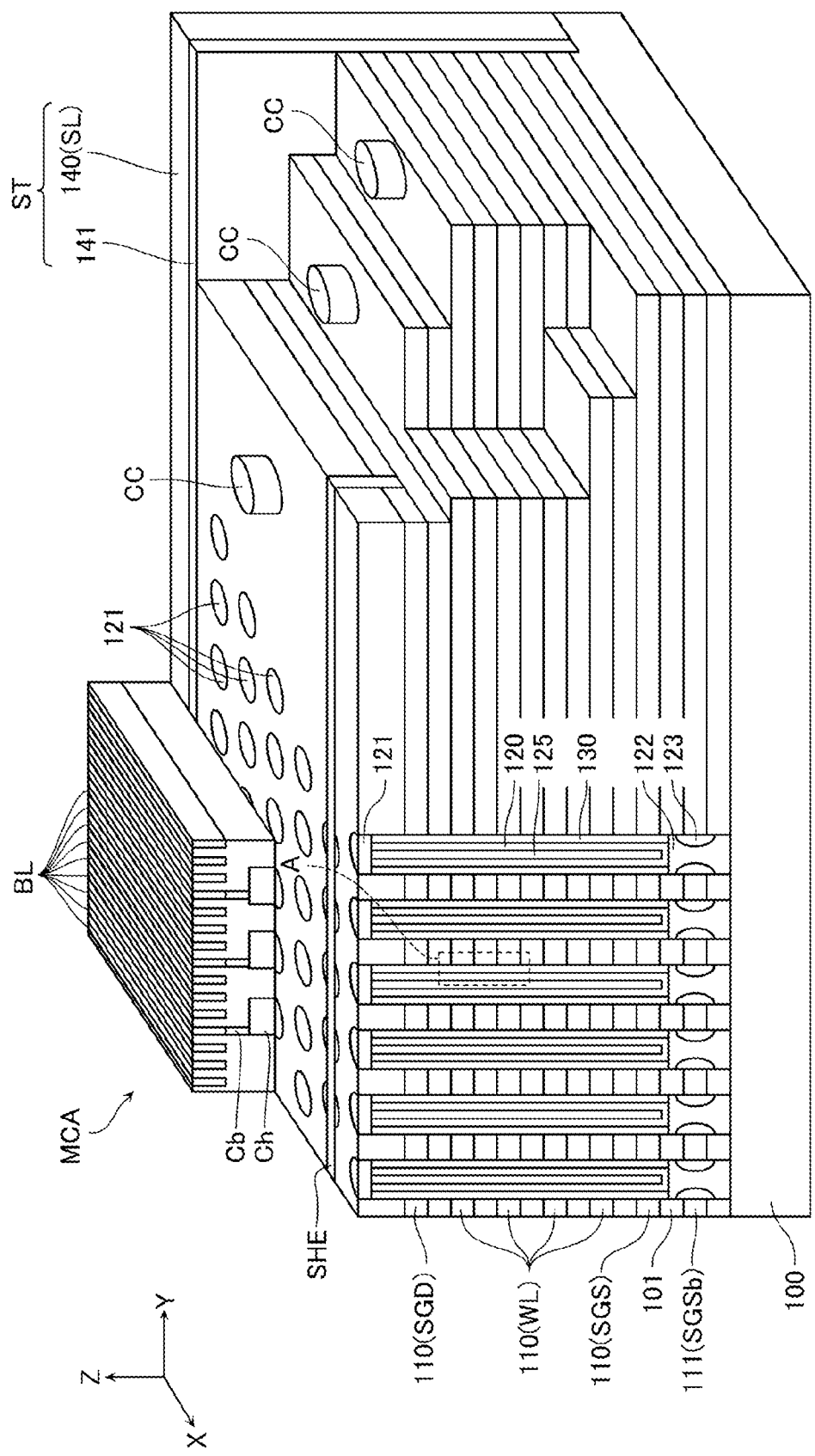
FIG. 10 schematically illustrates a perspective view of a part of a memory die.
Figure 11:
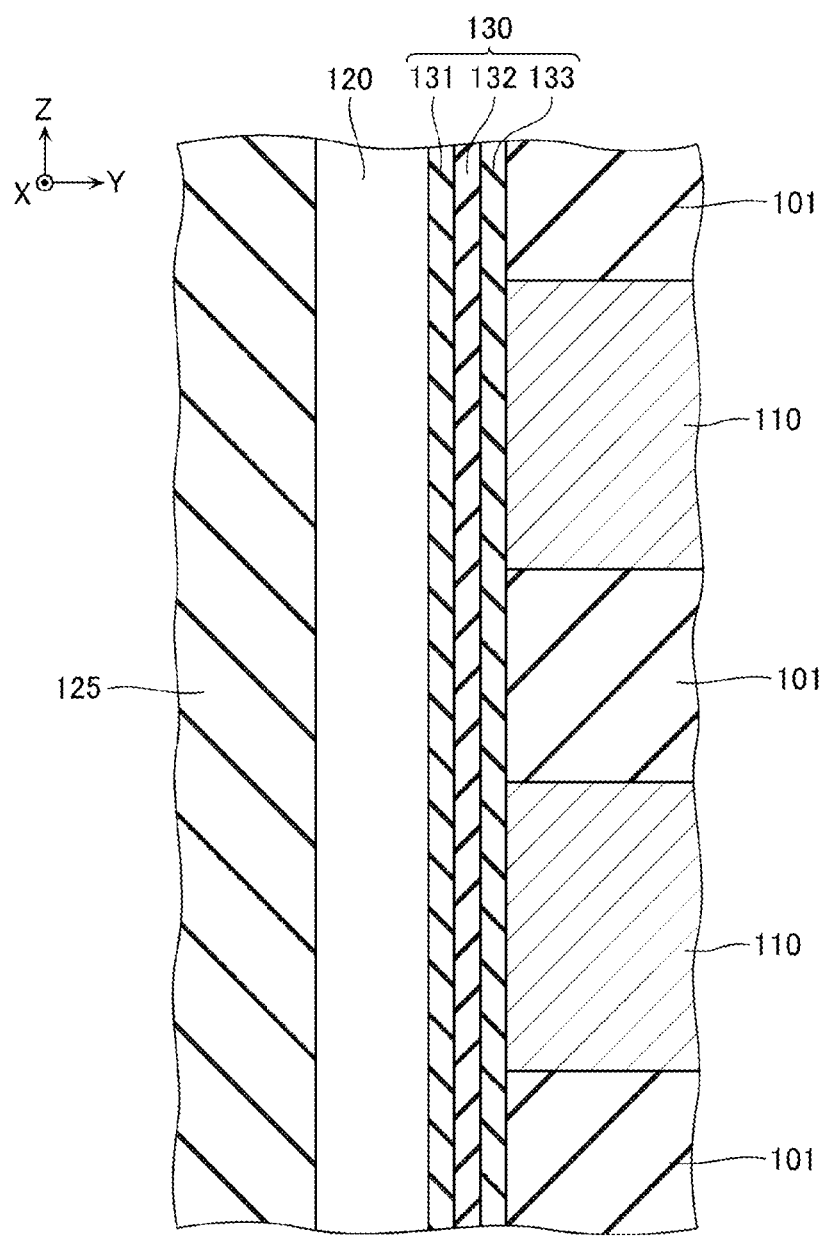
FIG. 11 schematically illustrates an enlarged view of a portion shown by A in FIG. 10.

FIG. 8 schematically illustrates a plan view of the memory die MD. FIG. 9 schematically illustrates an enlarged plan view of a part of the memory die MD illustrated in FIG. 8. FIG. 10 schematically illustrates a perspective view of a part of the configuration of the memory die MD. FIG. 11 schematically illustrates an enlarged view of the portion shown by A in FIG. 10.

As shown in FIG. 8, the memory die MD includes a semiconductor substrate 100. In the illustrated example, the semiconductor substrate 100 is provided, in the X direction, with four columns of four memory cell array regions $R_{MCA}$ arranged in the Y direction. Further, a peripheral circuit region $R_{PC2}$ is provided between the first column and the second column counting from one side in the X direction (for example, the negative side in the X direction in FIG. 8). Similarly, a peripheral circuit region $R_{PC2}$ is provided between the third column and the fourth column counting from one side in the X direction. Further, a peripheral circuit region $R_{PC1}$ is provided at the end portion in the Y direction of the semiconductor substrate 100.

In the illustrated example, the configurations in the four memory cell array regions $R_{MCA}$, which are the closest to the peripheral circuit region $R_{PC1}$ function as a part of the memory plane MP0 to the memory plane MP3 in order from one side in the X direction. Further, the configurations in the four memory cell array regions $R_{MCA}$, which are the second closest to the peripheral circuit region $R_{PC1}$, function as a part of the memory plane MP4 to the memory plane MP7 in order from one side in the X direction. Further, the configurations in the four memory cell array regions $R_{MCA}$, which are the third closest to the peripheral circuit region $R_{PC1}$, function as a part of the memory plane MP8 to the memory plane MP11 in order from one side in the X direction. Further, the configurations in the four memory cell array regions $R_{MCA}$, which are the fourth closest to the peripheral circuit region $R_{PC1}$, function as a part of the memory plane MP12 to the memory plane MP15 in order from one side in the X direction.

Further, in the illustrated example, a row decoder region $R_{RD}$ is provided at a position adjacent to each memory cell array region $R_{MCA}$ in the Y direction. Further, a sense amplifier module region $R_{SAM}$ is provided at a position adjacent to each memory cell array region $R_{MCA}$ in the X direction. Further, the peripheral circuit region $R_{PC1}$ is provided with an input and output circuit region $R_{IO}$. Further, the peripheral circuit region $R_{PC2}$ is provided with a plurality of wirings arranged in the X direction and extended in the Y direction. Some of the plurality of wirings function as the wiring CG. For example, in the example of FIG. 8, a plurality of wirings CG0C extending in the Y direction and a plurality of wirings CG1C are provided along the four memory planes MP2, MP6, MP10, and MP14 arranged in the Y direction. In the illustrated example, the positions of the plurality of wirings CG0C in the X direction are closer to the memory planes MP2, MP6, MP10, and MP14 than the positions of the plurality of wirings CG1C in the X direction.

The memory cell array MCA (FIG. 4) is provided in the memory cell array region $R_{MCA}$. The row decoder RD (FIG. 4) is provided in the row decoder region $R_{RD}$. The sense amplifier module SAM (FIG. 4) is provided in the sense amplifier module region $R_{SAM}$. The peripheral circuit PC (FIG. 4) is provided in the peripheral circuit regions $R_{PC1}$ and $R_{PC2}$. The input and output control circuit I/O (FIG. 4) and the pad electrode P (FIGS. 2 and 3) are provided in the input and output circuit region $R_{IO}$.

The semiconductor substrate 100 is, for example, a semiconductor substrate made of P-type silicon (Si) containing P-type impurities such as boron (B). On the surface of the semiconductor substrate 100, for example, an N-type well region containing N-type impurities such as phosphorus (P), a P-type well region containing P-type impurities such as boron (B), a semiconductor substrate region in which an N-type well region nor a P-type well region are provided, and an insulating region are provided. The N-type well region, the P-type well region, and the semiconductor substrate region each function as a part of a plurality of transistors constituting the peripheral circuit PC, a plurality of capacitors, and the like.

As shown in FIG. 9, a plurality of memory blocks BLK arranged in the X direction are provided in the memory cell array region $R_{MCA}$. As shown in FIG. 10, for example, the memory block BLK includes a plurality of conductive layers 110 arranged in the Z direction, a plurality of semiconductor layers 120 extending in the Z direction, and a plurality of gate insulating films 130 provided between the plurality of conductive layers 110 and the plurality of semiconductor layers 120. Further, an inter-block structure ST is provided between two memory blocks BLK adjacent to each other in the X direction.

The conductive layer 110 is a plate-shaped conductive layer extending in the Y direction. The conductive layer 110 may include a barrier conductive film such as titanium nitride (TiN) and a stacked film of a metal film such as tungsten (W). Further, the conductive layer 110 may contain, for example, polycrystalline silicon containing impurities such as phosphorus (P) or boron (B). An insulating layer 101 such as silicon oxide ($SiO_2$) is provided between the plurality of conductive layers 110 arranged in the Z direction.

A conductive layer 111 is provided below the conductive layer 110. The conductive layer 111 may include, for example, a barrier conductive film such as titanium nitride (TiN) and a stacked film of a metal film such as tungsten (W). Further, an insulating layer 101 such as silicon oxide ($SiO_2$) is provided between the conductive layer 111 and the conductive layer 110.

The conductive layer 111 functions as gate electrodes of the source-side select gate line SGSb (FIG. 5) and a plurality of source-side select transistors STSb connected thereto. The conductive layer 111 is electrically independent for each memory block BLK.

Further, among the plurality of conductive layers 110, one or a plurality of conductive layers 110 located at the lowest layer function as gate electrodes of the source-side select gate line SGS (FIG. 5) and the plurality of source-side select transistors STS connected thereto.

Further, a plurality of conductive layers 110 located above the lowest layer function as gate electrodes of the word lines WL (FIG. 5) and the plurality of memory cells MC (FIG. 5) connected thereto. The plurality of conductive layers 110 are electrically independent for each memory block BLK.

Further, one or a plurality conductive layers 110 located above the above-described conductive layers function as gate electrodes of the drain-side select gate line SGD and the plurality of drain-side select transistors STD (FIG. 5) connected thereto. An insulating layer SHE between string units, such as silicon oxide ($SiO_2$) is provided between two conductive layers 110 adjacent to each other in the X direction. The plurality of conductive layers 110 are electrically independent for each string unit SU (FIG. 5).

At the end portions in the Y direction of the plurality of conductive layers 110, connection portions with a plurality of contacts CC are provided. The plurality of contacts CC extend in the Z direction and are connected to the conductive layer 110 at the lower end. The contact CC may include, for example, a barrier conductive film such as titanium nitride (TiN) and a stacked film of a metal film such as tungsten (W).

The semiconductor layers 120 are arranged in a predetermined pattern in the X direction and the Y direction. The semiconductor layer 120 functions as a channel region of a plurality of memory cells MC and select transistors (STD, STS, and STSb) in one memory string MS (FIG. 5). The semiconductor layer 120 is, for example, a semiconductor layer such as polycrystalline silicon (Si). The semiconductor layer 120 has, for example, a bottomed cylindrical shape, and an insulating layer 125 such as silicon oxide is provided at a central portion thereof. Further, the outer peripheral surfaces of the semiconductor layer 120 are each surrounded by the conductive layer 110 and face the conductive layer 110.

An impurity region 121 containing N-type impurities such as phosphorus (P) is provided at the upper end portion of the semiconductor layer 120. The impurity region 121 is connected to the bit line BL extending in the X direction via a contact Ch and a contact Cb.

The lower end portion of the semiconductor layer 120 is connected to the P-shaped well region of the semiconductor substrate 100 via a semiconductor layer 122 made of single crystal silicon (Si) or the like. The semiconductor layer 122 functions as a channel region of the source-side select transistor STSb. The outer peripheral surface of the semiconductor layer 122 is surrounded by the conductive layer 111 and faces the conductive layer 111. An insulating layer 123 such as silicon oxide is provided between the semiconductor layer 122 and the conductive layer 111.

The gate insulating film 130 has a cylindrical shape that covers the outer peripheral surface of the semiconductor layer 120.

As shown in FIG. 11, for example, the gate insulating film 130 includes a tunnel insulating film 131, a charge storage film 132, and a block insulating film 133, which are stacked between the semiconductor layer 120 and the conductive layer 110. The tunnel insulating film 131 and the block insulating film 133 are, for example, insulating films such as silicon oxide ($SiO_2$). The charge storage film 132 is, for example, a film capable of storing charges, such as silicon nitride ($Si_3N_4$). The tunnel insulating film 131, the charge storage film 132, and the block insulating film 133 have a cylindrical shape and extend in the Z direction along the outer peripheral surface of the semiconductor layer 120.

FIG. 11 shows an example in which the gate insulating film 130 includes a charge storage film 132 such as silicon nitride. However, the gate insulating film 130 may include, for example, a floating gate such as polycrystalline silicon containing N-type or P-type impurities.

As shown in FIG. 10, for example, the inter-block structure ST includes a conductive layer 140 extending in the Z direction and the Y direction, and an insulating layer 141 provided on the side surface of the conductive layer 140 in the X direction. The conductive layer 140 is connected to an N-type impurity region provided in the P-type well region of the semiconductor substrate 100. The conductive layer 140 may include, for example, a barrier conductive film such as titanium nitride (TiN) and a stacked film of a metal film such as tungsten (W). The conductive layer 140 functions, for example, as a part of the source line SL (FIG. 5).

[Threshold Voltage of Memory Cell MC]

Next, the threshold voltage of the memory cell MC will be described with reference to FIGS. 12A to 12C.

FIG. 12A is a schematic histogram for explaining the threshold voltage of the memory cell MC in which 3-bit data is recorded. The horizontal axis represents the voltage of the word line WL, and the vertical axis represents the number of memory cells MC. FIG. 12B is a table showing an example of the relationship between the threshold voltage of the memory cell MC in which 3-bit data is recorded and the recorded data. FIG. 12C is a table showing another example of the relationship between the threshold voltage of the memory cell MC in which 3-bit data is recorded and the recorded data.

In the example of FIG. 12A, the threshold voltage of the memory cell MC is controlled in eight different states. The threshold voltage of the memory cell MC controlled in the Er state is smaller than the erase verification voltage $V_{VFYEr}$. Further, for example, the threshold voltage of the memory cell MC controlled in the A state is larger than the verification voltage $V_{VFYA}$ and smaller than the verification voltage $V_{VFYB}$. Further, for example, the threshold voltage of the memory cell MC controlled in the B state is larger than the verification voltage $V_{VFYB}$ and smaller than the verification voltage $V_{VFYC}$. Similarly, the threshold voltages of the memory cell MC controlled in the C state to the F state are larger than the verification voltage $V_{VFYC}$ to the verification voltage $V_{VFYF}$ and smaller than the verification voltage $V_{VFYD}$ to the verification voltage $V_{VFYG}$, respectively. Further, for example, the threshold voltage of the memory cell MC controlled in the G state is larger than the verification voltage $V_{VFYG}$ and smaller than the read pass voltage $V_{READ}$.

Further, in the example of FIG. 12A, the read voltage $V_{CGAR}$ is set between the threshold value distribution corresponding to the Er state and the threshold value distribution corresponding to the A state. Further, the read voltage $V_{CGBR}$ is set between the threshold value distribution corresponding to the A state and the threshold value distribution corresponding to the B state. Similarly, from between the threshold voltage distribution corresponding to the B state and the threshold voltage distribution corresponding to the C state to between the threshold voltage distribution corresponding to the F state and the threshold voltage distribution corresponding to the G state, the read voltage $V_{CGBR}$ to the read voltage $V_{CGGR}$ are set, respectively.

For example, the Er state corresponds to the lowest threshold voltage (the threshold voltage of the memory cell MC in the erased state). For example, data "111" is assigned to the memory cell MC corresponding to the Er state.

Further, the A state corresponds to a threshold voltage higher than the threshold voltage corresponding to the above Er state. For example, data "101" is assigned to the memory cell MC corresponding to the A state.

Further, the B state corresponds to a threshold voltage higher than the threshold voltage corresponding to the above A state. For example, data "001" is assigned to the memory cell MC corresponding to the B state.

Similarly, the C state to the G state in the drawing correspond to a threshold voltage higher than the threshold voltage corresponding to the B state to the F state. Data "011", "010", "110", "100", and "000" are assigned to the memory cells MC corresponding to these distributions, for example.

In the case of the allocation as illustrated in FIG. 12B, the data of the low-order bits can be determined by one read voltage $V_{CGDR}$, the data of the middle-order bits can be determined by three read voltages $V_{CGAR}$, $V_{CGCR}$, and $V_{CGFR}$, and the data of the high-order bits can be determined by the three read voltages $V_{CGBR}$, $V_{CGER}$, and $V_{CGGR}$. Such data allocation may be referred to as a 1-3-3 code.

The number of bits of data to be recorded in the memory cell MC, the number of states, the allocation of data to each state, and the like can be changed as appropriate.

For example, in the case of the allocation as illustrated in FIG. 12C, the data of the low-order bits can be determined by one read voltage $V_{CGDR}$, the data of the middle-order bits can be determined by two read voltages $V_{CGBR}$ and $V_{CGFR}$, and the data of the high-order bits can be determined by the four read voltages $V_{CGAR}$, $V_{CGCR}$, $V_{CGER}$, and $V_{CGGR}$. Such data allocation may be called a 1-2-4 code.

[Write Sequence]

Figure 13:
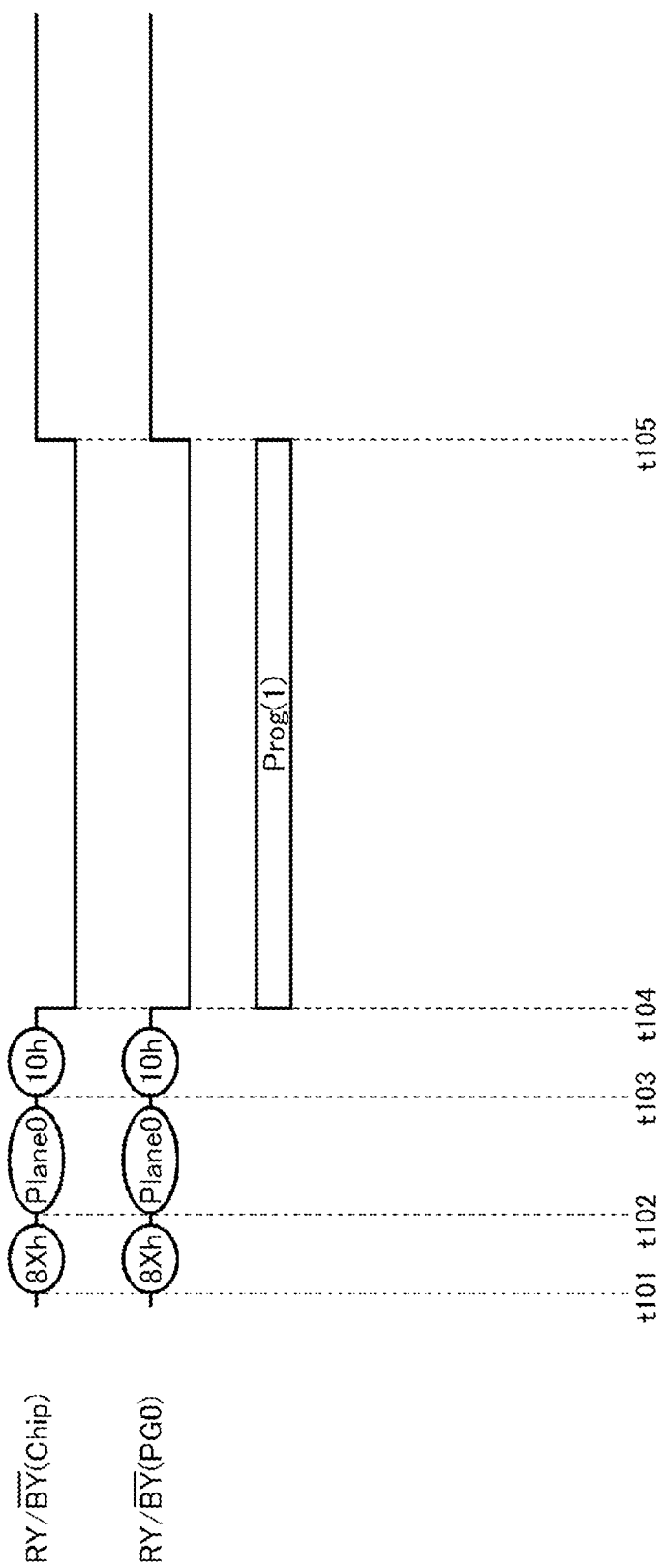
FIG. 13 is a waveform diagram for explaining a write sequence.

Next, the write sequence according to the present embodiment will be described. FIG. 13 is a waveform diagram for explaining the write sequence.

FIG. 13 illustrates a part of the command set input to the memory die MD during the write sequence. This command set includes data 8Xh, data Plane0, and data 10h.

Between the timing t101 and the timing t102, the controller die CD inputs data 8Xh as command data to the memory die MD. Data 8Xh is a command to be input at the start of the write sequence.

When inputting command data, the voltages of the data input and output terminals DQ0 to DQ7 (FIG. 4) are set to "H" or "L" according to each bit of data 8Xh. Then, with "H" input to the external control terminal CLE and "L" input to the external control terminal ALE, the input signals of the toggle signal input and output terminals DQS and/DQS are switched.

Between the time t102 and the time t103, the controller die CD inputs address data and user data to the memory die MD. In the drawing, data Plane0 is illustrated as a part of the address data. Data Plane0 is data that specifies the memory plane MP0 described with reference to FIG. 4 and the like. In the following description, the data that specifies the memory plane MP1 to the memory plane MP15 may be shown as data Plane1 to data Plane15. In addition to the data that specifies any of the memory planes MO to MP15, the address data may include the data that specifies the memory die MD, the data that specifies the memory block BLK, the data that specifies the string unit SU, the data that specifies the word line WL, and the like.

When inputting address data, the voltages of the data input and output terminals DQ0 to DQ7 (FIG. 4) are set to "H" or "L" according to each bit of the 8-bit data that constitutes a part of the address data. Then, with "L" input to the external control terminal CLE and "H" input to the external control terminal ALE, the input signals of the toggle signal input and output terminals DQS and/DQS are switched. As a result, the 8-bit data is input to the memory die MD as a part of the address data. Similarly, the address data is input to the memory die MD by executing the same operation while sequentially switching the voltages of the data input and output terminals DQ0 to DQ7 (FIG. 4).

When inputting user data, the voltages of the data input and output terminals DQ0 to DQ7 (FIG. 4) are set to "H" or "L" according to each bit of the 8-bit data constituting a part of the user data. Then, with "L" input to the external control terminal CLE and "L" input to the external control terminal ALE, the input signals of the toggle signal input and output terminals DQS and/DQS are switched. As a result, the 8-bit data is input to the memory die MD as a part of the user data. Similarly, user data is input to the memory die MD by executing the same operation while sequentially switching the voltages of the data input and output terminals DQ0 to DQ7 (FIG. 4).

Between the time t103 and the time t104, the controller die CD inputs data 10h as command data to the memory die MD. Data 10h is a command indicating that the input of the command set related to the write sequence is completed.

At the time t104, the read operation, write sequence, and the like are not executed in the memory die MD. In such a case, access to the sequencer SQCa is permitted and a write sequence by the sequencer SQCa is started. Further, the ready/busy signal of the memory die MD (R//B(Chip) in FIG. 13) and the ready/busy signal of the plane group PG0 (R//B(PG0) in FIG. 13) change from the "H" state to the "L" state.

At the time t105, the write sequence in the memory die MD is completed. Further, the ready/busy signal of the memory die MD (R//B(Chip) in FIG. 13) and the ready/busy signal of the plane group PG0 (R//B(PG0) in FIG. 13) change from the "L" state to the "H" state.

After that, the controller die CD inputs a command data for executing the status read as command data to the memory die MD, for example. Along with this, the memory die MD outputs the status data latched in the status register STR (FIG. 4).

In the above description, the command set is shown in a simplified form. The specific configuration of the command set actually input to the memory die MD in the write sequence may be modified as appropriate. For example, in the present embodiment, as described with reference to FIGS. 12A to 12C, an example in which 3-bit data is recorded in the memory cell MC is shown. In such a case, in the write sequence, a command set corresponding to the data of the low-order bits, a command set corresponding to the data of the middle-order bits, and a command set corresponding to the bit of the high-order bits may be input to the memory die MD. The command set corresponding to the data of the low-order bits may include, for example, data KKh, data 8Xh, data Plane0, and data 11h. The command set corresponding to the data of the middle-order bits may include, for example, data LLh, data 8Xh, data Plane0, and data 11h. The command set corresponding to the data of the high-order bits may include, for example, data MMh, data 8Xh, data Plane0, and data 10h. The data KKh, LLh, and MMh are commands indicating that the command set corresponds to the data of the low-order bit, the middle-order bit, and the high-order bit, respectively. Further, data 11h is a command indicating that the input of the first command set related to the write sequence is completed and the next command set is input before the write sequence is started.

Figure 14:
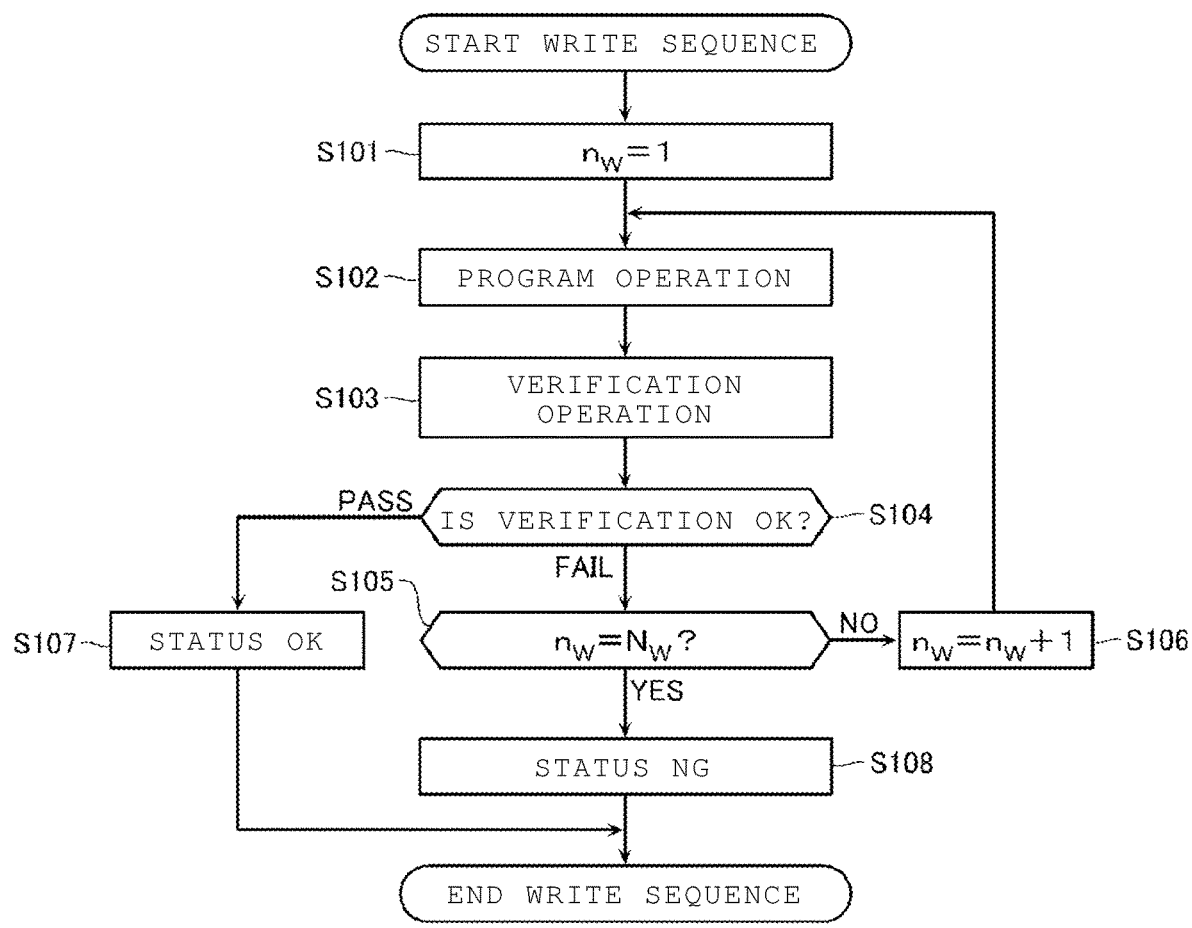
FIG. 14 is a flowchart for explaining a write sequence.
Figure 15:
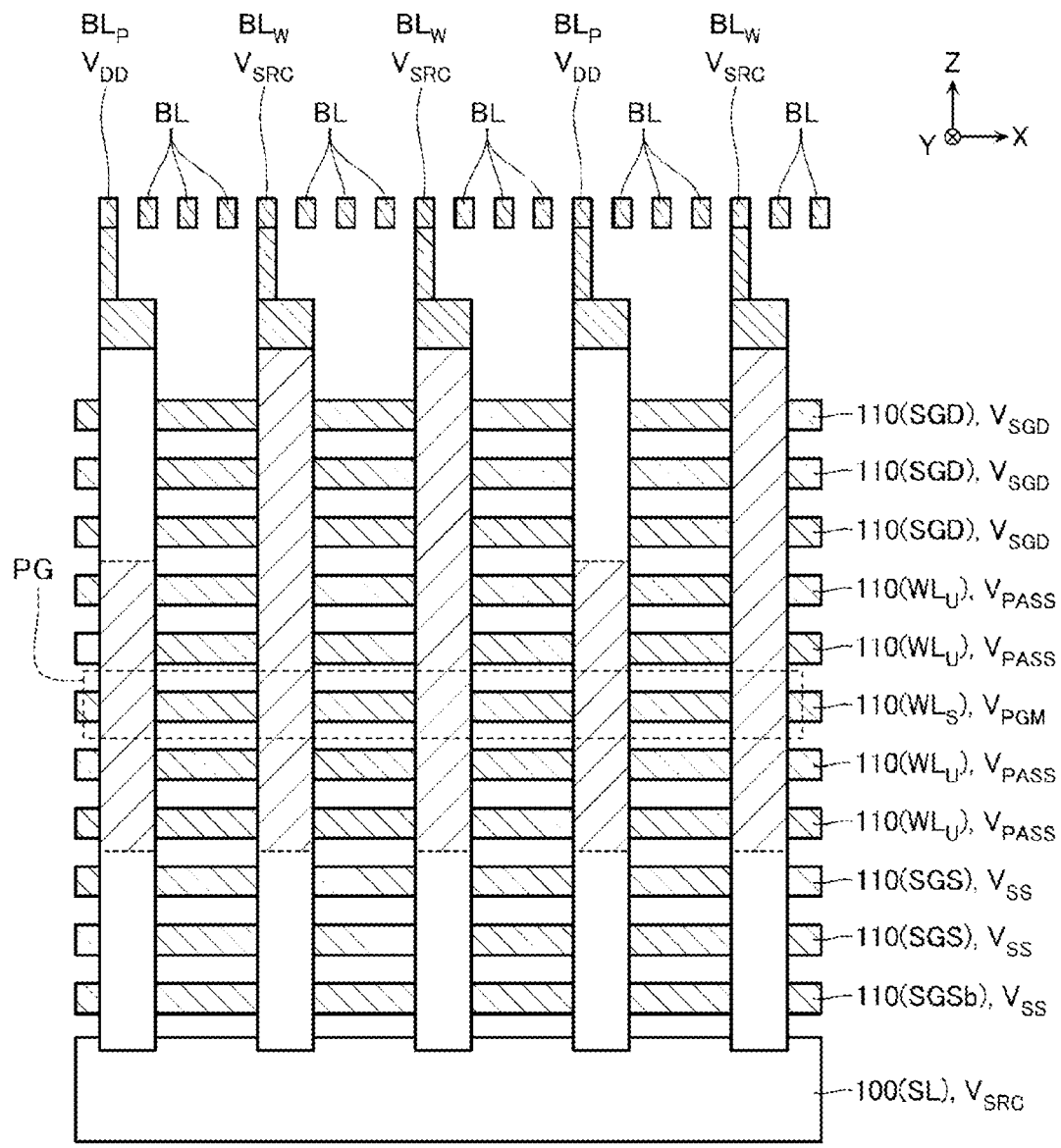
FIG. 15 schematically illustrates a cross-sectional view of a memory die for explaining a program operation included in a write sequence.
Figure 16:
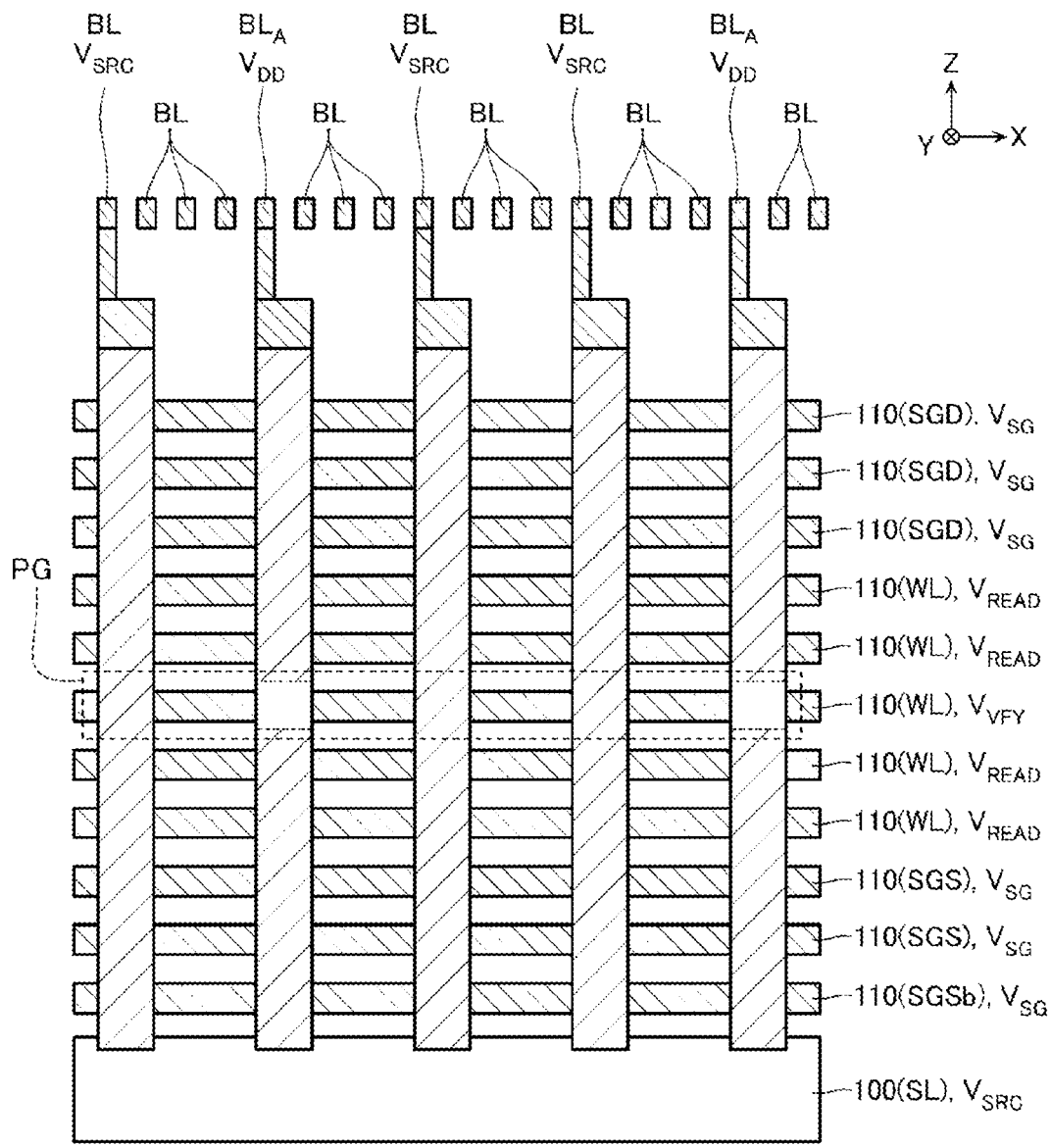
FIG. 16 schematically illustrates a cross-sectional view of a memory die for explaining a verification operation included in a write sequence.
Figure 17:
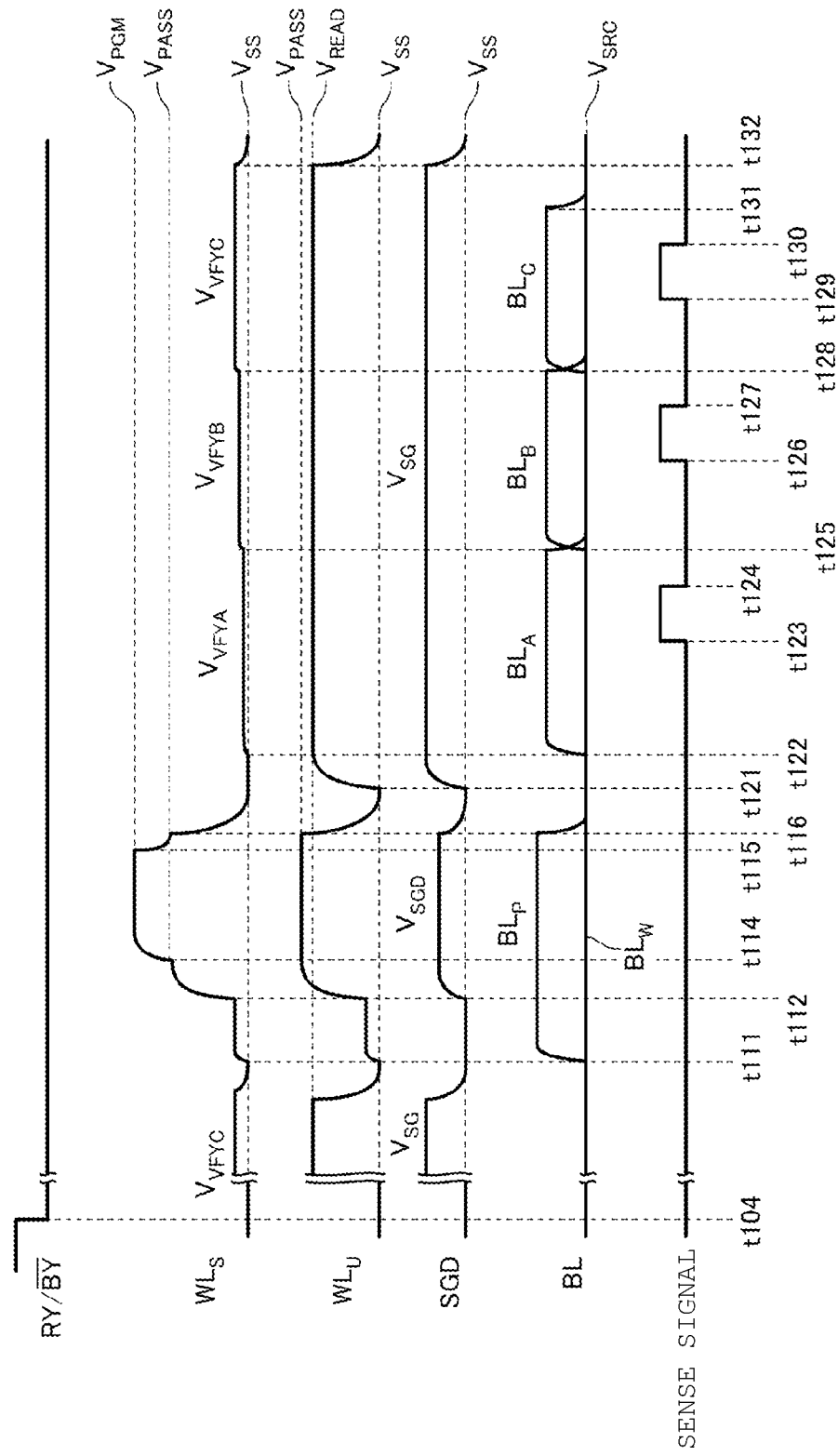
FIG. 17 is a waveform diagram for explaining a write sequence.

FIG. 14 is a flowchart for explaining the write sequence. FIG. 15 schematically illustrates a cross-sectional view of the memory die MD for explaining the program operation included in the write sequence. FIG. 16 schematically illustrates a cross-sectional view of the memory die MD for explaining the verification operation included in the write sequence. FIG. 17 is a waveform diagram for explaining the write sequence.

In the following description, the word line WL that is the target of operation may be referred to as a selected word line $WL_S$, and other word lines WL may be referred to as non-selected word lines $WL_U$. Further, in the following description, an example in which among the plurality of memory cells MC in the string unit SU to be operated, a write sequence for those connected to the selected word line $WL_S$ (hereinafter, may be referred to as "selected memory cell MC") is executed will be described. Further, in the following description, such a configuration including a plurality of selected memory cells MC may be referred to as a selected page PG.

In step S101, for example, as shown in FIG. 14, the number of loops $n_W$ is set to 1. The number of loops $n_W$ is a variable indicating the number of write loops. This operation is executed, for example, at the time t104 of FIG. 17. Further, for example, the user data written in the memory cell MC is latched in the latch circuit in the sense amplifier module SAM (FIG. 4).

In step S102, the program operation is executed. The program operation is an operation of supplying a program voltage to the selected word line $WL_S$ to increase the threshold voltage of the memory cell MC. This operation is executed, for example, from the time t111 to the time t116 in FIG. 17.

At the time t11 of the program operation, for example, a voltage $V_{SRC}$ is supplied to a bit line $BL_W$ connected to a selected memory cell MC that adjusts the threshold voltage (hereinafter, may be referred to as a "write memory cell MC") among a plurality of selected memory cells MC, and a voltage $V_{DD}$ is supplied to a bit line $BL_P$ connected to a selected memory cell MC that does not adjust the threshold voltage (hereinafter, may be referred to as a "inhibited memory cell MC") among the plurality of selected memory cells MC. The voltage $V_{SRC}$ has, for example, a magnitude similar to that of the ground voltage $V_{SS}$. The voltage $V_{SRC}$ is, for example, greater than the ground voltage $V_{SS}$ and smaller than the voltage $V_{DD}$.

At the time t112 of the program operation, a write pass voltage $V_{PASS}$ is supplied to the selected word lines $WL_S$ and the non-selected word lines $WL_U$. Further, a voltage $V_{SGD}$ is supplied to the drain-side select gate line SGD. The write pass voltage $V_{PASS}$ may have the same magnitude as the read pass voltage $V_{READ}$ described with reference to (FIG. 12A to 12C), or may be larger than the read pass voltage $V_{READ}$. The voltage $V_{SGD}$ has a magnitude such that the drain-side select transistor STD is in the ON state or the OFF state according to the voltage of the bit line BL.

At the time t114 of the program operation, a program voltage $V_{PGM}$ is supplied to the selected word line $WL_S$. The program voltage $V_{PGM}$ is greater than the write pass voltage $V_{PASS}$.

Here, for example, as shown in FIG. 15, the voltage $V_{SRC}$ is supplied to the channel of the semiconductor layer 120 connected to the bit line $BL_W$. A relatively large electric field is generated between the semiconductor layer 120 and the selected word line $WL_S$. As a result, the electrons in the channel of the semiconductor layer 120 are tunneled into the charge storage film 132 (FIG. 11) via the tunnel insulating film 131 (FIG. 11). As a result, the threshold voltage of the write memory cell MC increases.

On the other hand, the channel of the semiconductor layer 120 connected to the bit line $BL_P$ is electrically in a floating state, and the potential of this channel rises to about the write pass voltage $V_{PASS}$ due to capacitive coupling with the non-selected word line $WL_U$. An electric field smaller than any of the above-mentioned electric fields is generated between the semiconductor layer 120 and the selected word line $WL_S$. Therefore, the electrons in the channel of the semiconductor layer 120 do not tunnel into the charge storage film 132 (FIG. 11). Therefore, the threshold voltage of the inhibited memory cell MC does not increase.

At the time t115 of the program operation, the write pass voltage $V_{PASS}$ is supplied to the selected word line $WL_S$ and the non-selected word line $WL_U$.

At the time t116 of the program operation, the ground voltage $V_{SS}$ is supplied to the selected word line $WL_S$, the non-selected word line $WL_U$, and the select gate lines (SGD, SGS, and SGSb).

In step S103 (FIG. 14), a verification operation is performed. The verification operation is an operation of supplying a verification voltage to the selected word line $WL_S$ and checking whether or not the threshold voltage of the memory cell MC has reached the target value. This operation is executed, for example, from the time t121 to the time t132 in FIG. 17.

At the time t121 of the verification operation, for example, as shown in FIG. 16, the read pass voltage $V_{READ}$ is supplied to the non-selected word line $WL_U$ to turn on all the memory cells MC. Further, the voltage $V_{SG}$ is supplied to the select gate lines (SGD, SGS, and SGSb) to turn on the select transistors (STD, STS, and STSb). The voltage $V_{SG}$ has a magnitude such that the drain-side select transistor STD is in the ON state regardless of the voltage of the bit line BL. The voltage $V_{SG}$ is greater than the voltage $V_{SGD}$.

At the time t122 of the verification operation, a predetermined verification voltage $V_{VFY}$ (any of the verification voltages $V_{VFYA}$ to $V_{VFYG}$ described with reference to FIG. 12A) is supplied to the selected word line $WL_S$. As a result, for example, as shown in FIG. 16, some of the selected memory cells MC are turned on and the remaining selected memory cells MC are turned off.

Further, at the time t122, for example, the bit line BL is charged. At this time, for example, based on the data of the latch circuit in the sense amplifier module SAM (example of FIG. 17), the voltage $V_{DD}$ is supplied to the bit line BL (bit line $BL_A$ in the example of FIG. 17) connected to the memory cell MC corresponding to a specific state (A state in the example of FIG. 17), and the voltage $V_{SRC}$ is supplied to the other bit lines BL.

In the times t123 to t124 of the verification operation, for example, as shown in FIG. 17, the sense amplifier module SAM (FIG. 4) executes the sense operation. For example, the ON state or the OFF state of the memory cell MC connected to the bit line $BL_A$ is detected based on the current value of the bit line $BL_A$ and is acquired as data indicating the state of the memory cell MC. At this time, the latch circuit in the sense amplifier module SAM may be latched with data indicating the ON state or the OFF state of the memory cell MC.

In the time t125 to the time t127 of the verification operation, the same processing as the processing of the time t122 to the time t124 is performed on the memory cell MC (B state in the example of FIG. 17) in other states. In FIG. 17, the bit line BL connected to the memory cell MC corresponding to the B state is described as the bit line $BL_B$.

In the verification operation the time t128 to the time t130, the same processing as the processing of the time t122 to the time t124 is performed for the memory cells MC (C state in the example of FIG. 17) in other states. In FIG. 17, the bit line BL connected to the memory cell MC corresponding to the C state is described as the bit line $BL_C$.

At the time t131 of the verification operation, the voltage $V_{SRC}$ is supplied to the bit line $BL_C$.

At the time t132 of the verification operation, the ground voltage $V_{SS}$ is supplied to the selected word line $WL_S$, the non-selected word line $WL_U$, and the select gate lines (SGD, SGS, and SGSb).

After that, the data latched by the latch circuit in the sense amplifier module SAM is transferred to a counter circuit or the like, and the number of memory cells MC whose threshold voltage has reached the target value (or alternatively the number of memory cells MC whose threshold voltage has not reached the target value) is counted.

In the example of FIG. 17, three verification voltages $V_{VFYA}$, $V_{VFYB}$, and $V_{VFYC}$ are supplied to the selected word line $WL_S$ in the verification operation. However, the number of verification voltages $V_{VFY}$ supplied to the selected word line $WL_S$ in the verification operation may be two or less, or four or more, or may change according to the number of loops $n_W$.

In step S104 (FIG. 14), the result of the verification operation is determined. For example, when the number of memory cells MC whose threshold voltage has not reached the target value is a certain number or more, it is determined as verification FAIL and the process proceeds to step S105. On the other hand, when the number of memory cells MC whose threshold voltage has not reached the target value is a certain number or less, it is determined as verification PASS and the process proceeds to step S107.

In step S105, it is checked whether or not the number of loops $n_W$ has reached a predetermined number of times $N_W$. If not, the process proceeds to step S106. If so, the process proceeds to step S108.

In step S106, 1 is added to the number of loops $n_W$ and the process proceeds to step S102. Further, in step S106, for example, a predetermined voltage ΔV is added to the program voltage $V_{PGM}$. Therefore, the program voltage $V_{PGM}$ increases as the number of loops $n_W$ increases.

In step S107, the status data indicating that the write sequence has been completed normally is stored in the status register STR (FIG. 4) and the write sequence ends. The status data is output to the controller die CD (FIG. 1) by the status read operation.

In step S108, status data indicating that the write sequence has not been completed normally is stored in the status register STR (FIG. 4) and the write sequence ends.

[Operation to Execute Multiple Write Sequences]

Next, the operation when the controller die CD inputs a plurality of command sets to the memory die MD within a certain time will be described.

For example, as described above, the plane group PG0 (FIG. 4) includes the memory plane MP0 to the memory plane MP7. When the write sequence for at least one of the memory plane MP0 to the memory plane MP7 is started, the write sequence by the sequencer SQCa is started and access to the plane group PG0 and the sequencer SQCa is prohibited.

If a command set to execute the write sequence is input in this state and this command set contains data that specifies at least one of the memory plane MP0 to the memory plane MP7, the write sequence specified by this command set is not executed.

On the other hand, if a command set to execute the write sequence is input in this state and the command set contains data that specifies at least one of the memory plane MP8 to the memory plane MP15, the write sequence specified by the sequencer SQCb is executed with respect to the specified memory plane.

Similarly, the plane group PG1 (FIG. 4) includes the memory plane MP8 to the memory plane MP15. When a write sequence for at least one of the memory plane MP8 to the memory plane MP15 is started, the write sequence by the sequencer SQCa is started and access to the plane group PG1 and the sequencer SQCa is prohibited.

If a command set to execute the write sequence is input in this state and this command set contains data that specifies at least one of the memory plane MP8 to the memory plane MP15, the write sequence specified by this command set is not executed.

On the other hand, if a command set to execute the write sequence is input in this state and the command set contains data that specifies at least one of the memory plane MP0 to the memory plane MP7, the write sequence specified by the sequencer SQCb is executed with respect to the specified memory plane.

Figure 18:
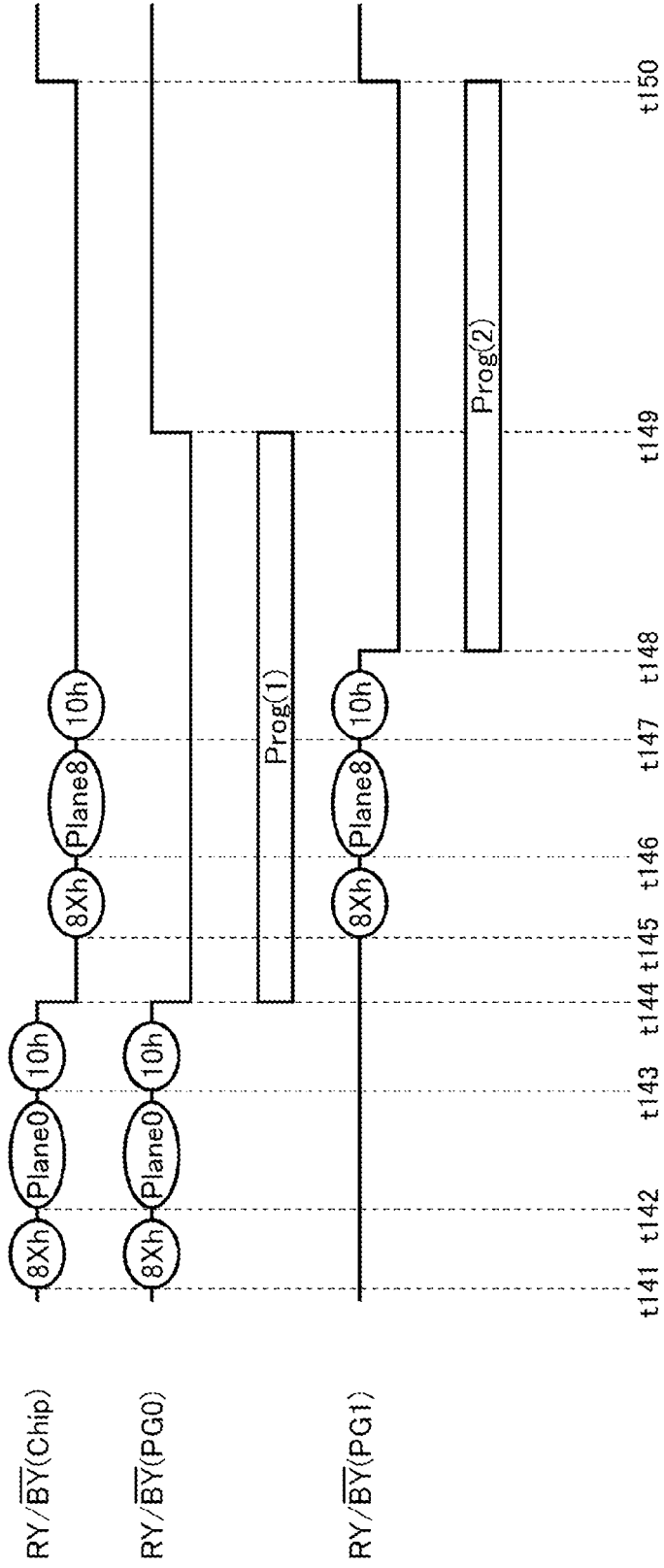
FIG. 18 is a waveform diagram for explaining a write sequence.

FIG. 18 is a waveform diagram for explaining the above-described write sequence.

Between the time t141 and the time t142, the controller die CD inputs data 8Xh as command data to the memory die MD.

Between the time t142 and the time t143, the controller die CD inputs address data and user data to the memory die MD. In the drawing, data Plane0 is illustrated as a part of the address data.

Between the time t143 and the time t144, the controller die CD inputs data 10h as command data to the memory die MD.

At the time t144, the read operation, write sequence, and the like are not executed in the memory die MD. In such a case, access to the plane groups PG0 and PG1 and the sequencer SQCa is permitted and access to the sequencer SQCb is prohibited. Therefore, the write sequence by the sequencer SQCa is started. Further, the ready/busy signal of the memory die MD (R//B(Chip) in FIG. 18) and the ready/busy signal of the plane group PG0 (R//B(PG0) in FIG. 18) changes from the "H" state to the "L" state.

Between the time t145 and the time t146, the controller die CD inputs data 8Xh as command data to the memory die MD.

Between the time t146 and the time t147, the controller die CD inputs address data and user data to the memory die MD. In the drawing, data Plane8 is illustrated as a part of the address data.

Between the time t147 and the time t148, the controller die CD inputs data 10h as command data to the memory die MD.

At the time t148, the write sequence is being executed for the plane group PG0. In such a case, access to the plane group PG1 and the sequencer SQCb is permitted and access to the plane group PG0 and the sequencer SQCa is prohibited. Therefore, the write sequence by the sequencer SQCb is started. Further, the ready/busy signal of the plane group PG1 (R//B(PG1) in FIG. 18) changes from the "H" state to the "L" state.

At the time t149, the write sequence for the memory plane MP0 ends. Further, the ready/busy signal of the plane group PG0 (R//B(PG0) in FIG. 18) changes from the "L" state to the "H" state.

At the time t150, the write sequence for the memory plane MP8 ends. Further, the ready/busy signal of the memory die MD (R//B(Chip) in FIG. 18) and the ready/busy signal of the plane group PG1(R//B(PG1) in FIG. 18) change from the "L" state to the "H" state.

Figure 19:
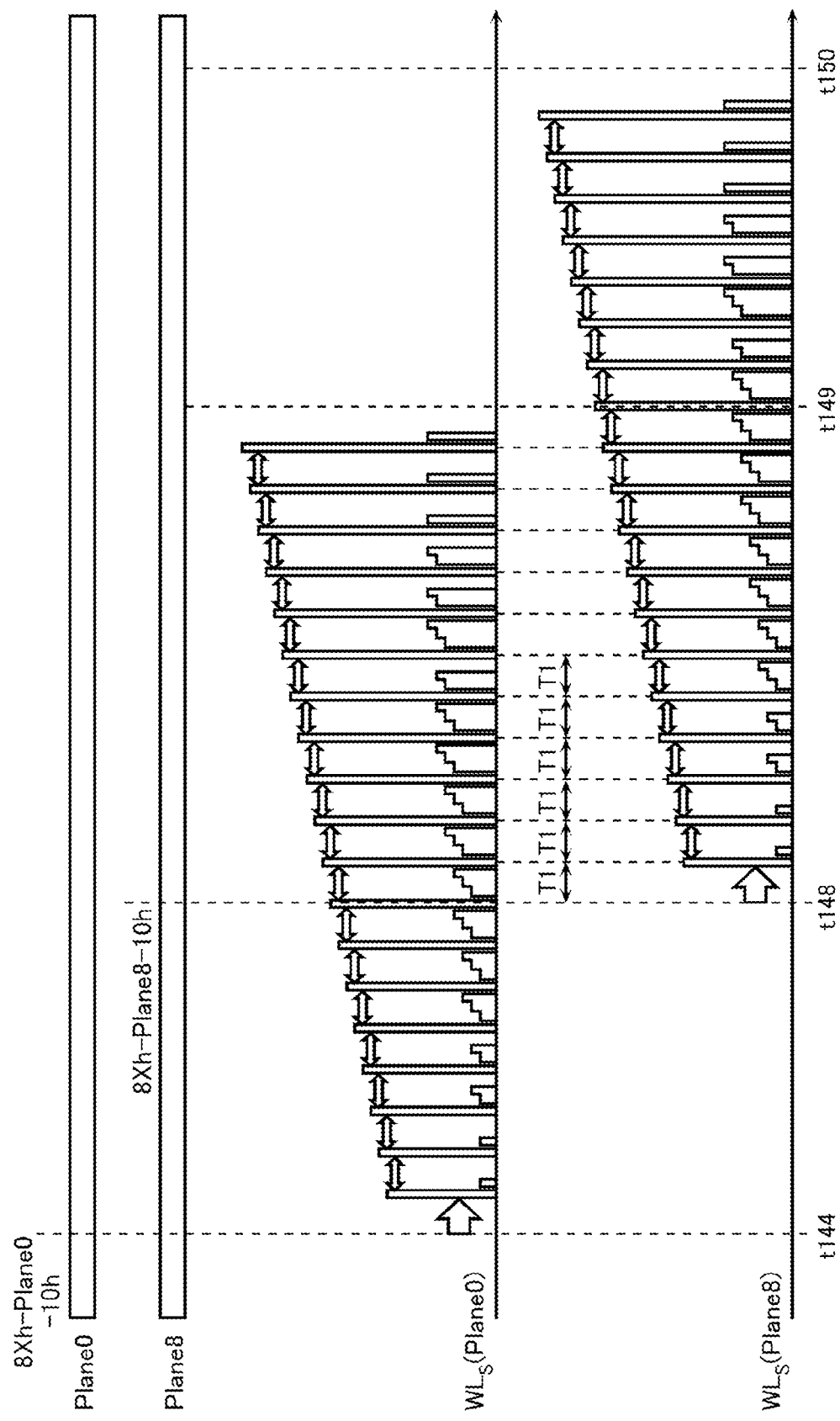
FIG. 19 is a waveform diagram for explaining a write sequence.

FIG. 19 is a waveform diagram for explaining the above-described write sequence. FIG. 19 illustrates a voltage supplied to the selected word line $WL_S$ in the memory plane MP0 and a voltage supplied to the selected word line $WL_S$ in the memory plane MP8.

In the example of FIG. 19, the write sequence for the memory plane MP0 is started between the time t144 and the time t148, and the number of loops $n_W$ described with reference to FIG. 14 and the like increases from 1 to 8. Further, the operations corresponding to the time till to the time t132 in FIG. 17 are executed seven times.

Also, between the time t148 and the time t149, the write sequence for the memory plane MP0 progresses, the number of loops $n_W$ increases from 8 to 19, and the write sequence ends. Further, the operations corresponding to the time t111 to the time t132 in FIG. 17 are executed 11 times. Further, the write sequence for the memory plane MP8 is started, and the number of loops $n_W$ increases from 1 to 12. Further, the operations corresponding to the times t111 to t132 in FIG. 17 are executed 11 times.

Further, between the time t149 and the time t150, the write sequence for the memory plane MP8 progresses, the number of loops $n_W$ increases from 12 to 19, and the write sequence ends. Further, the operations corresponding to the time t111 to the time t132 in FIG. 17 are executed eight times.

In the example of FIG. 19, the operations corresponding to the time t111 to the time t132 of FIG. 17 are repeatedly executed at regular time intervals T1.

However, when the number of loops $n_W$ is 1, 2, or 17 to 19, only one verification voltage $V_{VFYA}$ and $V_{VFYG}$ is supplied to the selected word line $WL_S$. In such a case, the ground voltage $V_{SS}$ or the like may be supplied to the selected word line $WL_S$ at the time t125 to the time t132 in FIG. 17.

Similarly, when the number of loops $n_W$ is 3, 4, 15, or 16, only two verification voltages $V_{VFYA}$ and $V_{VFYB}$ or two verification voltages $V_{VFYF}$ and $V_{VFYG}$ are supplied to the selected word line $WL_S$. In such a case, the ground voltage $V_{SS}$ or the like may be supplied to the selected word line $WL_S$ at the time t128 to the time t132 in FIG. 17.

Further, in the example of FIG. 19, between the time t148 and the time t149, each process corresponding to the time t111 to the time t132 in FIG. 17 is being simultaneously executed between the write sequence for the memory plane MP0 and the write sequence for the memory plane MP8. For example, in the present embodiment, the sequencers SQCa and SQCb may be controlled according to the same clock signal. In this case, for example, each timing of the control by the sequencer SQCa and each timing of the control by the sequencer SQCb may match within the cycle of the clock signal. Further, in the present embodiment, the sequencers SQCa and SQCb may be controlled by the same timing signal other than the clock signal.

[Effect of Semiconductor Storage Device According to First Embodiment]

The memory die MD according to the present embodiment is configured to be able to execute two write sequences in parallel. For example, as described with reference to FIG. 4, the memory die MD according to the present embodiment includes plane groups PG0 and PG1 and two sequencers SQCa and SQCb that can be used for the write sequence.

According to such a configuration, in the execution of the write sequence for one of the plane groups PG0 and PG1, the write sequence for the other of the plane groups PG0 and PG1 can be started without waiting for the end of the write sequence. Therefore, it is possible to provide a semiconductor storage device that operates at high speed.

Further, the controller die CD (FIG. 1) needs to temporarily store the user data after receiving the user data from the host computer 20 until the user data is input to the memory die MD as a part of the command set. Here, the longer the time when the controller die CD stores user data, the more data needs to be stored in the controller die CD, and it is necessary to mount a large amount of memory on the controller die CD. According to the semiconductor storage device according to the present embodiment, such time can be shortened and the cost of the controller die CD can be reduced.

Further, as described with reference to FIG. 8, the memory die MD according to the present embodiment includes a plurality of wirings CG arranged in the X direction and extended in the Y direction. In such a configuration, the voltage of the word line WL may fluctuate due to crosstalk between the wirings CG. For example, when the program operation for the memory plane MP2 and the verification operation for the memory plane MP10 are executed at the same time, the voltage of the wiring CG1C rises significantly at the timing when the program voltage $V_{PGM}$ is supplied to the wiring CG0C (FIG. 4). Therefore, there is a concern that the threshold voltage of the memory cell MC cannot be suitably detected in the memory plane MP10 or the threshold voltage of the memory cell MC unintentionally rises in the memory plane MP10.

Therefore, in the memory die MD according to the present embodiment, as described with reference to FIG. 19, the timing at which the program voltage $V_{PGM}$ is supplied to the plane group PG0 and the timing at which the program voltage $V_{PGM}$ is supplied to the plane group PG1 coincide with each other.

According to such a method, the influence of crosstalk as described above can be reduced. Therefore, it is possible to provide a semiconductor storage device that can be suitably controlled.

Second Embodiment

Figure 20:
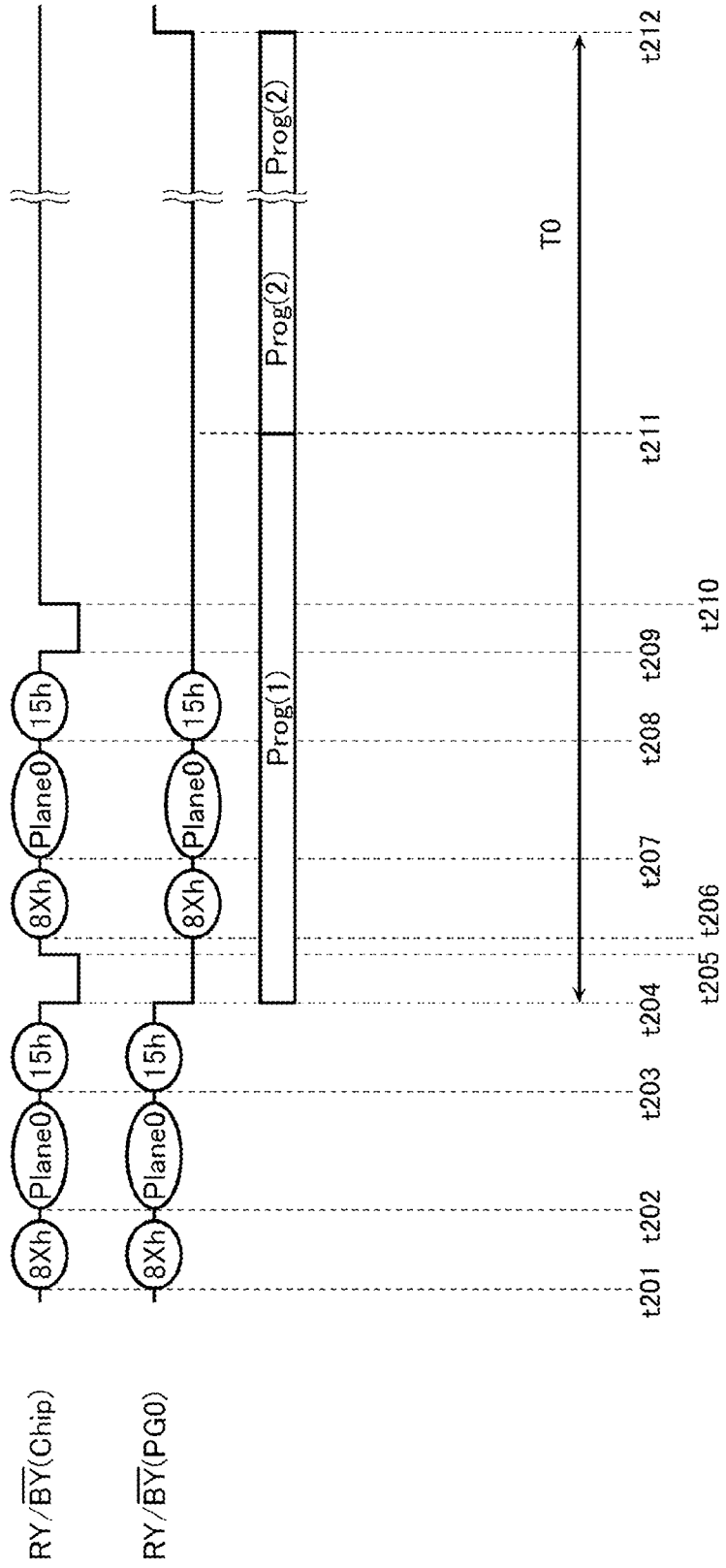
FIG. 20 is a waveform diagram for explaining a write sequence according to a second embodiment.
Figure 21:
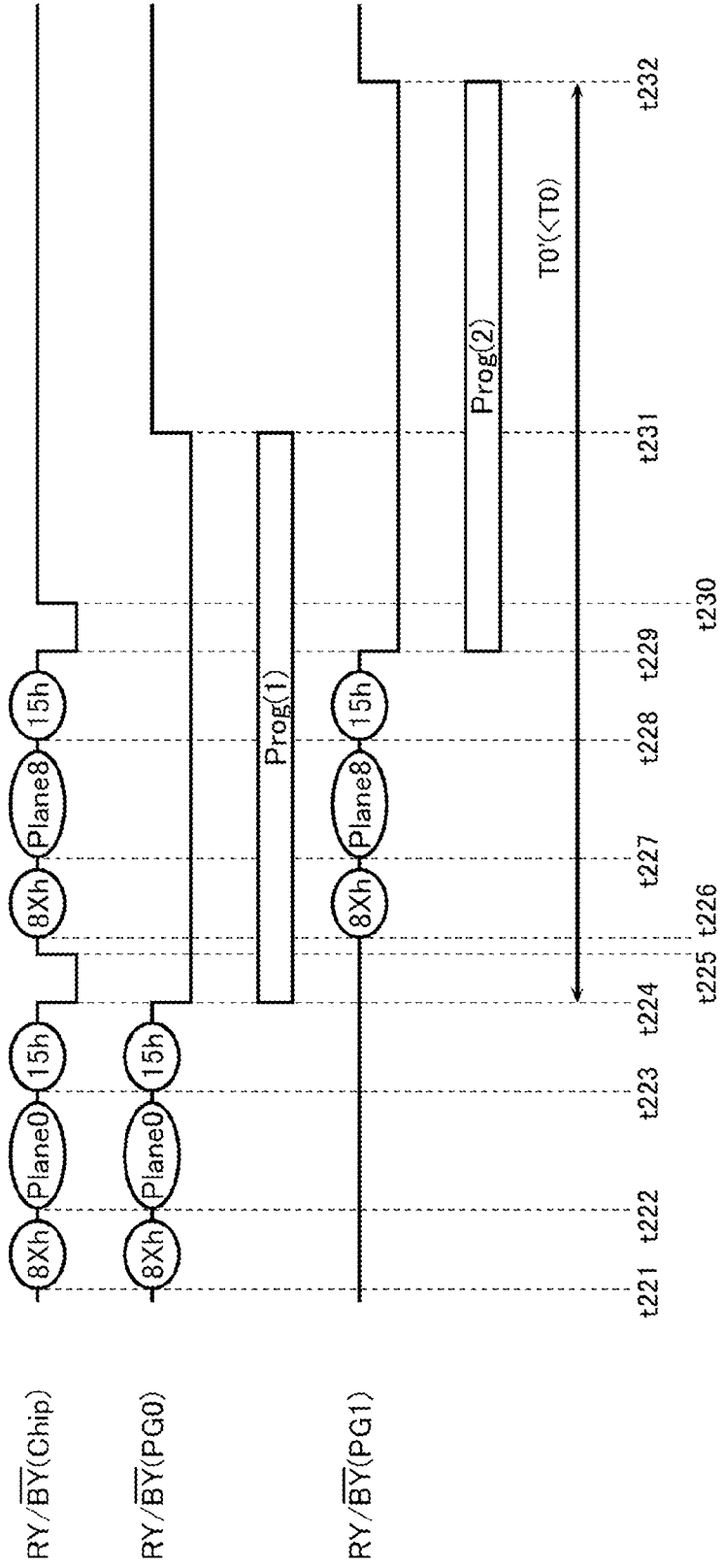
FIG. 21 is a waveform diagram for explaining a write sequence according to a second embodiment.

Next, the second embodiment will be described with reference to FIGS. 20 and 21. FIGS. 20 and 21 are waveform diagrams for explaining a write sequence according to the second embodiment.

The semiconductor storage device according to the second embodiment is configured in the same manner as the semiconductor storage device according to the first embodiment.

FIGS. 20 and 21 illustrate a part of the command set input to the memory die MD during the write sequence. This command set is basically the same as the command set described with reference to FIG. 13. However, the command set illustrated in FIGS. 20 and 21 includes data 15h instead of data 10h.

FIG. 20 illustrates an operation when a command set instructing a write sequence for the same plane group PG0 is input twice within a certain time.

Between the time t201 and the time t202, the controller die CD inputs data 8Xh as command data to the memory die MD.

Between the time t202 and the time t203, the controller die CD inputs address data and user data to the memory die MD. In the drawing, data Plane0 is illustrated as a part of the address data.

Between the time t203 and the time t204, the controller die CD inputs data 15h as command data to the memory die MD. Data 15h is a command indicating that the input of the command set related to the write sequence is completed.

At the time t204, the read operation, write sequence, and the like are not executed in the memory die MD. In such a case, access to the plane groups PG0 and PG1 and the sequencer SQCa is permitted and access to the sequencer SQCb is prohibited. Therefore, the write sequence by the sequencer SQCa is started. Further, the ready/busy signal of the memory die MD (R//B(Chip) in FIG. 20) and the ready/busy signal of the plane group PG0 (R//B(PG0) in FIG. 20) change from the "H" state to the "L" state.

Between the time t204 and the time t205, the user data in the cache memory CM corresponding to the memory plane MP0 is transferred to the latch circuit in the sense amplifier module SAM and the cache memory CM becomes usable. Along with this, at the time t205, the ready/busy signal (R//B(Chip) in FIG. 20) of the memory die MD changes from the "L" state to the "H" state.

Between the time t206 and the time t207, the controller die CD inputs data 8Xh as command data to the memory die MD.

Between the time t207 and the time t208, the controller die CD inputs address data and user data to the memory die MD. In the drawing, data Plane0 is illustrated as a part of the address data.

Between the time t208 and the time t209, the controller die CD inputs data 15h as command data to the memory die MD.

At the time t209, a write sequence is being executed for the plane group PG0. In such a case, access to the plane group PG1 and the sequencer SQCb is permitted and access to the plane group PG0 and the sequencer SQCa is prohibited. Therefore, the write sequence cannot be started at the time t209. In such a case, the address data included in the command set input between the time t206 and the time t209 is temporarily latched in the address register ADR (FIG. 4). Further, the user data included in this command set is temporarily latched in the cache memory CM corresponding to the memory plane MP0.

At the time t211, the write sequence corresponding to the command set input between the time t201 and the time t204 is completed and the write sequence corresponding to the command set input between the time t206 and the time t209 is started.

At the time t212, the write sequence corresponding to the command set input between the time t206 and the time t209 ends. Further, the ready/busy signal of the plane group PG0 (R//B(PG0) in FIG. 20) changes from the "L" state to the "H" state.

FIG. 21 illustrates an operation when a command set instructing a write sequence for the plane group PG0 and a command set instructing a write sequence for the plane group PG1 are input within a certain period of time.

Each process at the time t221 to the time t229 is executed in the same manner as each process at the time t201 to the time t209 in FIG. 20. However, between the time t227 and the time t228, data Plane8 is input instead of data Plane0.

At the time t229, the write sequence is being executed for the plane group PG0. In such a case, access to the plane group PG1 and the sequencer SQCb is permitted and access to the plane group PG0 and the sequencer SQCa is prohibited. Therefore, the write sequence by the sequencer SQCb is started. Further, the ready/busy signal of the memory die MD (R//B(Chip) in FIG. 21) and the ready/busy signal of the plane group PG1 (R//B(PG1) in FIG. 21) change from the "H" state to the "L" state.

At the time t230, the ready/busy signal (R//B(Chip) in FIG. 21) of the memory die MD changes from the "L" state to the "H" state.

At the time t231, the write sequence for the memory plane MP0 ends. Further, the ready/busy signal of the plane group PG0 (R//B(PG0) in FIG. 21) changes from the "L" state to the "H" state.

At the time t232, the write sequence for the memory plane MP8 ends. Further, the ready/busy signal of the plane group PG1 (R//B(PG1) in FIG. 21) changes from the "L" state to the "H" state.

FIG. 20 shows the time from the time t204 to the time t212 as time TO. Further, in FIG. 21, the time from the time t224 to the time t232 is shown as the time TO'. As shown, the time TO' is shorter than the time TO.

The semiconductor storage device according to the second embodiment may be capable of executing the operation according to the first embodiment.

Also, in the above description, the command set is shown in a simplified form. The specific configuration of the command set actually input to the memory die MD in the write sequence may be modified as appropriate. For example, in the write sequence, a command set corresponding to the data of the low-order bits as described above, a command set corresponding to the data of the middle-order bits, and a command set corresponding to the data of the high-order bits may be input to the memory die MD. Further, when inputting the command set corresponding to the data of the high-order bits described above, data 15h may be input instead of data 10h.

[Effect of Semiconductor Storage Device According to Second Embodiment]

According to the semiconductor storage device according to the second embodiment, it is possible to obtain the same effect as the semiconductor storage device according to the first embodiment.

Third Embodiment

Figure 22:
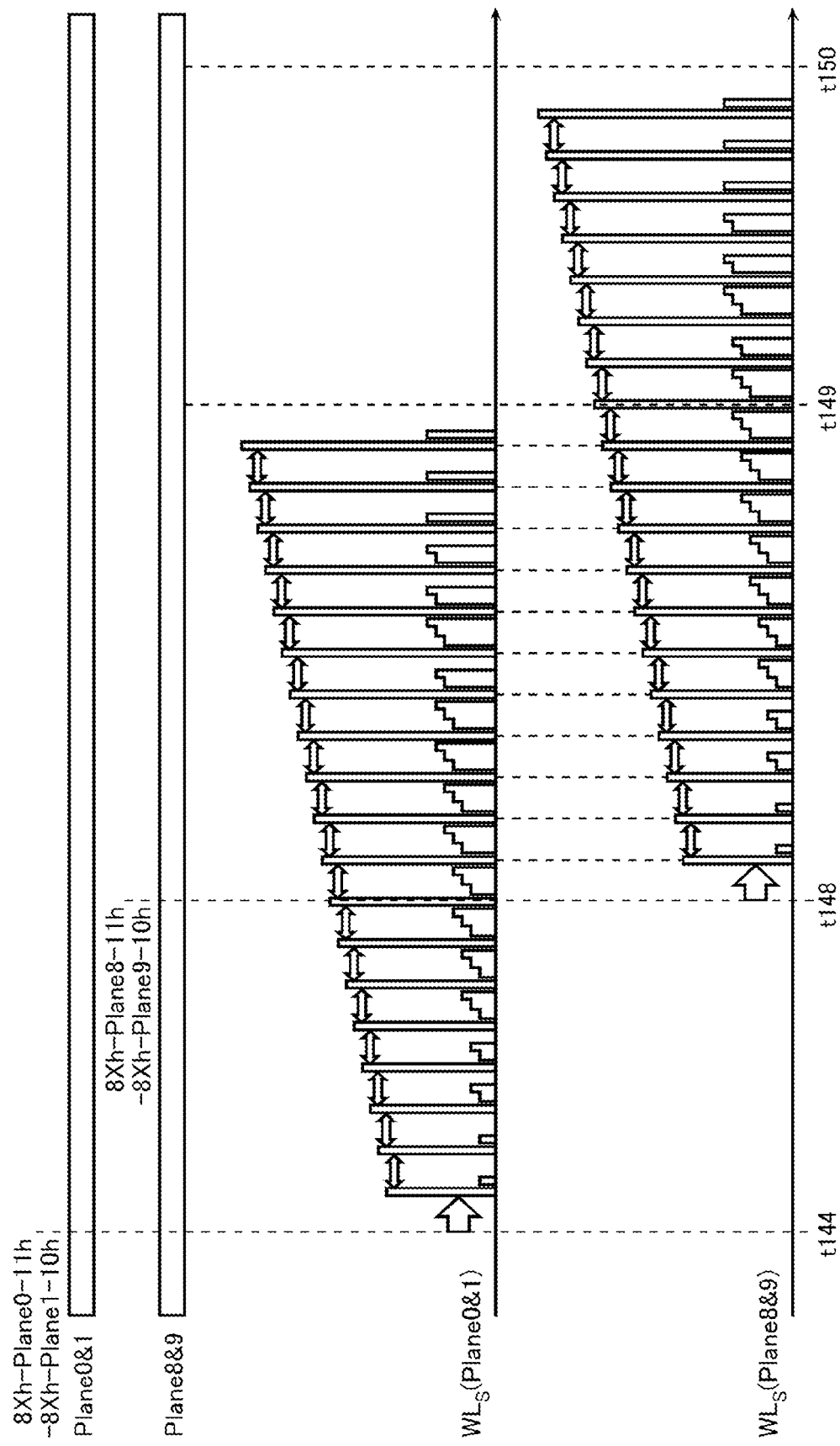
FIG. 22 is a waveform diagram for explaining a write sequence according to a third embodiment.

Next, the third embodiment will be described with reference to FIG. 22. FIG. 22 is a waveform diagram for explaining a write sequence according to the third embodiment. FIG. 22 illustrates the voltage supplied to the selected word line $WL_S$ in the memory planes MP0 and MP1 and the voltage supplied to the selected word line $WL_S$ in the memory planes MP8 and MP9.

In the description so far, an example in which one write sequence is executed for one memory plane has been described. However, for example, the write sequence by the sequencer SQCa may be executed simultaneously for a part or all of the plurality of memory planes MP0 to MP15 belonging to the plane groups PG0 and PG1. Similarly, the write sequence by the sequencer SQCb may be executed simultaneously for a part or all of the plurality of memory planes MP0 to MP15 belonging to the plane groups PG0 and PG1. This point will be described below.

The semiconductor storage device according to the third embodiment is configured in the same manner as the semiconductor storage device according to the first embodiment.

The write sequence according to the third embodiment is basically executed in the same manner as the write sequence as described with reference to FIG. 19. However, in the example of FIG. 19, the controller die CD inputs two command sets to the memory die MD. On the other hand, in the example of FIG. 22, the controller die CD inputs four command sets to the memory die MD.

The first command set includes data 8Xh, data Plane0, and data 11h. The second command set includes data 8Xh, data Plane 1, and data 10h. The third command set includes data 8Xh, data Plane8, and data 11h. The fourth command set includes data 8Xh, data Plane 9, and data 10h.

In the example of FIG. 22, the controller die CD inputs the first command set and the second command set to the memory die MD by the time t144.

Further, a write sequence for the memory plane MP0 and the memory plane MP1 is started between the time t144 and the time t148. Further, the controller die CD inputs the third command set and the fourth command set to the memory die MD.

Further, between the time t148 and the time t149, the write sequence for the memory plane MP0 and the memory plane MP1 progresses and the write sequence ends. Further, a write sequence for the memory plane MP8 and the memory plane MP9 has been started.

Further, between the time t149 and the time t150, the write sequence for the memory plane MP8 and the memory plane MP9 progresses and the write sequence ends.

The semiconductor storage device according to the third embodiment may be capable of executing the operations according to the first and second embodiments.

Also, in the above description, the command set is shown in a simplified form. The specific configuration of the command set actually input to the memory die MD in the write sequence may be modified as appropriate. For example, in the write sequence, a command set corresponding to the data of the low-order bits as described above, a command set corresponding to the data of the middle-order bits, and a command set corresponding to the data of the high-order bits may be input to the memory die MD. However, when the command set corresponding to the data of the low-order bits of the memory plane MP0 is input and then the command set corresponding to the data of the low-order bits of the memory plane MP1 is input, data 1Ah may be input instead of data 11h. Similarly, when the command set corresponding to the data of the middle-order bits of the memory plane MP0 is input and then the command set corresponding to the data of the middle-order bits of the memory plane MP1 is input, data 1Ah is input instead of data 11h. Data 1Ah is a command indicating that the input of the first command set related to the write sequence is completed and the next command set is input before the write sequence is started.

[Effect of Semiconductor Storage Device According to Third Embodiment]

According to the semiconductor storage device according to the third embodiment, it is possible to obtain the same effect as the semiconductor storage device according to the first and second embodiments. Further, according to the semiconductor storage device according to the third embodiment, the amount of data that can be written in one write sequence is larger than that of the semiconductor storage devices according to the first and second embodiments. Therefore, it is possible to provide a semiconductor storage device that operates at a higher speed than the semiconductor storage devices according to the first and second embodiments.

Fourth Embodiment

Figure 23:
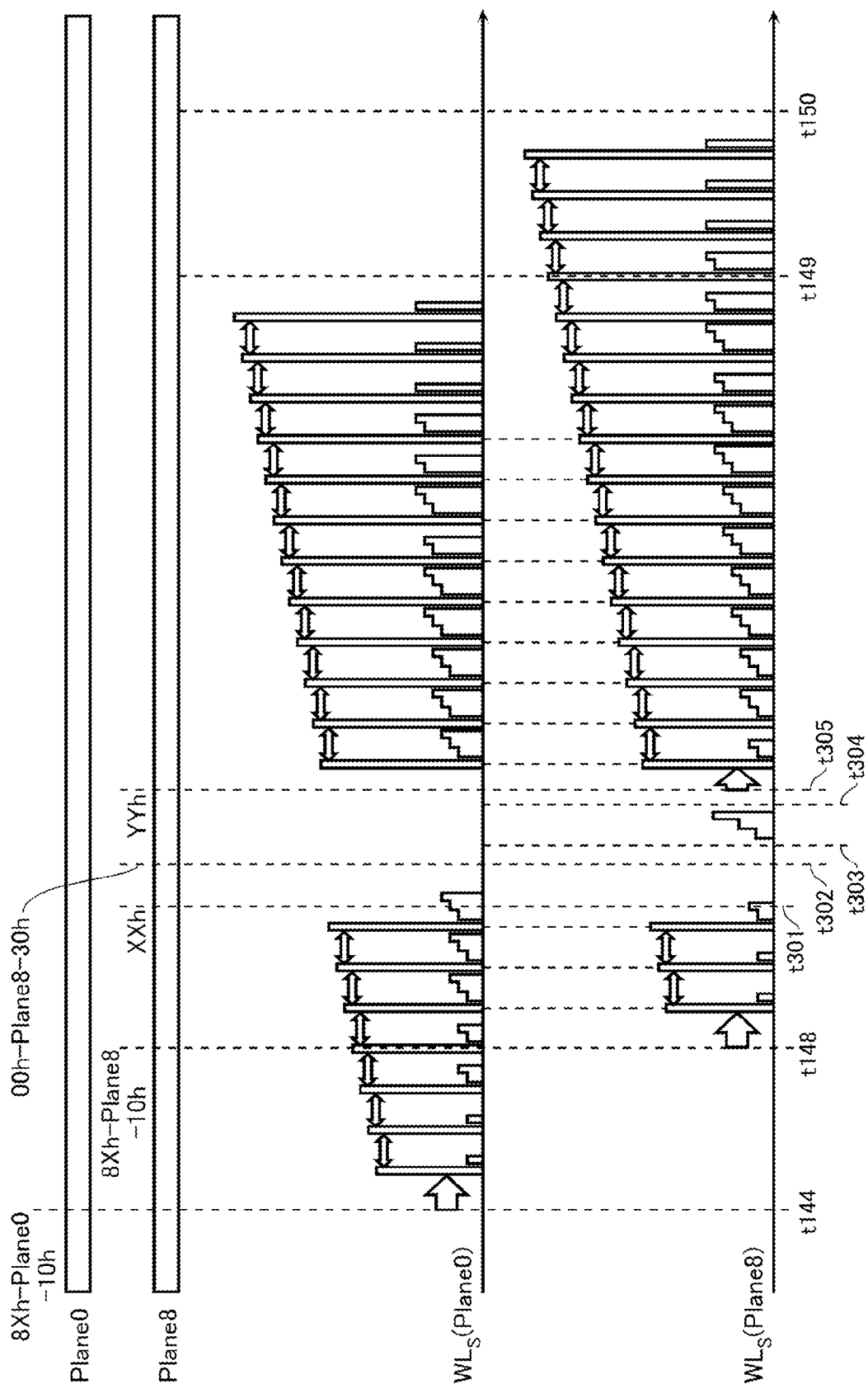
FIG. 23 is a waveform diagram for explaining a write sequence according to a fourth embodiment.

Next, the fourth embodiment will be described with reference to FIG. 23. FIG. 23 is a waveform diagram for explaining a write sequence according to the fourth embodiment. FIG. 23 illustrates the voltage supplied to the selected word line $WL_S$ in the memory plane MP0 and the voltage supplied to the selected word line $WL_S$ in the memory plane MP8.

The semiconductor storage device according to the fourth embodiment is configured in the same manner as the semiconductor storage device according to the first embodiment.

The write sequence according to the fourth embodiment is basically executed in the same manner as the write sequence as described with reference to FIG. 19. However, in the example of FIG. 19, the controller die CD did not send the command set or the like to the memory die MD during the execution of the write sequence. On the other hand, in the example of FIG. 23, the controller die CD sends a command set or the like to the memory die MD during the execution of the write sequence.

In the example of FIG. 23, the write sequence for the memory plane MP0 and the memory plane MP8 is in progress between the time t148 and the time t301.

Further, at the time t301, the controller die CD inputs data XXh as command data to the memory die MD. Data XXh is a command that temporarily suspends the write sequence.

Further, between the time t301 and the time t302, the write sequence for the memory plane MP0 and the memory plane MP8 is temporarily suspended. Also, the controller die CD inputs the command set to the memory die MD. This command set includes data 00h, data Plane8, and data 30h. Data 00h is a command input at the start of the read operation. Data 30h is a command indicating that the input of the command set related to the read operation is completed.

Figure 12:
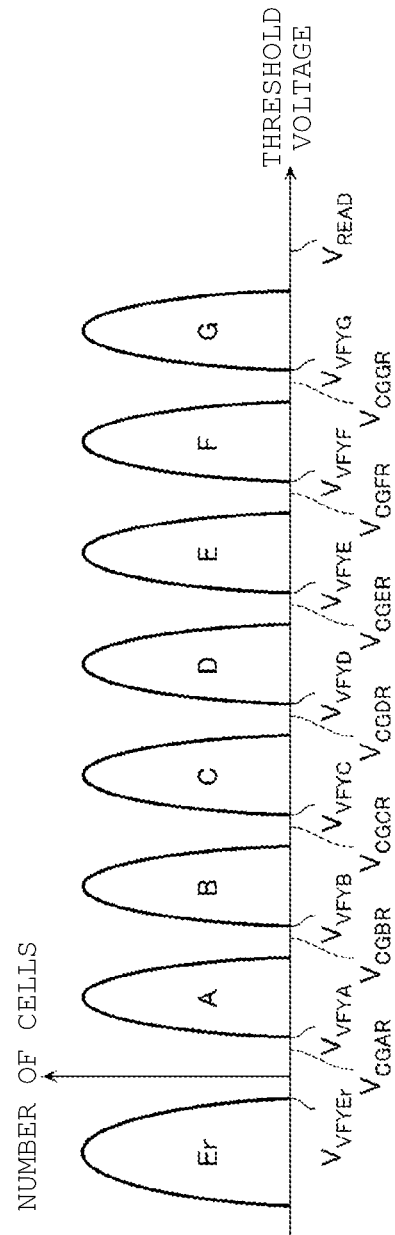
FIGS. 12A to 12C are diagrams for explaining a threshold voltage of a memory cell in which 3-bit data is recorded.

Further, the read operation for the memory plane MP8 is executed between the time t303 and the time t304. In the example of FIG. 23, the read voltages $V_{CGAR}$, $V_{CGCR}$, and $V_{CGFR}$ described with reference to FIG. 12 are supplied to the selected word line $WL_S$ in the memory plane MP8, whereby the data of the middle-order bits is read.

Further, at the time t304, the controller die CD inputs data YYh as command data to the memory die MD. Data YYh is a command for resuming the write sequence.

Further, at the time t305, the write sequence for the memory plane MP0 and the memory plane MP8 is resumed.

The semiconductor storage device according to the fourth embodiment may be capable of executing the operations according to the first to third embodiments.

[Effect of Semiconductor Storage Device According to Fourth Embodiment]

According to the semiconductor storage device according to the fourth embodiment, it is possible to obtain the same effect as the semiconductor storage devices according to the first to third embodiments. Further, in the fourth embodiment, when the read operation for one plane group PG1 is executed, the write sequence for the other plane group PG0 is also suspended. Therefore, it is possible to eliminate the influence of the write sequence on the read operation. This makes it possible to provide a highly reliable semiconductor storage device.

Fifth Embodiment

Figure 24:
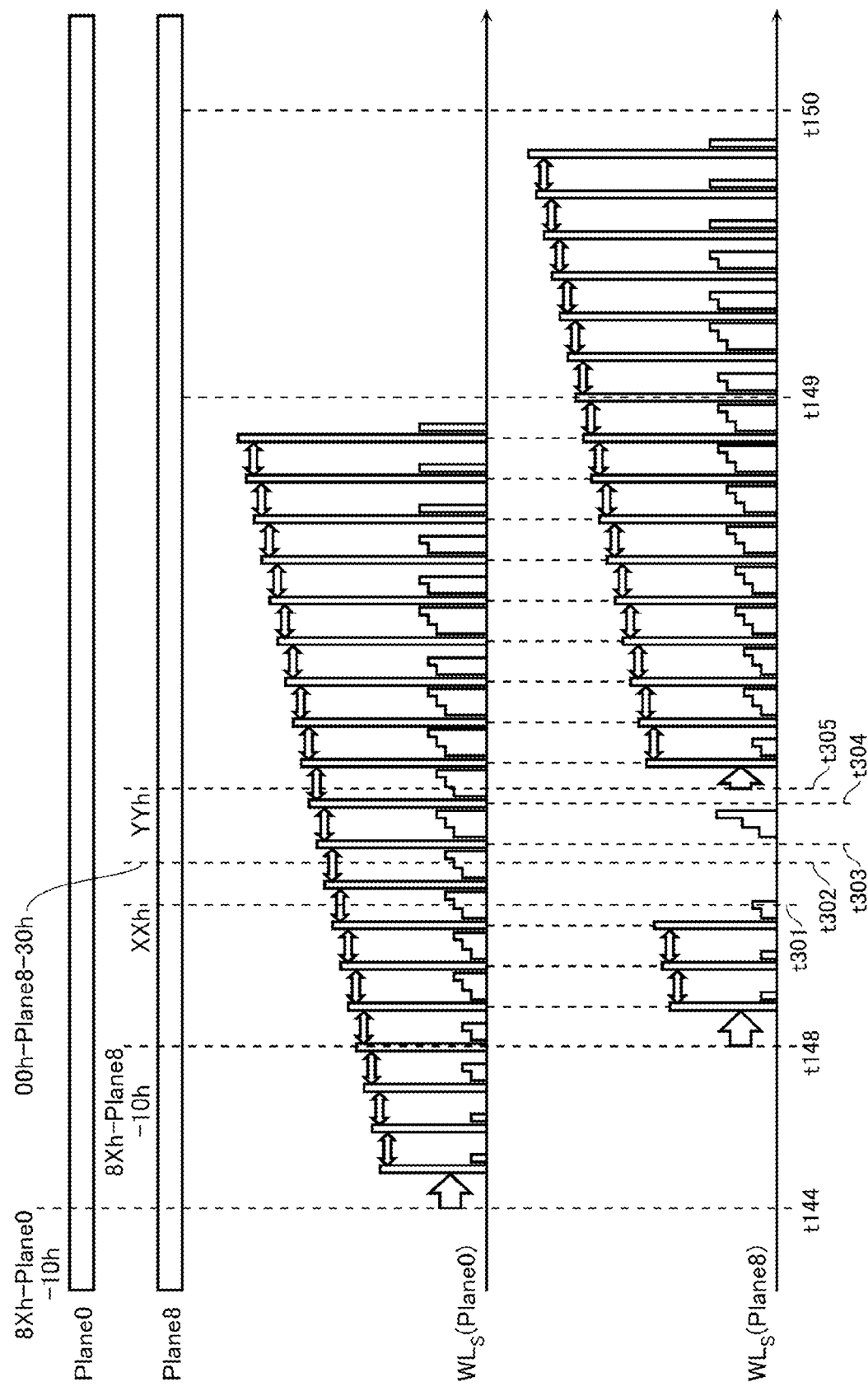
FIG. 24 is a waveform diagram for explaining a write sequence according to a fifth embodiment.

Next, the fifth embodiment will be described with reference to FIG. 24. FIG. 24 is a waveform diagram for explaining a write sequence according to the fifth embodiment. FIG. 24 illustrates the voltage supplied to the selected word line $WL_S$ in the memory plane MP0 and the voltage supplied to the selected word line $WL_S$ in the memory plane MP8.

The semiconductor storage device according to the fifth embodiment is configured in the same manner as the semiconductor storage device according to the first embodiment.

The write sequence according to the fifth embodiment is basically executed in the same manner as the write sequence described with reference to FIG. 23. However, in the example of FIG. 23, along with the input of data XXh, not only the write sequence for the memory plane MP8, which is the target of the read operation, but also the write sequence for the memory plane MP0 is suspended. On the other hand, in the example of FIG. 24, along with the input of data XXh, only the write sequence for the memory plane MP8, which is the target of the read operation, is suspended and the write sequence for the memory plane MP0 is not suspended.

In the example of FIG. 24, in the read operation for the memory plane MP8, the timing at which the read voltages $V_{CGAR}$, $V_{CGCR}$, and $V_{CGFR}$ are supplied to the selected word line $WL_S$ is the same as the timing (timing corresponding to the time t122, t125, and t128 in FIG. 17) at which the verification voltages $V_{VFYC}$, $V_{VFYD}$, and $V_{VFYE}$ are supplied to the selected word line $WL_S$ in the verification operation for the memory plane MP0, respectively.

The semiconductor storage device according to the fifth embodiment may be capable of executing the operations according to the first to fourth embodiments.

Further, when executing the write sequence according to the fifth embodiment, information that can determine which plane group to suspend the write sequence may be input to the memory die MD before the time t301.

[Effect of Semiconductor Storage Device According to Fifth Embodiment]

According to the semiconductor storage device according to the fifth embodiment, it is possible to obtain the same effect as the semiconductor storage devices according to the first to third embodiments. Further, in the fifth embodiment, the timing at which the read operation is executed for one plane group PG1 and the timing at which the program operation is executed for the other plane group PG0 are different. Further, in the fifth embodiment, when the read operation for one plane group PG1 is executed, the write sequence for the other plane group PG0 is not suspended. Therefore, it is possible to provide a semiconductor storage device that operates at high speed while reducing the influence of the write sequence on the read operation.

Sixth Embodiment

Figure 25:
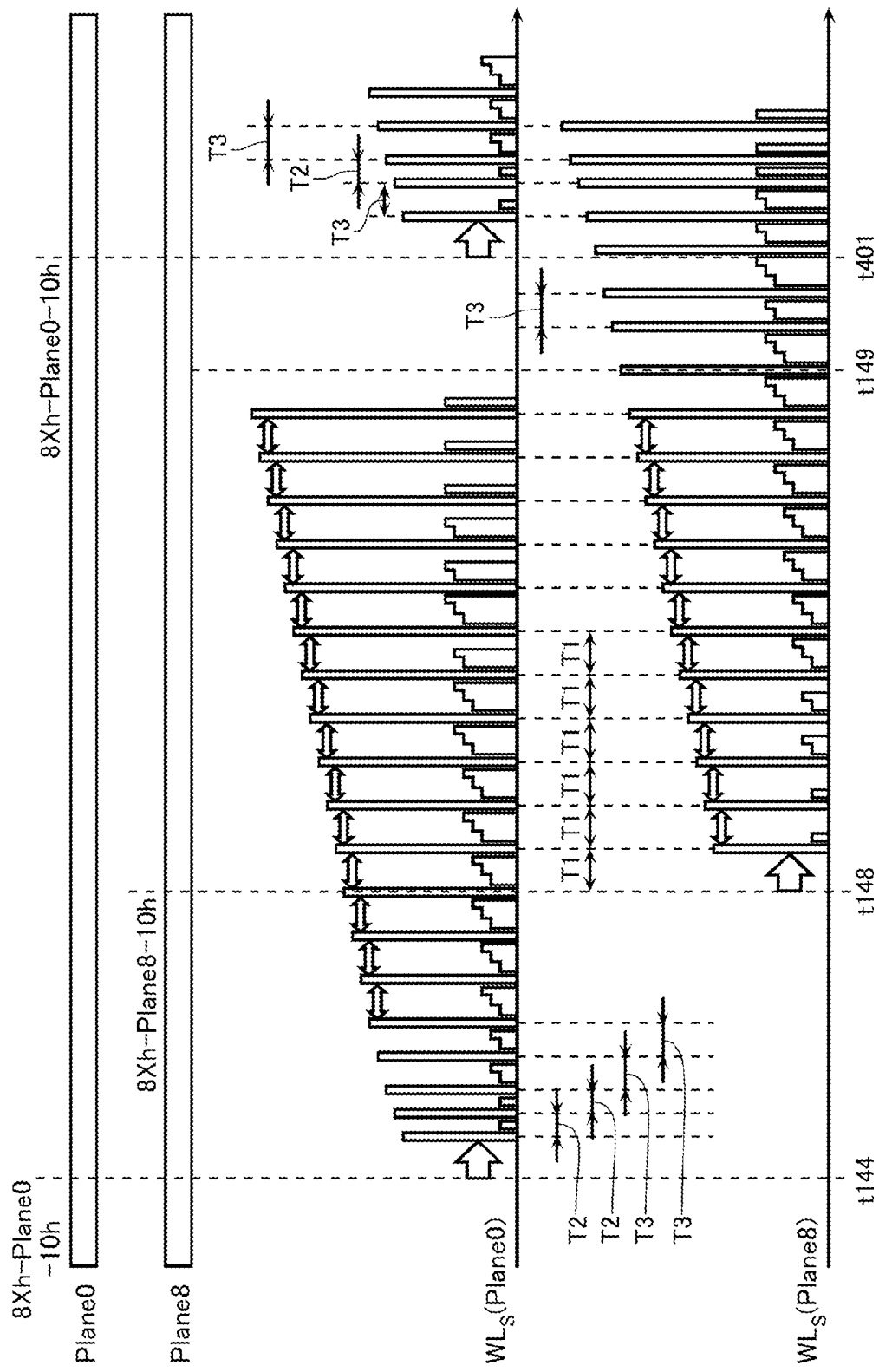
FIG. 25 is a waveform diagram for explaining a write sequence according to a sixth embodiment.

Next, the sixth embodiment will be described with reference to FIG. 25. FIG. 25 is a waveform diagram for explaining a write sequence according to the sixth embodiment. FIG. 25 illustrates the voltage supplied to the selected word line $WL_S$ in the memory plane MP0 and the voltage supplied to the selected word line $WL_S$ in the memory plane MP8.

The semiconductor storage device according to the sixth embodiment is configured in the same manner as the semiconductor storage device according to the first embodiment.

The write sequence according to the sixth embodiment is basically executed in the same manner as the write sequence as described with reference to FIG. 19.

However, in the example of FIG. 19, each process corresponding to the time t111 to the time t132 of FIG. 17 was always executed at a constant time interval T1. For example, when the number of loops $n_W$ is 1, 2 or 17 to 19, only one verification voltage is supplied to the selected word line $WL_S$. In such a case, for example, it is conceivable to omit the processes after the time t125 in FIG. 17. However, in the example of FIG. 19, the time interval T1 in which each process is executed is set to a constant size with the time corresponding to the processing after the time t125 as the waiting time.

On the other hand, in the present embodiment, as illustrated in FIG. 25, between the time t144 and the time t148 when the write sequence is being executed for only one of the memory plane MP0 and the memory plane MP8, and between the time t149 to the time t401, the waiting time as described above is omitted. That is, when the verification voltage supplied in the verification operation is one or two, the processing after the time t125 or the processing after the time t128 is omitted. The time interval T3 when the verification voltage supplied in the verification operation is two is shorter than the time interval T1. Further, the time interval T2 when the verification voltage supplied in the verification operation is one is shorter than the time interval T3.

Further, in the present embodiment, as illustrated in FIG. 25, even at the timing when the write sequence is being executed for both the memory plane MP0 and the memory plane MP8, if the number of verification voltages supplied in both verification operations is 2 or less, the processing after the time t128 is omitted. Further, if the number of verification voltages supplied in both verification operations is 1 or less, the processing after the time t125 is omitted. For example, in the example of FIG. 25, the number of loops $n_W$ of the write sequence for the memory plane MP0 is increased from 1 to 5 in the period after the time t401. Further, while the number of loops $n_W$ is 1, the number of verification voltages corresponding to the memory plane MP0 is 1, the number of the verification voltages corresponding to the memory plane MP8 is 2, and each of the above processes in the write sequence is executed at the time interval T3. Further, while the number of loops $n_W$ is 2, the number of verification voltages corresponding to the memory plane MP0 is one, the number of verification voltages corresponding to the memory plane MP8 is one, and each of the above processes in the write sequence is executed at the time interval T2. Further, while the number of loops $n_W$ is 3, the number of verification voltages corresponding to the memory plane MP0 is two, the number of verification voltages corresponding to the memory plane MP8 is one, and each of the above processes in the write sequence is executed at the time interval T3.

The semiconductor storage device according to the sixth embodiment may be capable of executing the operations according to the first to fifth embodiments.

[Effect of Semiconductor Storage Device According to Sixth Embodiment]

According to the semiconductor storage device according to the sixth embodiment, it is possible to obtain the same effect as the semiconductor storage devices according to the first to fifth embodiments. Further, in the sixth embodiment, it is possible to reduce the time required for the write sequence for one plane as compared with the first to fifth embodiments. Therefore, it is possible to provide a semiconductor storage device that operates at a higher speed as compared with the first to fifth embodiments.

Seventh Embodiment

Figure 26:
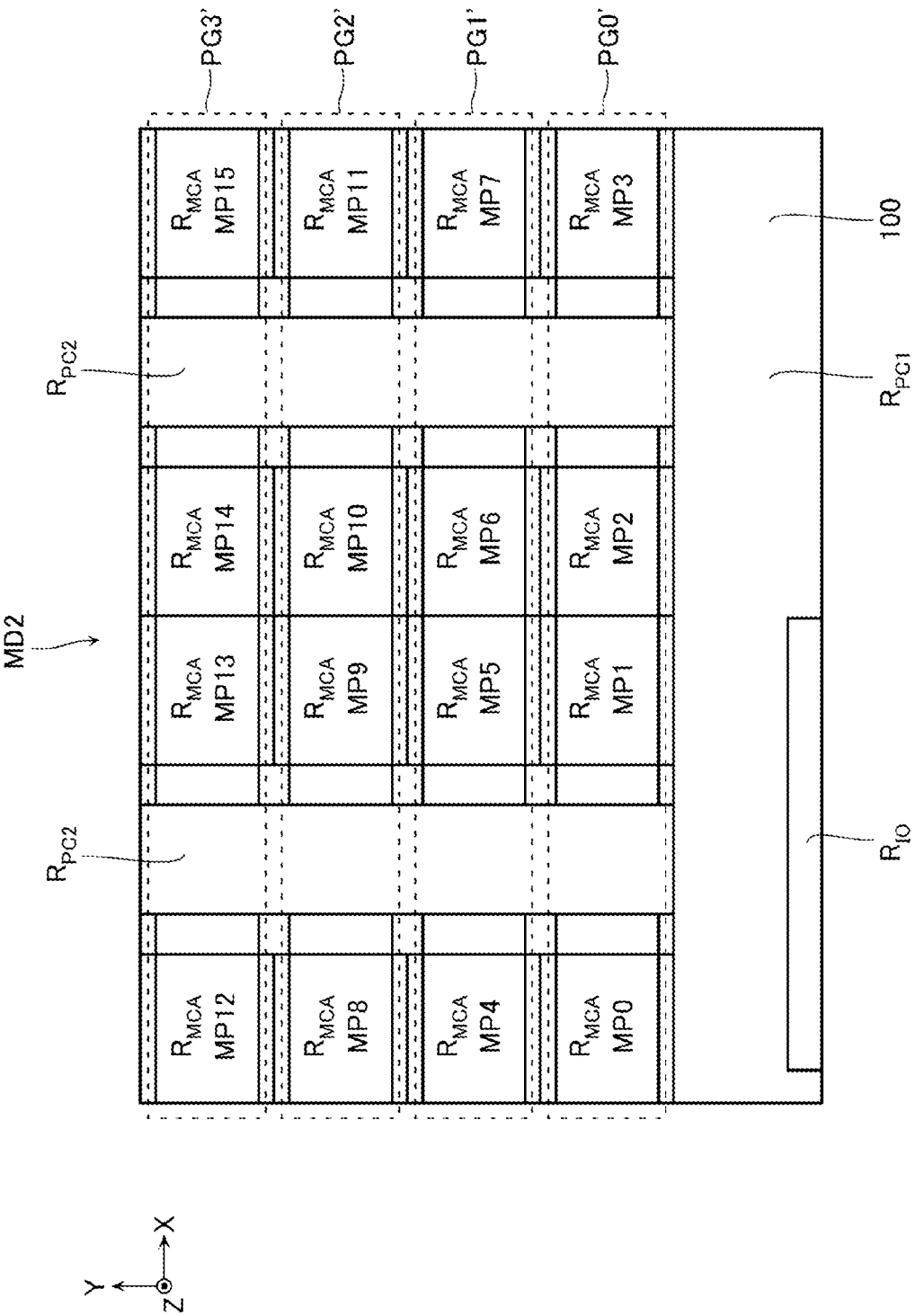
FIG. 26 schematically illustrates a plan view of a memory die of a semiconductor storage device according to a seventh embodiment.

Next, the seventh embodiment will be described with reference to FIG. 26. FIG. 26 schematically illustrates a plan view of a memory die MD2 of a semiconductor storage device according to the seventh embodiment.

In the description so far, the memory module MM includes the plane groups PG0 and PG1 as described with reference to FIG. 4 and the like. Further, the plane group PG0 includes the memory planes MP0 to MP7 and the plane group PG1 includes the memory planes MP8 to MP15. However, such a configuration is merely an example and the specific configuration may be modified as appropriate. This point will be described below.

As shown in FIG. 26, the memory die MD2 is basically configured in the same manner as the memory die MD described with reference to FIG. 8 and the like. However, while the memory die MD includes two plane groups PG0 and PG1, the memory die MD2 includes four plane groups PG0' to PG3'. The plane group PG0' includes the memory planes MP0 to MP3. The plane group PG1' includes the memory planes MP4 to MP7. The plane group PG2' includes the memory planes MP8 to MP11. The plane group PG3' includes the memory planes MP12 to MP15.

The memory die MD2 may be provided with two write sequencers as with the memory die MD or may be provided with three or four write sequencers. Further, the wiring CG corresponding to the plane group PG0' and the wiring CG corresponding to the plane group PG1' may be the same or different. Similarly, the wiring CG corresponding to the plane group PG2' and the wiring CG corresponding to the plane group PG3' may be the same or different.

Further, the semiconductor storage device according to the seventh embodiment may be capable of executing the operations according to the first to sixth embodiments.

[Effect of Semiconductor Storage Device According to Seventh Embodiment]

According to the semiconductor storage device according to the seventh embodiment, it is possible to obtain the same effect as the semiconductor storage devices according to the first to sixth embodiments. Further, in the seventh embodiment, a larger number of plane groups to be accessed can be selected as compared with the first to sixth embodiments. Therefore, the semiconductor storage device according to the seventh embodiment may operate at a higher speed than the semiconductor storage devices according to the first to sixth embodiments.

Eighth Embodiment

Figure 27:
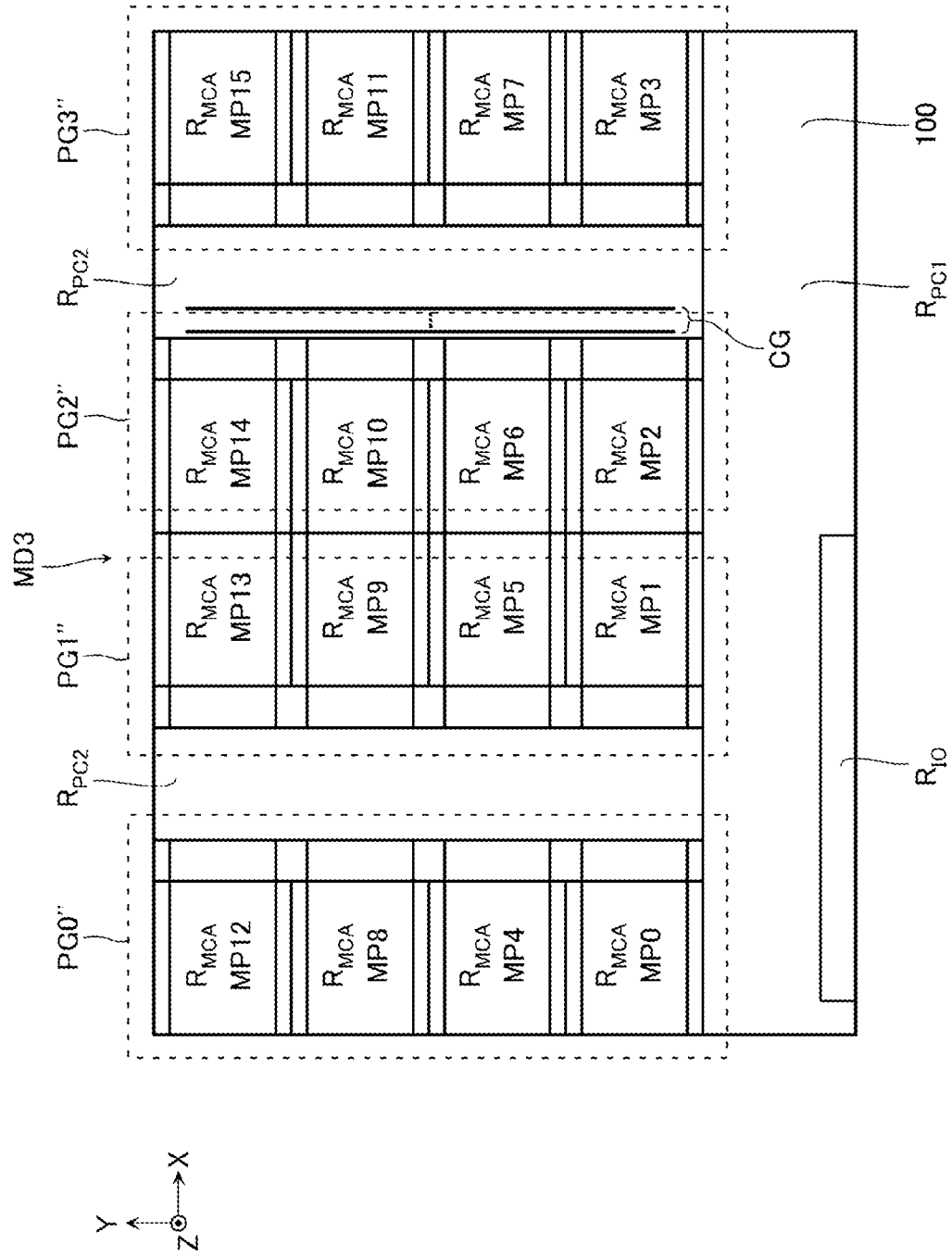
FIG. 27 schematically illustrates a plan view of a memory die of a semiconductor storage device according to an eighth embodiment.

Next, the eighth embodiment will be described with reference to FIG. 27. FIG. 27 schematically illustrates a plan view of a memory die MD3 of a semiconductor storage device according to the eighth embodiment.

In the description so far, as described with reference to FIGS. 8 and 26, a plurality of memory planes arranged in the X direction belong to the same plane group. However, such a configuration is merely an example and the specific configuration may be modified as appropriate. This point will be described below.

As shown in FIG. 27, the memory die MD3 is basically configured in the same manner as the memory die MD described with reference to FIGS. 8 and 26. However, in the memory dies MD and MD2, the four memory planes MP0 to MP3 arranged in the X direction belong to the same plane groups PG0 and PG0', whereas in the memory die MD3, four memory planes arranged in the Y direction belong to the same plane group.

That is, the memory die MD3 includes four plane groups PG0" to PG3". The plane group PG0" includes the memory planes MP0, MP4, MP8, and MP12. The plane group PG1" includes the memory planes MP1, MP5, MP9, and MP13. The plane group PG2" includes the memory planes MP2, MP6, MP10, and MP14. The plane group PG3" includes the memory planes MP3, MP7, MP11, and MP15.

Further, as described with reference to FIG. 8 and the like, for example, two sets of wirings CG are provided corresponding to the four memory planes MP arranged in the Y direction in the peripheral circuit region $R_{PC2}$ of the memory die MD. For example, in the example of FIG. 8, a set consisting of a plurality of wirings CG0C and a set consisting of a plurality of wirings CG1C are provided corresponding to the memory planes MP2, MP6, MP10, and MP14. On the other hand, as shown in FIG. 27, one set of wirings CG are provided corresponding to the four memory planes MP arranged in the Y direction in the peripheral circuit region $R_{PC2}$ of the memory die MD3. For example, in the example of FIG. 27, a set consisting of a plurality of wirings CG is provided corresponding to the memory planes MP2, MP6, MP10, and MP14.

The semiconductor storage device according to the eighth embodiment may be capable of executing the operations according to the first to sixth embodiments.

[Effect of Semiconductor Storage Device According to Eighth Embodiment]

According to the semiconductor storage device according to the eighth embodiment, it is possible to obtain the same effect as the semiconductor storage devices according to the first to sixth embodiments.

Further, the memory dies MD and MD2 according to the first to seventh embodiments are provided with a plurality of plane groups arranged in the Y direction. In addition, each plane group includes a plurality of memory planes arranged in the X direction. In such a configuration, in order to supply different voltages to WL and the like in memory planes belonging to different plane groups, it is necessary to provide the same number of wiring CG sets as the number of plane groups arranged in the Y direction. As a result, the total number of wirings CG may increase, leading to an increase in the circuit area. In addition, crosstalk may occur between two different sets of wirings CG provided in close proximity to each other.

On the other hand, the memory die MD3 according to the eighth embodiment includes a plurality of plane groups arranged in the X direction. Each plane group includes a plurality of memory planes arranged in the Y direction. In particular, in the example of FIG. 27, a plurality of memory planes belonging to the same plane group are all arranged in the Y direction. Therefore, one set of wirings CG may be provided corresponding to each plane group. Therefore, the semiconductor storage device according to the eighth embodiment can have a smaller circuit area than the semiconductor storage devices according to the first to seventh embodiments. In addition, the influence of crosstalk between wirings CG can be significantly reduced.

Ninth Embodiment

Figure 28:
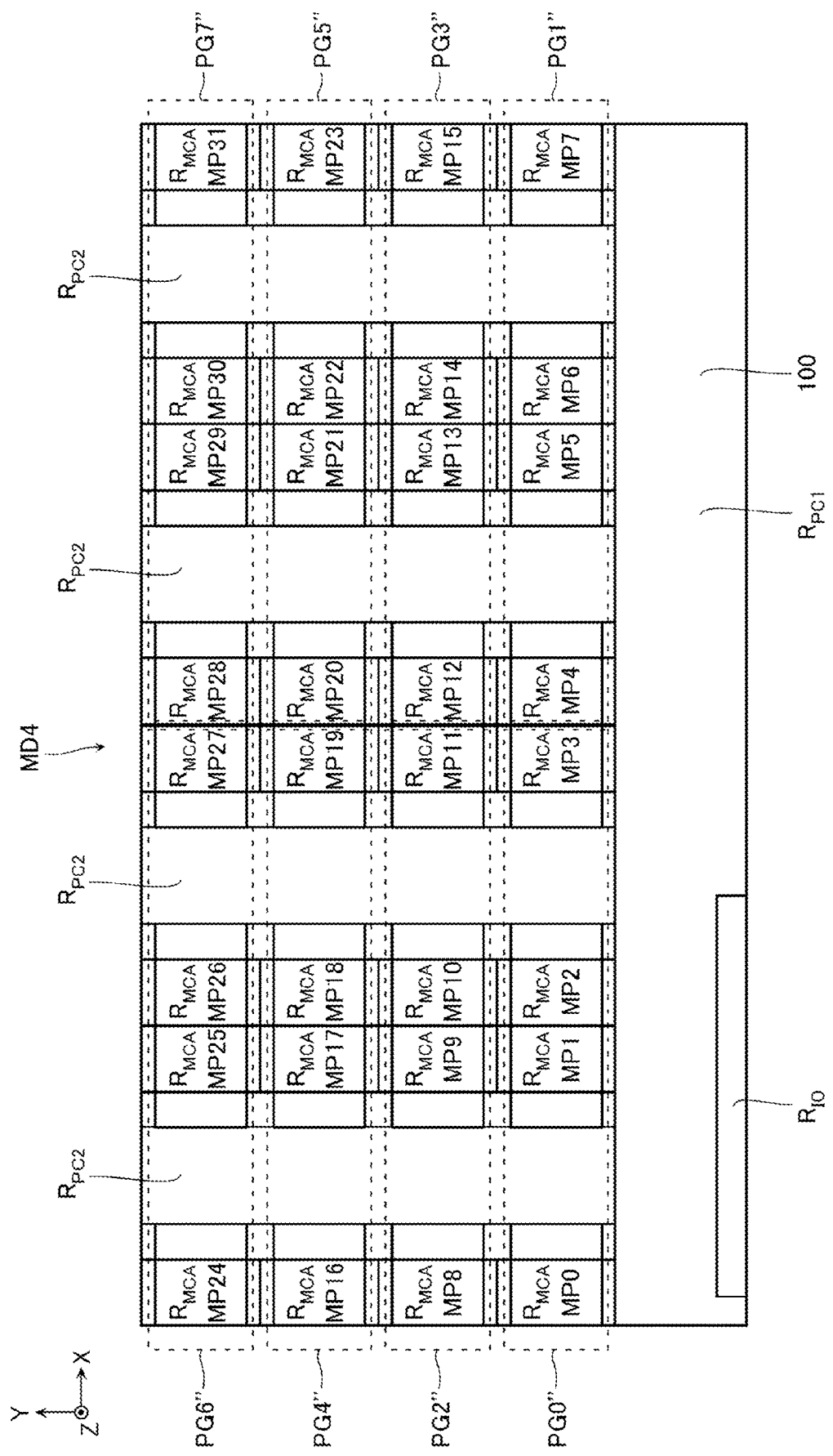
FIG. 28 schematically illustrates a plan view of a memory die of a semiconductor storage device according to a ninth embodiment.

Next, the ninth embodiment will be described with reference to FIG. 28. FIG. 28 schematically illustrates a plan view of a memory die MD4 of a semiconductor storage device according to the ninth embodiment.

In embodiments so far, as described with reference to FIG. 4, the memory die MD includes sixteen memory planes (memory planes MP0 to MP15). However, such a configuration is merely an example and the specific configuration may be modified as appropriate.

As shown in FIG. 28, the memory die MD4 is basically configured in the same manner as the memory die MD described with reference to FIG. 8. However, while a memory die MD includes two plane groups PG0 and PG1, the memory die MD4 includes eight plane groups PG0" to PG7". The plane group PG0" includes the memory planes MP0 to MP3. The plane group PG1" includes the memory planes MP4 to MP7. The plane group PG2" includes the memory planes MP8 to MP11. The plane group PG3" includes the memory planes MP12 to MP15. The plane group PG4" includes the memory planes MP16 to MP19. The plane group PG5" includes the memory planes MP20 to MP23. The plane group PG6" includes the memory planes MP24 to MP27. The plane group PG7" includes the memory planes MP28 to MP31.

The memory die MD4 may be provided with two write sequencers, like the memory die MD, or may be provided with from three to eight write sequencers. Further, the wiring CG corresponding to the plane group PG0" and the wiring CG corresponding to the plane group PG2" may be the same or different. Further, the wiring CG corresponding to the plane group PG1" and the wiring CG corresponding to the plane group PG3" may be the same or different. Further, the wiring CG corresponding to the plane group PG4" and the wiring CG corresponding to the plane group PG6" may be the same or different. Further, the wiring CG corresponding to the plane group PG5" and the wiring CG corresponding to the plane group PG7" may be the same or different.

The semiconductor storage device according to the ninth embodiment may still be capable of executing the operations according to the first to sixth embodiments.

[Effect of Semiconductor Storage Device According to Ninth Embodiment]

According to the semiconductor storage device according to the ninth embodiment, it is possible to obtain the same effect as the semiconductor storage devices according to the first to sixth embodiments.

Other Embodiments

The semiconductor storage devices according to the first to ninth embodiments have been described. However, such specific configurations are merely examples and the specific configuration, operating method, and the like may be modified as appropriate in other examples.

For example, in the semiconductor storage devices according to the first to ninth embodiments, the word line WL is extended in the Y direction and the bit line BL is extended in the X direction, as described with reference to FIG. 10. However, in other examples, the word line WL may be extended in the X direction and the bit line BL may be extended in the Y direction.

In the semiconductor storage devices according to the first to ninth embodiments, a plurality of memory planes are grouped into a plurality of memory groups, and accessibility is set on a group basis. However, the semiconductor storage device may be configured so that accessibility is set on a plane basis.

In the semiconductor storage devices according to the first to ninth embodiments, the lower end of the semiconductor layer 120 is connected to the semiconductor substrate 100. Furthermore, all the transistors in the peripheral circuit PC are formed on the upper surface of the semiconductor substrate 100. However, such a configuration is merely an example. The operation methods such as a write sequence as described above may also be applied to a semiconductor storage device having another structure. Hereinafter, the structures of some other semiconductor storage devices will be illustrated.

Figure 29:
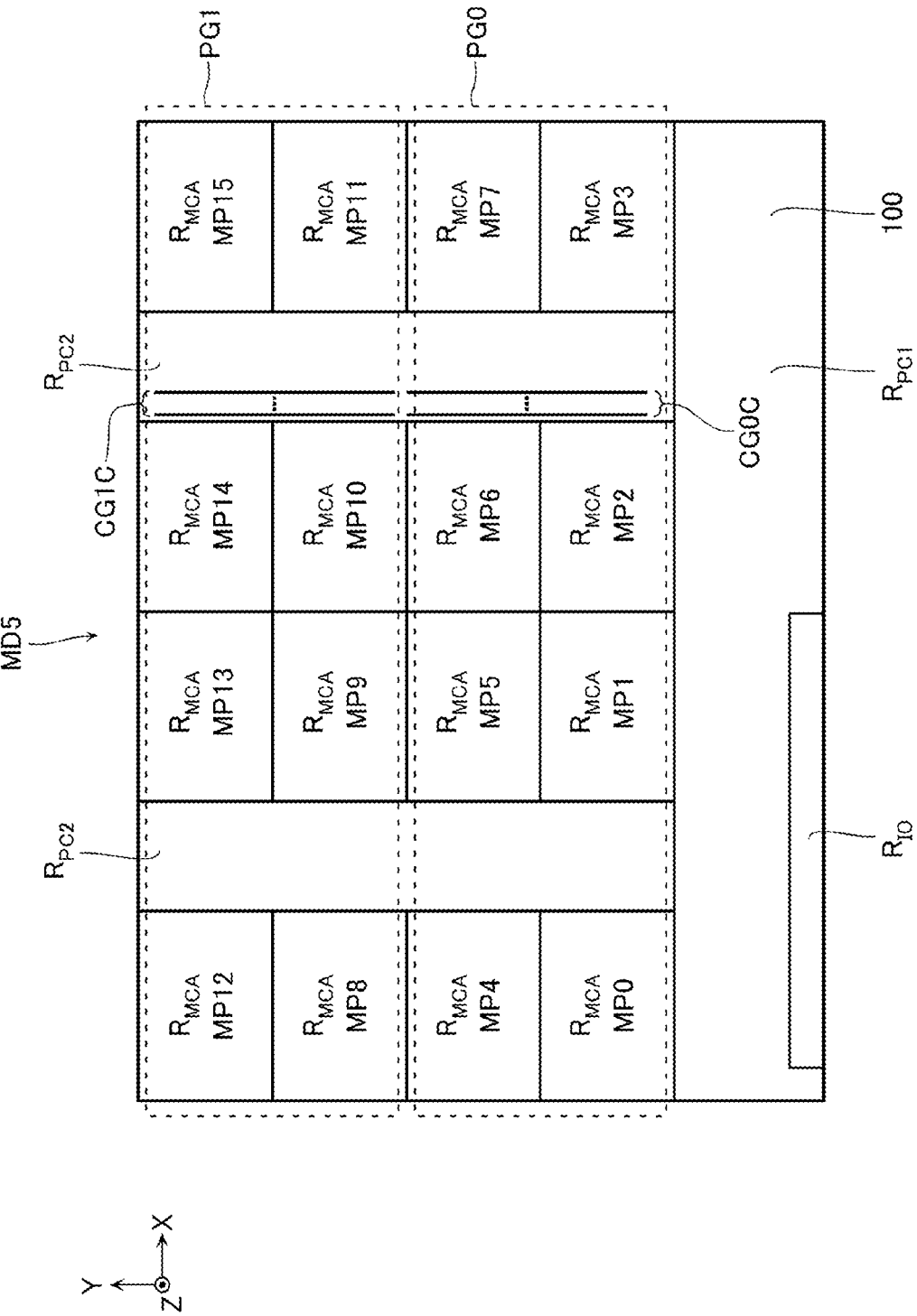
FIG. 29 schematically illustrates a plan view of a semiconductor storage device according to another embodiment.
Figure 30:
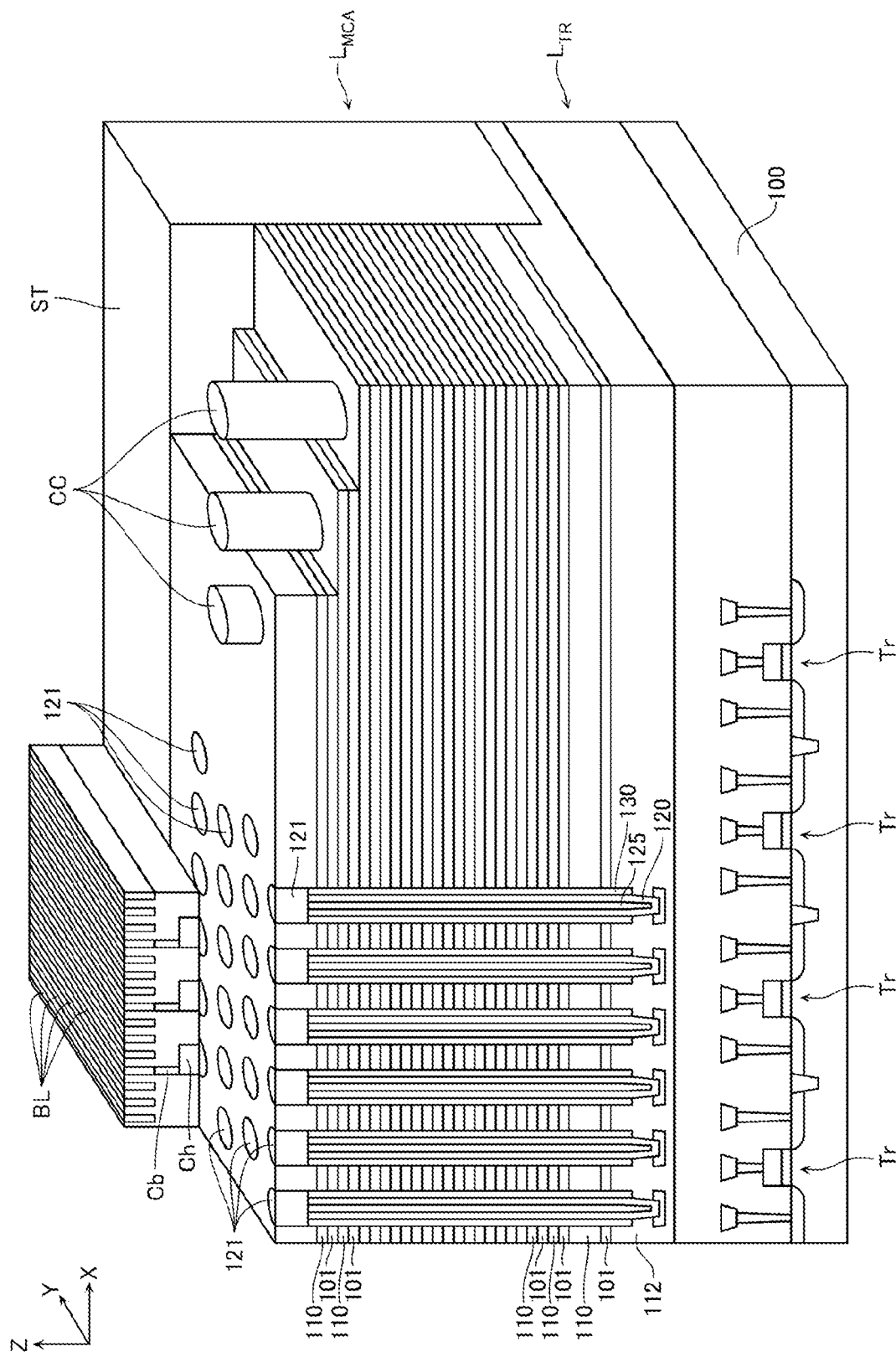
FIG. 30 schematically illustrates a perspective view of a semiconductor storage device according to still another embodiment.

For example, a memory die MD5 illustrated in FIGS. 29 and 30 includes the semiconductor substrate 100, a transistor layer LTR provided above the semiconductor substrate 100, and a memory cell array layer LMCA provided above the transistor layer LTR, as shown in FIG. 30.

The transistor layer LTR includes a plurality of transistors Tr. The plurality of transistors Tr are field-effect type transistors having the upper surface of the semiconductor substrate 100 as a channel region. In the illustrated configuration, the peripheral circuit PC includes the plurality of transistors Tr.

The memory cell array layer LMCA is basically configured in the same manner as the configuration on the semiconductor substrate 100 described with reference to FIG. 10 and the like. However, the memory cell array layer LMCA includes a conductive layer 112 provided below the plurality of conductive layers 110. The lower end of the semiconductor layer 120 is connected to the conductive layer 112 instead of the semiconductor substrate 100.

In the example of FIG. 29, wirings CG0C and CG1C are provided in the peripheral circuit region $R_{PC2}$ of the memory die MD5. The wiring CG0C is provided in the area corresponding to the plane group PG0. The wiring CG1C is provided in the region corresponding to the plane group PG1.

With such a configuration, the circuit area can be reduced as compared with the semiconductor storage devices according to the first to seventh embodiments, similarly to the memory die MD3 described with reference to FIG. 27. In addition, the influence of crosstalk between wirings CG can be significantly reduced.

Figure 31:
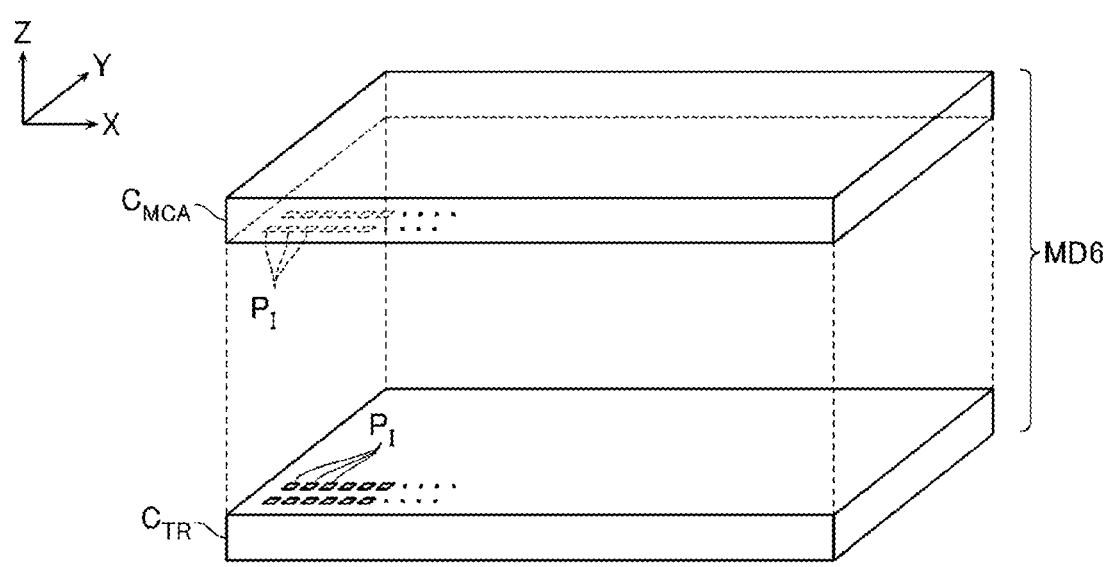
FIG. 31 schematically illustrates a perspective view of a semiconductor storage device according to still another embodiment.

Furthermore, a memory die MD6 illustrated in FIG. 31 includes a chip $C_{MCA}$ and a chip $C_{TR}$. The chip $C_{MCA}$ and chip $C_{TR}$ include a plurality of bonding electrodes $P_I$ comprising copper (Cu) or the like and are electrically and physically connected via the plurality of bonding electrodes $P_I$.

Figure 32:
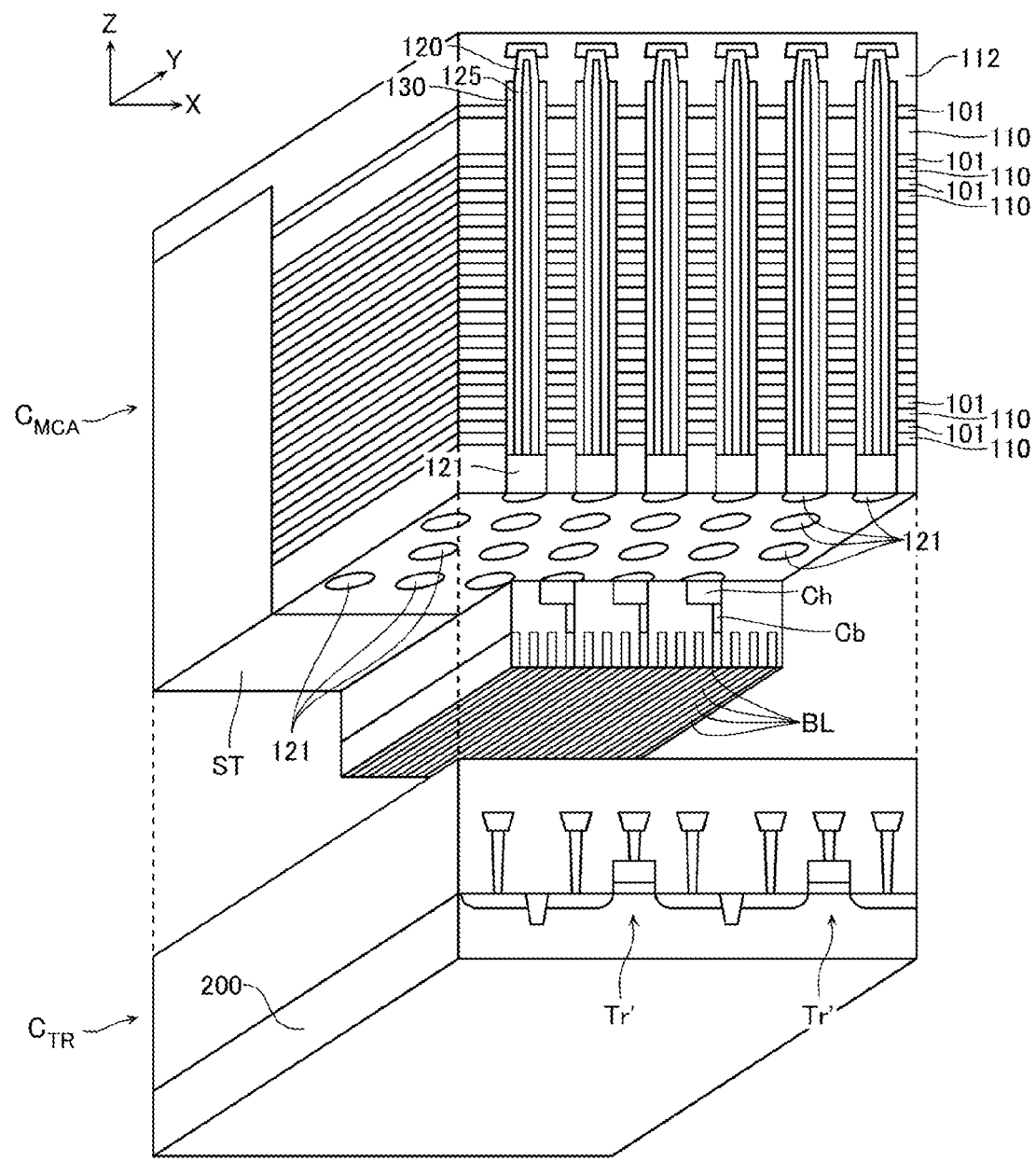
FIG. 32 schematically illustrates a perspective view of a semiconductor storage device according to still another embodiment.
Figure 33:
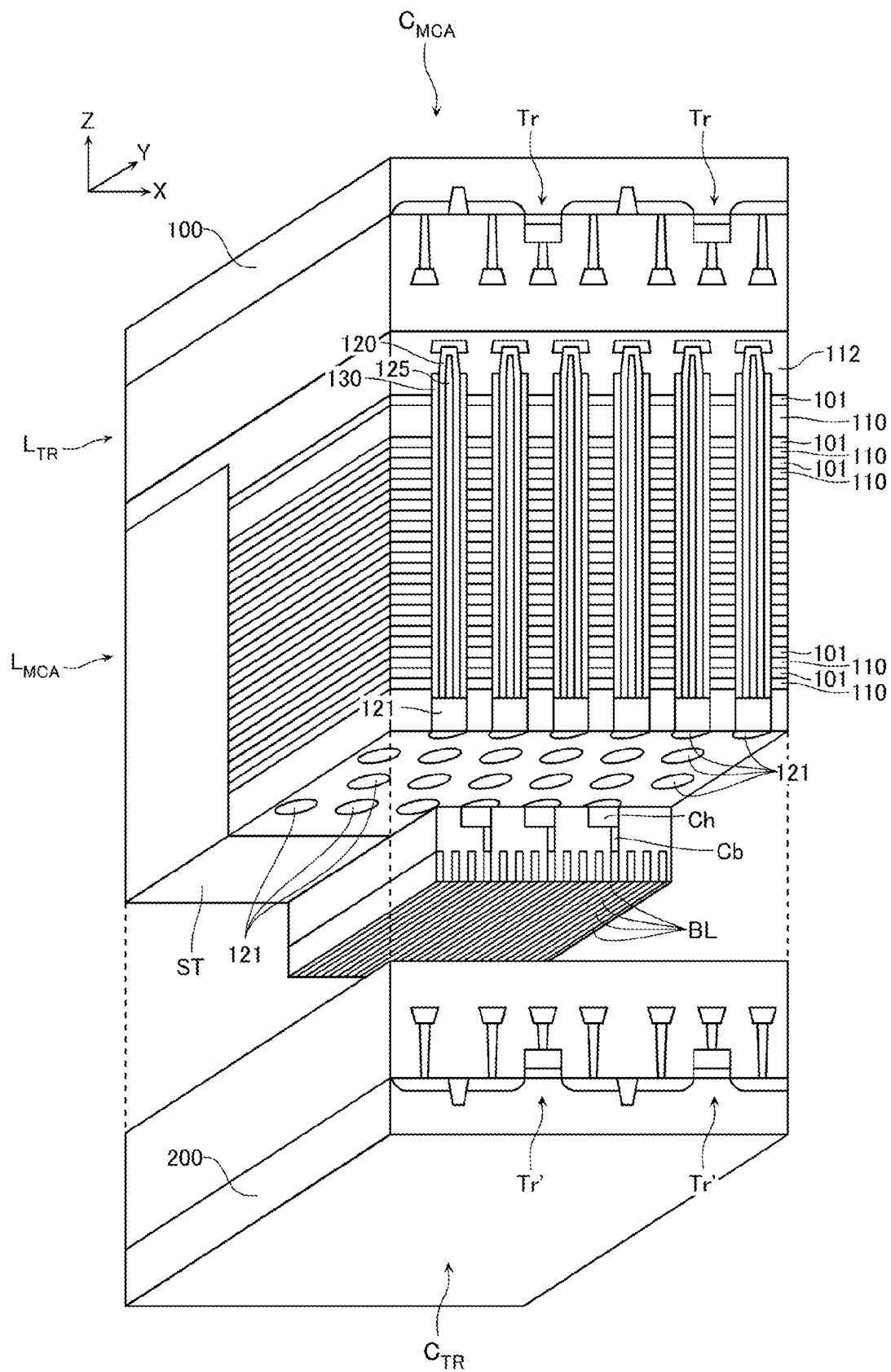
FIG. 33 schematically illustrates a perspective view of a semiconductor storage device according to still another embodiment.

As shown in FIG. 32, the chip $C_{MCA}$ may include the configuration on the semiconductor substrate 100 described with reference to FIG. 10 or may include the configuration in the memory cell array layer LMCA of FIG. 30. Furthermore, in some examples, the chip $C_{MCA}$ may or may not include the transistor Tr. When the chip $C_{MCA}$ does not include a transistor Tr, the chip $C_{MCA}$ may or may not include the semiconductor substrate 100. When the chip $C_{MCA}$ includes a transistor Tr, as shown in FIG. 33, the chip $C_{MCA}$ may include the transistor layer LTR and the memory cell array layer LMCA as described with reference to FIG. 30.

The chip CTR includes a semiconductor substrate 200 and a plurality of transistors Tr'. The semiconductor substrate 200 may be configured in substantially the same manner as the semiconductor substrate 100, for example. The plurality of transistors Tr' are field-effect type transistors having the upper surface of the semiconductor substrate 200 as a channel region. In the examples of FIGS. 32 and 33, the peripheral circuit PC includes the plurality of transistors Tr and Tr' in the chip $C_{MCA}$ and the chip $C_{TR}$.

Even in such a configuration, the wiring pattern of the wiring CG as described with reference to FIG. 29 can be relatively easily adopted. In such a case, similarly to the memory die MD3 described with reference to FIG. 27, the circuit area can be reduced as compared with the semiconductor storage devices according to the first to seventh embodiments. In addition, the influence of crosstalk between wirings CG as described above can be significantly reduced.

In the above description, as described with reference to FIG. 19, a semiconductor storage device capable of executing two or more write sequences in parallel is illustrated. Furthermore, the timing for supplying the program voltage $V_{PGM}$ to the selected word line $WL_S$ in one write sequence and the timing for supplying the program voltage $V_{PGM}$ to the selected word line $WL_S$ in another write sequence coincide with each other. However, such a method is merely an example and the specific method may be modified as appropriate. For example, as described above, in the memory die MD3 described with reference to FIG. 27 and the memory die MD5 described with reference to FIG. 29, the influence of crosstalk between the wirings CG can be significantly reduced. Therefore, in such a configuration, the timing for supplying the program voltage $V_{PGM}$ to the selected word line $WL_S$ in one write sequence and the timing for supplying the program voltage $V_{PGM}$ to the selected word line $WL_S$ in the other write sequence need not absolutely coincide with each other.

Figure 34:
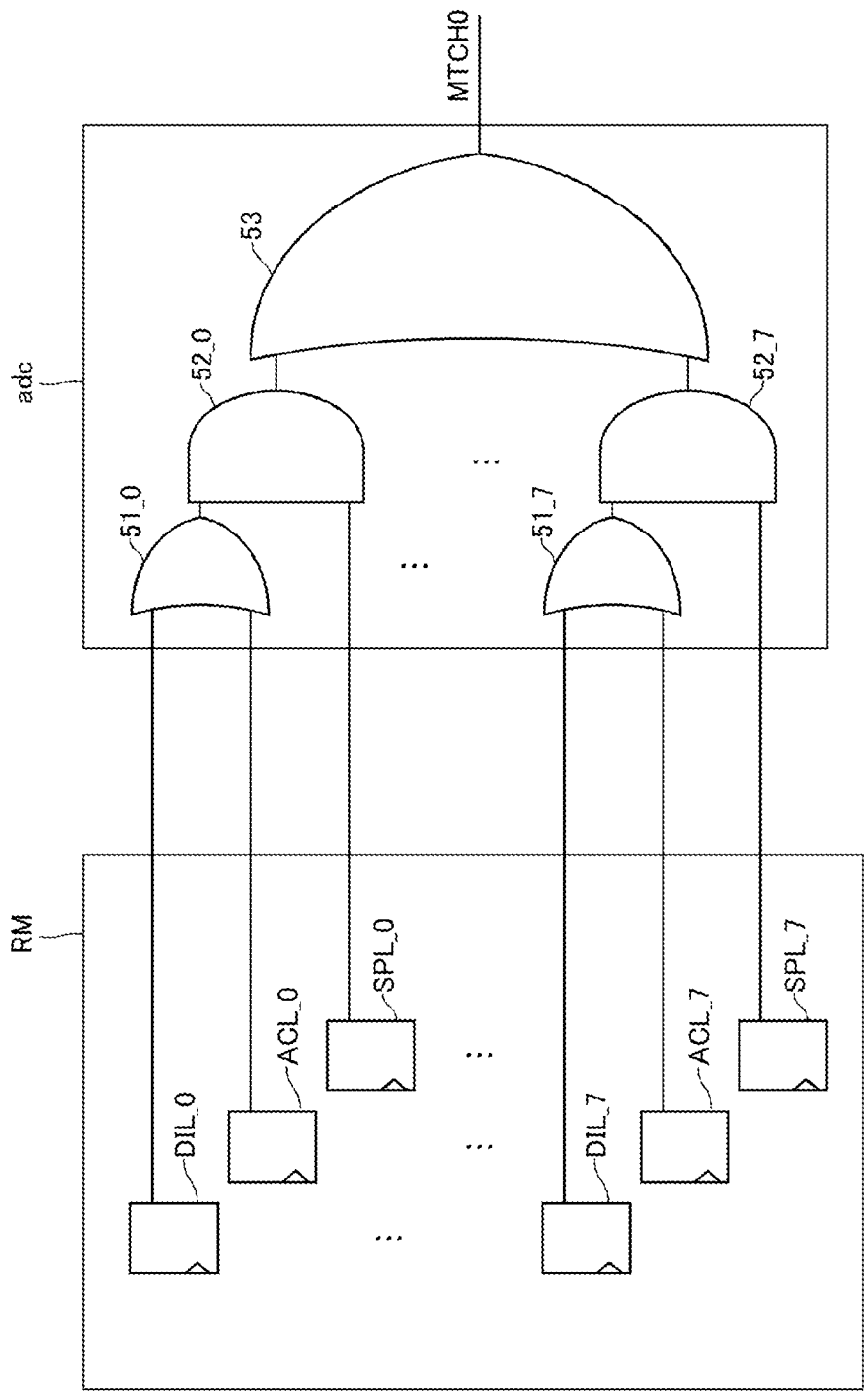
FIG. 34 is a circuit diagram of a semiconductor storage device according to still another embodiment.

The address comparison circuit ADC (FIG. 4) of a semiconductor storage device capable of executing the write sequence according to the fifth embodiment corresponds to, for example, a plurality of plane groups and may be provided with a plurality of address comparison units adc as illustrated in FIG. 34.

The address comparison unit adc is connected to, for example, a plurality of latch circuits in the register module RM. In FIG. 34, as such a latch circuit, latch circuits DIL_0 to DIL_7, latch circuits ACL_0 to ACL_7, and latch circuits SPL_0 to SPL_7 are illustrated. The latch circuits DIL_0 to DIL_7 latch "H" when a command set to execute a write sequence is input to the memory planes MP0 to MP7, respectively, and latch "L" in other cases. The latch circuits ACL_0 to ACL_7 latch "H" during the execution of the write sequence for the memory planes MP0 to MP7, respectively, and latch "L" in other cases. The latch circuits SPL_0 to SPL_7 latch "H" when the information to execute a read operation is input to the memory planes MP0 to MP7, respectively, and latch "L" in other cases.

The address comparison unit adc includes, for example, a plurality of OR circuits 51_0 to 51_7, a plurality of AND circuits 52_0 to 52_7, and an OR circuit 53. Each of the plurality of OR circuits 51_0 to 51_7 includes two input terminals. The input terminals on one side are connected to the latch circuits DIL_0 to DIL_7, respectively. The input terminals on the other side are connected to the latch circuits ACL_0 to ACL_7, respectively. Each of the plurality of AND circuits 52_0 to 52_7 includes two input terminals. The input terminals on one side are connected to the output terminals of the OR circuits 51_0 to 51_7, respectively. The input terminals on the other side are connected to the latch circuits SPL_0 to SPL_7, respectively. The OR circuit 53 includes eight input terminals. These eight input terminals are connected to the output terminals of the AND circuits 52_0 to 52_7, respectively.

FIG. 34 shows the address comparison unit adc corresponding to the plane group PG0. The address comparison unit corresponding to the plane group PG1 has almost the same configuration as the address comparison unit adc illustrated in FIG. 34. However, the address comparison unit corresponding to the plane group PG1 includes a plurality of latch circuits corresponding to the plane group PG1 instead of the plurality of latch circuits corresponding to the plane group PG0.

In some examples, when the write sequence according to the fifth embodiment is executed, "H" may be latched to either the latch circuits DIL_0 to DIL_7 or the corresponding latch circuit in response to the input of the command set to execute the write sequence. Furthermore, "L" may be latched to either the latch circuits ACL_0 to ACL_7 or the corresponding latch circuit with the start of the execution of the write sequence. "H" may be latched to either the latch circuits SPL_0 to SPL_7 or the corresponding latch circuit prior to the suspension of the write sequence. When the write sequence is suspended, if the output signal MTCH0 of the address comparison unit adc corresponding to the plane group PG0 is "H", the write sequence for the plane group PG0 may be suspended and if it is "L", the write sequence for the plane group PG0 may not be suspended. Similarly, if the output signal of the address comparison unit corresponding to the plane group PG1 is "H", the write sequence for the plane group PG1 may be suspended, and if it is "L", the write sequence for the plane group PG1 may not be suspended.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An operation method of a semiconductor storage device that comprises a first memory die having a first memory plane including a plurality of first memory blocks and a second memory plane including a plurality of second memory blocks, the method comprises:
   starting a first write sequence for one of the first memory blocks in response to a first command set designating the one of the first memory blocks; and
   starting a second write sequence for one of the second memory blocks in response to a second command set designating the one of the second memory blocks, wherein at least part of the second write sequence is performed while the first write sequence is being performed.

2. The method according to claim 1, wherein no other write sequence is started until one of the first write sequence and the second write sequence ends.

3. The method according to claim 1, wherein the first write sequence is started if no read operation is being performed.

4. The method according to claim 1, further comprising:
   supplying one or more of a plurality of different program voltages to a first word line connected to the one of the first memory blocks during the first write sequence, wherein
   at least one of the different program voltages is supplied to the first word line while just the first write sequence is being performed, and
   at least one of the different program voltages is supplied to the first word line while the first and second write sequences are both being performed.

5. The method according to claim 4, further comprising:
   supplying a program voltage to a second word line connected to the one of the second memory blocks during the second write sequence in synchronization with one of the different program voltages supplied to the first word line.

6. The method according to claim 4, wherein said suppling one or more of the plurality of different program voltages to the first word line comprises:
   supplying two or more of the different program voltages to the first word line with a first time interval while the first write sequence, and not the second write sequence, is being performed; and
   supplying two or more of the different program voltages to the first word line with a second time interval while the first and second write sequences are being performed,
   wherein the first time interval is shorter than the second time interval.

7. The method according to claim 4, further comprises:
   supplying a plurality of different program voltages to a second word line connected to the one of the second memory blocks during the second write sequence, wherein
   said supplying one or more of the plurality of different program voltages to the first word line comprises supplying two or more of the different program voltages to the first word line with a second time interval while the first and second write sequences are being performed, said supplying the plurality of different program voltages to the second word line comprises supplying two or more of the different program voltages to the second word line with a third time interval while the first and second write sequences are being performed, and the second time interval is same as the third time interval.

8. The method according to claim 4, further comprises:

supplying a plurality of different program voltages to a second word line connected to the one of the second memory blocks during the second write sequence, wherein said supplying the plurality of different program voltages to the second word line comprises supplying two or more of the different program voltages to the second word line with a third time interval while the first and second write sequences are being performed, said supplying the plurality of different program voltages to the second word line comprises supplying two or more of the different program voltages to the second word line with a fourth time interval after the first write sequence is completed, and the fourth time interval is shorter than the third time interval.

9. The method according to claim 1, wherein the first memory die further includes a third memory plane including a plurality of third memory blocks, and the method further comprises starting the first write sequence concurrently with a third write sequence with respect to one of the third memory blocks.

10. The method according to claim 1, further comprises:

suspending the first write sequence in response to a suspension command set designating the second plane.

11. The method according to claim 1, further comprises:

continuing the first write sequence without suspension in response to a suspension command set designating the second plane.

12. The method according to claim 11, further comprising:

supplying two of a plurality of different program voltages to a first word line connected to the one of the first memory blocks during the first write sequence;

supplying a verify voltage to a first word line, between the two of a plurality of different program voltages; and supplying a read voltage to a second word line connected to the one of the second memory blocks, in response to a read command set designating the second plane after input of the suspension command set, in synchronization with the verify voltage supplied to the first word line.

13. The method according to claim 1, wherein the first memory die has:

the first memory plane in a first region, the second memory plane in a second region, and a first row decoder of the first memory plane and a second row decoder of the second memory plane in a third region between the first region and the second region.

14. The method according to claim 1, wherein the first memory die includes:

a first group of memory planes including the first memory plane in a first region, a second group of memory planes including the second memory plane in a second region, and a plurality of lines for supplying program voltages in a third region between the first region and the second region.

15. The method according to claim 1, wherein the first memory die includes a substrate, a memory cell array layer, and a transistor layer that is between the substrate and the memory cell array layer, and the first and second memory planes are in the memory cell array layer.

16. The method according to claim 1, wherein the first memory die includes a first chip and a second chip bonded to the first chip, and the first and second memory planes are in the first chip.

17. An operation method of a semiconductor storage device that comprises a controller die configured to generate a first command set and a second command set and a stack of memory dies, each of which includes a first memory plane including a plurality of first memory blocks and a second memory plane including a plurality of second memory blocks, the method comprises:

starting a first write sequence for one of the first memory blocks in response to the first command set designating the one of the first memory blocks; and starting a second write sequence for one of the second memory blocks in response to the second command, set designating the one of the second memory blocks;

wherein, in each of the memory dies, at least part of the second write sequence is performed while the first write sequence is being performed.

18. The method according to claim 17, wherein the controller die is on the stack of memory dies, and is electrically connected to each of the memory dies via a plurality of bonding wires.

19. The method according to claim 17, wherein the controller die is configured to generate a third command set, and the method further comprises inputting the third command set after the first command set and before the write sequence corresponding to the first command set is completed, the write sequence corresponding to the third command set being not executed.

* * * * *